(12) United States Patent
Oya et al.

(10) Patent No.: US 9,343,594 B2
(45) Date of Patent: May 17, 2016

(54) CONDUCTIVE COMPOSITION, CONDUCTIVE MEMBER AND PRODUCTION METHOD THEREOF, TOUCH PANEL, AND SOLAR CELL

(71) Applicant: FUJIFILM Corporation, Tokyo (JP)

(72) Inventors: Toyohisa Oya, Kanagawa (JP); Shinichi Nakahira, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/226,400

(22) Filed: Mar. 26, 2014

(65) Prior Publication Data

US 2014/0202531 A1 Jul. 24, 2014

Related U.S. Application Data

(63) Continuation of application No. PCT/JP2012/074963, filed on Sep. 27, 2012.

(30) Foreign Application Priority Data

Sep. 28, 2011 (JP) ................. 2011-212874
Dec. 28, 2011 (JP) ................. 2011-289796

(51) Int. Cl.
*H01B 1/22* (2006.01)
*H01L 31/0224* (2006.01)
(Continued)

(52) U.S. Cl.
CPC .......... *H01L 31/022425* (2013.01); *B32B 7/02* (2013.01); *C09D 5/24* (2013.01);
(Continued)

(58) Field of Classification Search
CPC .............. H01B 1/00; H01B 1/22; H01B 5/14; H01B 13/00; H01B 31/04; H01B 31/022466; H01B 31/1884; H01B 31/022425; C09D 5/24; C09D 7/1216; C09D 7/1291; B32B 7/02; G06F 3/044; G06F 7/004
USPC ......................... 252/512, 514, 515; 430/270.1
See application file for complete search history.

(56) References Cited

U.S. PATENT DOCUMENTS

2010/0261827 A1* 10/2010 Peri et al. .................... 524/440
2011/0088770 A1 4/2011 Allemand et al.
(Continued)

FOREIGN PATENT DOCUMENTS

JP 2006-35771 A 2/2006
JP 2006-299391 A 11/2006
(Continued)

OTHER PUBLICATIONS

Translation of JP 2006-299391 (no date).*
(Continued)

*Primary Examiner* — Amanda C Walke
(74) *Attorney, Agent, or Firm* — Birch, Stewart, Kolasch & Birch, LLP

(57) ABSTRACT

A conductive composition includes at least: a) metal conductive fibers having an average minor axis length of from 1 nm to 150 nm; and b) a compound represented by the following Formula (1) or Formula (2) in an amount of from 0.1% by mass to 1000% by mass with respect to the metal conductive fibers:

$$P-(CR_1=Y)_n-Q \quad \text{Formula (1)}$$

wherein, in Formula (1), P and Q each independently represent a group represented by OH, $NR_2R_3$ or $CHR_4R_5$, in which $R_2$ and $R_3$ each independently represent a hydrogen atom or a group that can be substituted on a nitrogen atom, and $R_4$ and $R_5$ each independently represent a hydrogen atom or a substituent; Y represents $CR_6$ or a nitrogen atom; $R_1$ and $R_6$ each independently represent a hydrogen atom or a substituent; at least two of the groups represented by $R_1$, $R_2$, $R_3$, $R_4$, $R_5$ or $R_6$ may be bonded to each other to form a ring; n represents an integer from 0 to 5; when n is 0, neither P nor Q is a group represented by OH or $CHR_4R_5$; and when n represents a number of 2 or greater, the plurality of atomic groups each represented by ($CR_1=Y$) may be the same as or different from each other;

$$R_7-C(=O)-H \quad \text{Formula (2)}$$

wherein, in Formula (2), $R_7$ represents a hydrogen atom, an OH group, an alkyl group, an alkenyl group, an alkynyl group, an aryl group or a heterocyclic group.

14 Claims, 2 Drawing Sheets

(51) Int. Cl.
  *G03F 7/004*    (2006.01)
  *G06F 3/044*    (2006.01)
  *B32B 7/02*    (2006.01)
  *C09D 5/24*    (2006.01)
  *C09D 7/12*    (2006.01)
  *C08K 7/06*    (2006.01)
  *H01L 51/44*    (2006.01)

(52) U.S. Cl.
  CPC ............ *C09D 7/1266* (2013.01); *C09D 7/1291* (2013.01); *G03F 7/004* (2013.01); *G06F 3/044* (2013.01); *H01B 1/22* (2013.01); *H01L 31/022466* (2013.01); *C08K 7/06* (2013.01); *H01L 51/442* (2013.01); *Y10T 428/31663* (2015.04)

(56) References Cited

U.S. PATENT DOCUMENTS

| | | |
|---|---|---|
| 2011/0285019 A1 | 11/2011 | Alden et al. |
| 2012/0088189 A1 | 4/2012 | Miyagishima et al. |
| 2014/0004371 A1* | 1/2014 | Chung et al. .................. 428/549 |

FOREIGN PATENT DOCUMENTS

| | | |
|---|---|---|
| JP | 2009-505358 A | 2/2009 |
| JP | 2009-146678 A | 7/2009 |
| JP | 2010-44988 A | 2/2010 |
| JP | 2010-507199 A | 3/2010 |
| JP | 2010-84173 A | 4/2010 |
| JP | 2010-251186 A | 11/2010 |
| JP | 2011-18636 A | 1/2011 |
| JP | 2011-216468 A | 10/2011 |
| WO | WO 2012102556 A2 * | 8/2012 |

OTHER PUBLICATIONS

Translation of JP 2011-018636 (no date).*
Japanese Office Action, dated Mar. 10, 2015, for corresponding Japanese Application No. 2011-289796, with partial English translation.
Barrett, et al., "Projected-Capacitive Touch Technology", Information Display, 2010, pp. 16-21, vol. 26, No. 3.
International Search Report issued in PCT/JP2012/074963, dated Oct. 30, 2012.
Written Opinion of the International Searching Authority issued in PCT/JP2012/074963, dated Oct. 30, 2012.
Chinese Office Action, dated Aug. 5, 2015, for Chinese Patent Application No. 201280046713.0.
Taiwanese Office Action for corresponding Taiwanese Application No. 101135448 dated Jan. 26, 2016.

* cited by examiner

CONDUCTIVE COMPOSITION, CONDUCTIVE MEMBER AND PRODUCTION METHOD THEREOF, TOUCH PANEL, AND SOLAR CELL

CROSS-REFERENCE TO RELATED APPLICATIONS

This application is a continuation application of International Application No. PCT/JP2012/074963, filed Sep. 27, 2012, the disclosure of which is incorporated herein by reference in its entirety. Further, this application claims priority from Japanese Patent Application No. 2011-212874, filed Sep. 28, 2011, and Japanese Patent Application No. 2011-289796, filed Dec. 28, 2011, the disclosures of which are incorporated herein by reference in their entirety.

TECHNICAL FIELD

The present invention relates to a conductive composition, a conductive member and a production method thereof, a touch panel, and a solar cell.

BACKGROUND ART

In recent years, touch panels have been installed as input devices in display devices such as liquid crystal panels and electronic papers. Regarding the configuration of touch panels, various configurations such as a resistant film system, a surface acoustic wave system and an electrostatic capacitance system are known, and the electrostatic capacitance system is known to be a system in which multi-point touch operation is possible and increase in area can be easily achieved. For example, an electrostatic capacitance type touch panel in which ITO (indium tin oxide) is used as a transparent conductive material has been disclosed (see Information DISPLAY, Vol. 26, No. 3, pp. 16-21).

However, there are problems in that: indium, which is a raw material of ITO, is expensive, and there are limitations on stable supply of indium; the production cost is high because a vacuum process is required for the production of thin films; and ITO films are brittle and have poor bending resistance. Therefore, substitute substances such as metal nanowires, carbon nanotubes, PEDOT and polyaniline have also been suggested.

A conductive member having a conductive layer containing conductive fibers such as metal nanowires, carbon nanotubes, and complexes of carbon nanotubes and metals, has been proposed (see, for example, Japanese National-Phase Publication No. 2009-505358). The conductive member includes, on a base material, a conductive layer containing plural metal nanowires, and when a photocurable composition is incorporated as a matrix into the conductive layer, the conductive member can be easily processed into a conductive member having a conductive layer that contains a preferable conductive region and non-conductive region, by patterned exposure and development subsequent thereto.

As a different mode of the conductive member containing conductive fibers as described above, a conductive member having a conductive layer that includes a preferable conductive region and non-conductive region can be easily processed by a method of incorporating a non-photocurable composition as a matrix into a conductive layer, performing drying and/or optionally crosslinking by a condensation reaction or a polymerization reaction to form a conductive layer, subsequently further forming a resist layer imagewise as an upper layer to the conductive layer using an etching resist or the like, and then performing an etching treatment; a method of partially disconnecting the conductive network in a uniformly formed transparent conductive layer by irradiation of laser light; or the like (see, for example, Japanese National-Phase Publication No. 2010-507199 and Japanese Patent Application Laid-Open (JP-A) No. 2010-44968).

Furthermore, as still another mode of the conductive member containing conductive fibers as described above, there has also been proposed a conductive layer-transferable conductive member in which a conductive layer containing conductive fibers is formed on a provisional support, the conductive layer is transferred to a glass substrate or the like, and then patterning by a photolithographic method or the like is optionally performed (see, for example, JP-A Nos. 2006-35771 and 2009-251186).

Regarding the conductive fibers that are preferably used in the conductive members described above, various materials are known, such as metal nanowires and nanorods of silver, gold, copper or the like; and carbon nanotubes, carbon nanorods, and composites of carbon nanotubes and a metal. Among them, it is known that metal conductive fibers fainted from a metal such as silver, gold or copper more preferably provide an excellent conductive member having low resistance and high transparency, and silver nanowires that are excellent in the balance among low resistance properties, durability and cost, are particularly preferably used.

However, there are cases in which, when a conductive member using such metal conductive fibers are exposed, for a long time, to harsh conditions such as high temperature conditions, high humidity conditions or the presence of ozone, an increase in resistivity that is speculated to be attributable to oxidation or morphological change of the metal may occur, and there are cases in which, depending on the application, an improvement of weather resistance is demanded.

Regarding the method for enhancing weather resistance of a transparent conductive material containing metal conductive fibers, methods of using a metal adsorbing compound having a specific structure have been disclosed (see, for example, Japanese National-Phase Publication No. 2009-505358 and JP-A No. 2009-146678). The method exhibits effectiveness depending on specific storage conditions, but there have been cases in which, since a metal adsorbing compound exhibits strong adsorptive property to metal conductive fibers, problems occur such as in that deterioration of conductivity or transparency of the conductive layer may occur, as aggregation of the metal conductive fibers occurs at the time of production of a transparent conductive material to deteriorate homogeneity of the conductive layer; and in that contact resistance between metal conductive fibers is increased whereby conductivity of the conductive layer is decreased.

Regarding a method for producing an aqueous dispersion containing metal nanowires, a method of adding a metal complex solution or a metal ion solution into an aqueous solvent containing a halogen compound and a reducing agent, has been disclosed (see, for example, JP-A No. 2010-84173). In the producing method, a desalting treatment is preferably carried out for the purpose of increasing the purity of the metal nanowires, and it is speculated that, when a desalting (washing) treatment disclosed in the Examples section is carried out, most of the reducing agent that did not contribute to the formation of the metal nanowires is eliminated. JP-A No. 2010-84173 has no description that the reducing agent that has been added at the time of reducing the metal complex intentionally remains, nor of effects thereof.

As discussed above, stable maintenance of the conductivity of a transparent conductive material containing metal conductive fibers even under harsh conditions such as high temperature conditions, high humidity conditions or the presence of ozone has not been sufficiently achieved with the related art, and there has been a demand for an improvement in weather resistance.

SUMMARY OF INVENTION

Technical Problem

A problem to be solved by the invention is to provide a conductive composition containing metal conductive fibers, which has excellent conductivity and transparency even if exposed to harsh conditions such as high temperature conditions, high humidity conditions or the presence of ozone; a conductive member having a conductive layer containing the conductive composition and a production method thereof; and a touch panel and a solar cell, each of which uses the conductive member.

Solution to Problem

The invention that solves the problems described above is as follows.

<1> A conductive composition comprising at least: a) metal conductive fibers having an average minor axis length of from 1 nm to 150 nm; and b) a compound represented by the following Formula (1) or Formula (2) in an amount of from 0.1% by mass to 1000% by mass with respect to the metal conductive fibers:

$$P—(CR_1=Y)_n-Q \qquad \text{Formula (1)}$$

wherein, in Formula (1), P and Q each independently represent a group represented by OH, $NR_2R_3$ or $CHR_4R_5$, in which $R_2$ and $R_3$ each independently represent a hydrogen atom or a group that can be substituted on a nitrogen atom, and $R_4$ and $R_5$ each independently represent a hydrogen atom or a substituent; Y represents $CR_6$ or a nitrogen atom; $R_1$ and $R_6$ each independently represent a hydrogen atom or a substituent; at least two of the groups represented by $R_1$, $R_2$, $R_3$, $R_4$, $R_5$ or $R_6$ may be bonded to each other to form a ring; n represents an integer from 0 to 5; when n is 0, neither P nor Q is a group represented by OH or $CHR_4R_5$; and when n represents a number of 2 or greater, the plurality of atomic groups each represented by $(CR_1=Y)$ may be the same as or different from each other;

$$R_7—C(=O)—H \qquad \text{Formula (2)}$$

wherein, in Formula (2), $R_7$ represents a hydrogen atom, an OH group, an alkyl group, an alkenyl group, an alkynyl group, an aryl group or a heterocyclic group.

<2> The conductive composition according to <1>, wherein the compound represented by Formula (1) is a compound represented by a formula selected from the group consisting of the following Formula (3) to Formula (17):

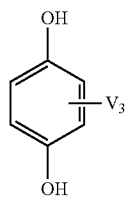

Formula (3)

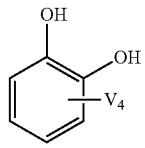

Formula (4)

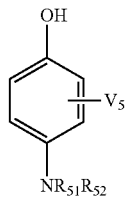

Formula (5)

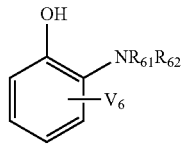

Formula (6)

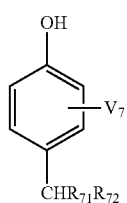

Formula (7)

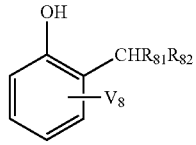

Formula (8)

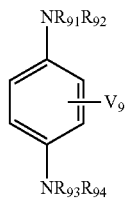

Formula (9)

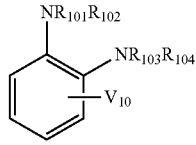

Formula (10)

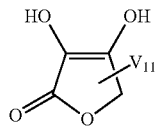

Formula (11)

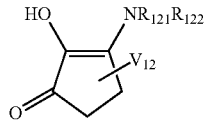

Formula (12)

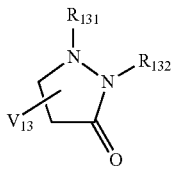

Formula (13)

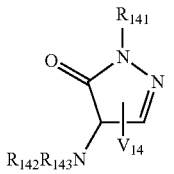

Formula (14)

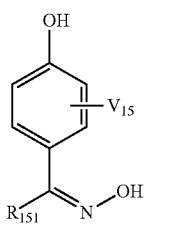

Formula (15)

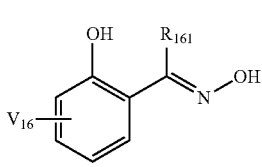

Formula (16)

$R_{171}R_{172}N-NR_{173}R_{174}$     Formula (17)

wherein, in Formula (3), $V_3$ represents a hydrogen atom or a substituent;

in Formula (4), $V_4$ represents a hydrogen atom or a substituent;

in Formula (5), $V_5$ represents a hydrogen atom or a substituent, and $R_{51}$ and $R_{52}$ each independently represent a hydrogen atom or a group that can be substituted on a nitrogen atom;

in Formula (6), $V_6$ represents a hydrogen atom or a substituent, and $R_{61}$ and $R_{62}$ each independently represent a hydrogen atom or a group that can be substituted on a nitrogen atom;

in Formula (7), $V_7$ represents a hydrogen atom or a substituent, and $R_{71}$ and $R_{72}$ each independently represent a hydrogen atom or a substituent;

in Formula (8), $V_8$ represents a hydrogen atom or a substituent, and $R_{81}$ and $R_{82}$ each independently represent a hydrogen atom or a substituent;

in Formula (9), $V_9$ represents a hydrogen atom or a substituent, and $R_{91}$, $R_{92}$, $R_{93}$ and $R_{94}$ each independently represent a hydrogen atom or a group that can be substituted on a nitrogen atom;

in Formula (10), $V_{10}$ represents a hydrogen atom or a substituent, and $R_{101}$, $R_{102}$, $R_{103}$ and $R_{104}$ each independently represent a hydrogen atom or a group that can be substituted on a nitrogen atom;

in Formula (11), $V_{11}$ represents a hydrogen atom or a substituent;

in Formula (12), $V_{12}$ represents a hydrogen atom or a substituent, and $R_{121}$ and $R_{122}$ each independently represent a hydrogen atom or a group that can be substituted on a nitrogen atom;

in Formula (13), $V_{13}$ represents a hydrogen atom or a substituent, and $R_{131}$ and $R_{132}$ each independently represent a hydrogen atom or a group that can be substituted on a nitrogen atom;

in Formula (14), $V_{14}$ represents a hydrogen atom or a substituent, and $R_{141}$, $R_{142}$ and $R_{143}$ each independently represent a hydrogen atom or a group that can be substituted on a nitrogen atom;

in Formula (15), $V_{15}$ represents a hydrogen atom or a substituent, and $R_{151}$ represents a hydrogen atom or a substituent;

in Formula (16), $V_{16}$ represents a hydrogen atom or a substituent, and $R_{161}$ represents a hydrogen atom or a substituent;

in Formula (17), $R_{171}$, $R_{172}$, $R_{173}$ and $R_{174}$ each independently represent a hydrogen atom or a group that can be substituted on a nitrogen atom; and each of the groups represented by $V_3$ to $V_{16}$ in Formulas (3) to (16) is bonded, in a number of one group or an arbitrary number of groups that can be substituted, at an arbitrary position, where substitution is possible, of a cyclic structure contained in Formulas (3) to (16).

<3> The conductive composition according to <2>, wherein the compound represented by Formula (1) is a compound represented by a formula selected from the group consisting of Formula (3), Formula (4), Formula (7), Formula (8), Formula (11), Formula (12), Formula (13) and Formula (14).

<4> The conductive composition according to any one of <1> to <3>, wherein the compound represented by Formula (1) or Formula (2) is contained in an amount of from 0.1% by mass to 100% by mass with respect to the metal conductive fibers.

<5> The conductive composition according to any one of <1> to <4>, wherein the metal conductive fibers comprise silver in an amount of from 50 mol % to 100 mol %.

<6> The conductive composition according to any one of <1> to <5>, wherein the average minor axis length of the metal conductive fibers is from 1 nm to 30 nm.

<7> The conductive composition according to any one of <1> to <6>, further comprising c) at least one compound selected from the group consisting of a compound capable of adsorbing to a metal and a compound capable of coordinating with a metal ion.

<8> A conductive member comprising, on a base material, a conductive layer containing the conductive composition according to any one of <1> to <7> on a base material.

<9> The conductive member according to <8>, wherein a surface resistance of the conductive layer is from 1 Ω/Square to 1000 Ω/Square.

<10> The conductive member according to <8> or <9>, wherein the conductive layer comprises a conductive region and a non-conductive region.

<11> The conductive member according to any one of <8> to <10>, further comprising at least one intermediate layer between the base material and the conductive layer.

<12> A method for producing a conductive member, the method comprising a process of applying, onto a base material, a conductive composition-coating liquid containing the conductive composition according to any one of <1> to <7> and a solvent.

<13> A touch panel comprising the conductive member according to any one of <8> to <11>.

<14> A solar cell comprising the conductive member according to any one of <8> to <11>.

Advantageous Effects of Invention

According to the invention, a conductive composition containing metal conductive fibers, which exhibits excellent conductivity and transparency even if exposed to harsh conditions such as high temperature conditions, high humidity conditions or the presence of ozone; a conductive member having a conductive layer containing the conductive composition and a production method thereof; and a touch panel and a solar cell using the conductive member are provided.

DESCRIPTION OF EMBODIMENTS

Figure 1:
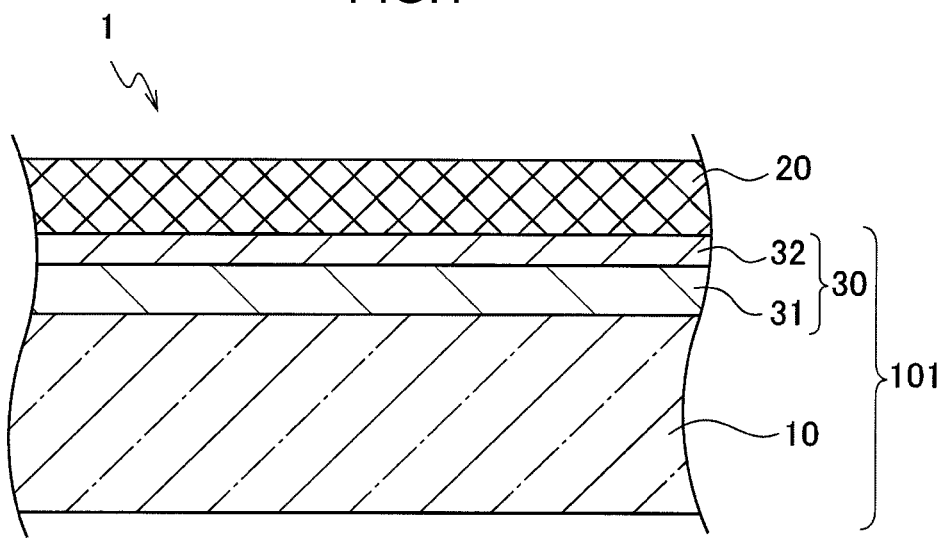
FIG. 1 is a schematic cross-sectional diagram of a conductive member according to a first embodiment of the invention.

Hereinafter, the conductive composition of the invention is described in detail.

Hereinafter, the invention is described by way of representative exemplary embodiments, but as long as it does not depart from the gist of the invention, the invention is not intended to be limited to the exemplary embodiments described.

In the present specification, the numerical value range indicated using the symbol "~(to)" means a range including the numerical values described before and after the symbol "~" as the lower limit and the upper limit.

The term "light" as used in the present specification is used as a concept including not only visible light, but also high energy radiations such ultraviolet radiation, X-radiation and gamma-radiation, and particle beams such as an electron beam.

In the present specification, the expression "(meth)acrylic acid" may be used to indicate any one or both of acrylic acid and methacrylic acid, and the expression "(meth)acrylate" may be used to indicate any one or both of acrylate and methacrylate.

Furthermore, unless particularly stated otherwise, the content is expressed on a mass basis. Unless particularly stated otherwise, the term percent (%) by mass represents the proportion with respect to the total amount of the composition, and the term "solid content" represents the components in the composition excluding solvents.

The conductive composition according to the invention contains at least: a) metal conductive fibers having an average minor axis length of from 1 nm to 150 nm, and b) a compound represented by the following Formula (1) or Formula (2) in an amount of from 0.1% by mass to 1000% by mass with respect to the metal conductive fibers:

  Formula (1)

wherein, in Formula (1), P and Q each independently represent a group represented by OH, $NR_2R_3$ or $CHR_4R_5$, in which $R_2$ and $R_3$ each independently represent a hydrogen atom or a group that can be substituted on a nitrogen atom, and $R_4$ and $R_5$ each independently represent a hydrogen atom or a substituent; Y represents $CR_6$ or a nitrogen atom; $R_1$ and $R_6$ each independently represent a hydrogen atom or a substituent; at least two of the groups represented by $R_1$, $R_2$, $R_3$, $R_4$, $R_5$ and $R_6$ may be bonded to each other to form a ring; a group represented by $R_1$, $R_2$, $R_3$, $R_4$, $R_5$ or $R_6$ may be bonded to a different group represented by $R_1$, $R_2$, $R_3$, $R_4$, $R_5$ or $R_6$ to form a ring; n represents an integer from 0 to 5; when n is 0, neither P nor Q is a groups represented by OH or $CHR_4R_5$; and when n represents a number of 2 or greater, plurality of atomic groups represented by ($CR_1$=Y) may be the same as or different from each other;

  Formula (2)

wherein, in Formula (2), $R_7$ represents a hydrogen atom, an OH group, an alkyl group, an alkenyl group, an alkynyl group, an aryl group or a heterocyclic group.

(Metal Conductive Fibers)

The conductive composition according to the invention contains metal conductive fibers having an average minor axis length of from 1 nm to 150 nm. The metal conductive fibers may employ any of a solid structure, a porous structure and a hollow structure, but it is preferable that any one of a solid structure and a hollow structure is employed. In the invention, a fiber having a solid structure may be referred to as a wire, and a fiber having a hollow structure may be referred to as a tube.

Examples of the conductive metal material that forms the fibers include metal oxides such as ITO, zinc oxide and tin oxide; metallic carbon, simple metal elements, composite structures formed from plural metal elements, and alloys formed from plural metals. Furthermore, the conductive metal material may be fabricated into a fibrous form, and then be surface-treated, and for example, a plated metal fiber and the like can also be used.

(Metal Nanowires)

From the viewpoint that a transparent conductive film can be easily formed, it is preferable to use metal nanowires as the metal conductive fibers. The metal nanowires according to the invention are preferably metal nanowires having an average minor axis length of from 1 nm to 150 nm and an average major axis length of from 1 μm to 100 μm.

The average minor axis length (average diameter) of the metal nanowires is preferably from 1 nm to 50 nm, more preferably from 5 nm to 30 nm, and particularly preferably from 5 nm to 25 nm. When the average minor axis length is less than 1 nm, there is a case that oxidation resistance is deteriorated and durability is poor. When the average minor axis length is greater than 150 nm, there is a risk that deterioration of optical characteristics such as an increase in haze due to light scattering or the like may occur, which is not preferable.

The average major axis length (may be referred to as "average length") of the metal nanowires is preferably from 1 μm to 40 μm, more preferably from 3 μm to 35 μm, and particularly preferably from 5 μm to 30 μm. When the average major axis length of the metal nanowires is longer than 40 μm, there is a risk that aggregates may be generated at the time of production of the metal nanowire, and when the average major axis length is shorter than 1 μm, there is a case that sufficient conductivity cannot be obtained.

Here, the average minor axis length (average diameter) and the average major axis length of the metal nanowires can be determined by, for example, observing a transmission electron microscope (TEM) image or an optical microscope image using a TEM or an optical microscope. In the invention, the average minor axis length (average diameter) and the average major axis length of the metal nanowires are determined such that 300 metal nanowires were observed using a transmission electron microscope (TEM; manufactured by JEOL, Ltd.; JEM-2000FX), and the average values were defined as the average axis lengths of the metal nanowires.

Regarding the average minor axis length in a case in which the cross-section in the minor axis direction of the metal nanowires was not circular, the length of the longest site measured in the minor axis direction was defined as the average minor axis length. Furthermore, when the metal nanowire was bent, in consideration of a circle having the bent segment as an arc, a value calculated from the radius and curvature of the circle was defined as the average major axis length.

The coefficient of variation of the average minor axis length (diameter) of the metal nanowires used in the conductive layer according to the invention is preferably 40% or less, more preferably 35% or less, and particularly preferably 30% or less.

When the coefficient of variation is set to 40% or less, conductivity with excellent durability can be easily secured.

The coefficient of variation of the average minor axis length (diameter) of the metal nanowires can be determined by, for example, measuring the average minor axis lengths (diameters) of 300 nanowires from a transmission electron microscopic (TEM) image, and calculating the standard deviation and the average value.

Regarding the shape of the metal nanowires, for example, any arbitrary shape such as a cylindrical shape, a cuboid shape, or a pillar shape with a polygonal cross-section can be employed, and for applications where high transparency is required, a cylindrical shape, or a pillar shape having a cross-section shape which is a polygon having 5 or more angles and does not have any acute-angled angle, is preferred.

The cross-section shape of the metal nanowires can be detected by applying an aqueous dispersion liquid of the metal nanowire onto a base material, and observing the cross-section with a transmission electron microscope (TEM).

There are no particular limitations on the metal for the metal nanowires, and any metal may be used. One kind of metal may be used, or two or more kinds of metals may be used in combination. The metals may also be used as alloys.

As the metal, at least one metal selected from the group consisting of the metals of the 4th period, the 5th period, and the 6th period of the Long Periodic Table (IUPAC 1991) is preferred; at least one metal selected from Group 2 to Group 14 is more preferred; at least one metal selected from Group 2, Group 8, Group 9, Group 10, Group 11, Group 12, Group 13 and Group 14 is even more preferred; and it is particularly preferable that the metal include these metals as a main component.

Specific examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and alloys thereof. Among these, copper, silver, gold, platinum, palladium, nickel, tin, cobalt, rhodium, iridium and alloys thereof are preferred; palladium, copper, silver, gold, platinum, tin and alloys thereof are more preferred; and particularly, silver or an alloy containing silver, which contains silver in an amount of from 50 mol % to 100 mol % (more preferably containing silver in an amount of from 90 mol % to 100 mol %) is preferred.

(Method of Producing Metal Nanowires)

The metal nanowires may be produced by any method without any particular limitations, and it is preferable to produce the metal nanowires by reducing metal ions in a solvent in which a halogen compound and a dispersant are dissolved, in a manner such as shown below. Furthermore, once metal nanowires are formed, it is preferable to carry out a desalting treatment by a conventional method, from the viewpoints of dispersibility, and stability over time of the photosensitive layer.

Furthermore, regarding the method of producing a metal nanowire, the methods described in JP-A Nos. 2009-215594, 2009-242880, 2009-299162, 2010-84173, 2010-86714 and the like can be used.

As the solvent used in the production of the metal nanowires, hydrophilic solvents are preferred, and examples thereof include water, alcohols, ethers, and ketones. These may be used singly, or two or more kinds may be used in combination.

Examples of alcohols include methanol, ethanol, propanol, 2-propanol, butanol, and ethylene glycol.

Examples of ethers include dioxane and tetrahydrofuran.

Examples of ketones include acetone.

When heating is performed at the time of producing the metal nanowires, the heating temperature is preferably 250° C. or lower, more preferably from 20° C. to 200° C., even more preferably from 30° C. to 180° C., and particularly preferably from 40° C. to 170° C. When the temperature is 20° C. or higher, the length of the metal nanowires thus formed is in a preferred range by which dispersion stability can be secured, and when the temperature is 250° C. or lower, the outer circumference of the cross-section of the metal nanowires has a smooth shape that does not have any acute-angled angle, and therefore, it is suitable from the viewpoint of transparency.

If necessary, the temperature may be changed during the process of particle formation, and the change of temperature in the middle of the course may be effective in the control of nucleation, suppression of renucleation, and enhancement of monodispersity as a result of the promotion of selective growth.

At the time of the heating, it is preferable to perform the heating with adding a reducing agent.

There are no particular limitations on the reducing agent, and the reducing agent can be appropriately selected among those agents capable of reducing a metal ion. Examples thereof include metal borohydride salts, aluminum hydride salts, alkanolamines, aliphatic amines, heterocyclic amines, aromatic amines, aralkylamines, alcohols, organic acids, reducing sugars, sugar alcohols, sulfurous acid salts, hydrazine compounds, dextrin, hydroquinone, hydroxylamine, ethylene glycol, and glutathione. Among these, reducing sugars, sugar alcohols as derivatives thereof, and ethylene glycol are more preferred, and reducing sugars, sugar alcohols as derivatives thereof, and ethylene glycol are particularly preferred. In the reducing agent, there are compounds which also function as dispersants or solvents, and these compounds can be used preferably in a similar manner.

It is preferable to remove the reducing agent used in the formation of metal nanowires such that a residual amount is less than 0.1% by mass with respect to silver, after the formation of the metal nanowires, by techniques such as ultrafiltration, dialysis, gel filtration, decantation, and centrifugation.

At the time of producing the metal nanowires, it is preferable to perform the production with adding a dispersant and a halogen compound or metal halide fine particles.

The timing of the addition of the dispersant and the halogen compound may be before the addition or after the addition of the reducing agent, or may be before the addition or after the addition of a metal ion or metal halide fine particles. However, in order to obtain nanowires having superior monodispersity, two or more separate-steps of addition of the halogen compound is preferable.

The dispersant may be added to the reaction solution before the preparation of particles, or may be added after particle preparation. The addition of the dispersant may be carried out in a single step, or may be divided into two or more steps.

Examples of the dispersant include amino group-containing compounds, mercapto group-containing compounds, sulfide-containing compounds, amino acids or derivatives thereof, peptide compounds, and polymers such as polysaccharides, natural polymers derived from polysaccharides, synthetic polymers, and gels derived therefrom.

Preferable examples of polymer compounds that are suitably used as dispersants include hydrophilic polymers such as gelatin, polyvinyl alcohol, methyl cellulose, hydroxypropyl cellulose, polyalkyleneamines, poly(meth)acrylic acid, salts thereof or partial alkyl esters thereof, polyvinylpyrrolidone, copolymers containing a polyvinylpyrrolidone structure, and poly(meth)acrylic acid derivatives having an amino group or a mercapto group, which are polymers having protective colloid properties.

The polymer used as a dispersant preferably has a weight average molecular weight (Mw) as measured by a gel permeation chromatographic method of from 3,000 to 300,000, and more preferably from 5,000 to 100,000.

In regard to the structure of the compound that can be used as a dispersant, for example, reference can be made to the descriptions in "Ganryo no Jiten (Dictionary of Pigments)" (edited by Seijiro ITOH, published by Asakura Publishing Co., Ltd., 2000).

The shape of the metal nanowires to be obtained can be controlled by the kind of the dispersant used.

The halogen compound is preferably a compound containing bromide ion, chloride ion, or iodide ion. For example, metal halides such as sodium bromide, sodium chloride, sodium iodide, potassium iodide, potassium bromide and potassium chloride; or the following halide ion salts of onium salts that also function as dispersants are preferred.

As a substitute of the halogen compound, silver halide fine particles may be used, and both a halogen compound and silver halide fine particles may also be used.

Furthermore, a single substance having the functions of both a dispersant and a halogen compound may also be used. That is, the functions of both a dispersant and a halogen compound are exhibited by a single compound.

Preferred examples of the halogen compound having functions as a dispersant include halide ion salts of oniums (preferably, ammonium or phosphonium).

Examples thereof include hexadecyltrimethylammonium bromide (HTAB), hexadecyltrimethylammonium chloride (HTAC), dodecyltrimethylammonium bromide, dodecyltrimethylammonium chloride, stearyltrimethylammonium bromide, stearyltrimethylammonium chloride, decyltrimethylammonium bromide, decyltrimethylammonium chloride, dimethyldistearylammonium bromide, dimethyldistearylammonium chloride, dilauryldimethylammonium bromide, dilauryldimethylammonium chloride, dimethyldipalmitylammonium bromide, and dimethyldipalmitylammonium chloride.

These compounds may be eliminated as necessary, after the formation of the metal nanowires, by techniques such as ultrafiltration, dialysis, gel filtration, decantation, and centrifugation.

It is preferable that the metal nanowires do not contain inorganic ions such as alkali metal ions, alkaline earth metal ions, halide ions, and the like as much as possible. The electrical conductivity at the time when the metal nanowires are dispersed in an aqueous dispersion is preferably 1 mS/cm or less, more preferably 0.1 mS/cm or less, and even more preferably 0.05 mS/cm or less.

The viscosity at 20° C. when the metal nanowires are dispersed into an aqueous dispersion is preferably from 0.5 mPa·s to 100 mPa·s, and more preferably from 1 mPa·s to 50 mPa·s.

Preferred examples of the metal conductive fibers other than metal nanowires include metal nanotubes which are hollow fibers.

(Metal Nanotubes)

There are no particular limitations on the material for the metal nanotubes, and any metal may be used. For example, the materials for the metal nanowires described above can be used.

Regarding the shape of the metal nanotubes, the metal nanotubes may have a single layer structure, or may have a multilayer structure; however, from the viewpoint having excellent conductivity and thermal conductivity, a single layer structure is preferable.

The thickness (difference between the outer diameter and the inner diameter) of the metal nanotube is preferably from 3 nm to 80 nm, and more preferably from 3 nm to 30 nm. When the thickness is 3 nm or more, sufficient oxidation resistance can be obtained, and when the thickness is 80 nm or less, the occurrence of light scattering caused by the metal nanotubes is suppressed.

In the invention, the average minor axis length of the metal nanotubes is 150 nm or less, similarly to the case of the metal nanowires. The preferred average minor axis length is the same as that of the metal nanowires. Furthermore, the average major axis length is preferably from 1 μm to 40 μm, more preferably from 3 μm to 35 μm, and even more preferably from 5 μm to 30 μm.

The method of producing the metal nanotubes is not particularly limited, and can be appropriately selected according to the purpose. For example, the method described in U.S. Patent Application Publication No. 2005/0056118 and the like can be used.

(Aspect Ratio of Metal Conductive Fibers)

The aspect ratio of the metal conductive fibers used in the invention is preferably 50 or greater. The aspect ratio generally means the ratio of a longer side to a shorter side of a fibrous material (ratio of average major axis length/average minor axis length).

The method of measuring the aspect ratio is not particularly limited, and can be appropriately selected according to the purpose. Examples thereof include a method of measurement using an electron microscope.

When the aspect ratio of the metal conductive fibers is measured with an electron microscope, it may be confirmed in one field of view of the electron microscope whether the aspect ratio of the metal conductive fibers is 50 or greater. Furthermore, the overall aspect ratio of the metal conductive fibers can be estimated by separately measuring the average major axis lengths and the average minor axis length of the metal conductive fibers, respectively.

When the metal conductive fibers have a tube shape, the outer diameter of the tubes is used as the diameter for calculating the aspect ratio.

The aspect ratio of the metal conductive fibers can be appropriately selected according to the purpose, and the aspect ratio is preferably from 50 to 1,000,000, and more preferably from 100 to 1,000,000.

When the aspect ratio is 50 or greater, the formation of a network by the metal conductive fibers is facilitated, and sufficient conductivity can be easily secured. Furthermore, when the aspect ratio is 1,000,000 or less, a stable liquid having excellent production suitability without having the metal conductive fibers entangled at the time of formation of the metal conductive fibers or during handling of the metal conductive fibers thereafter, may be readily obtained.

(Compound Represented by Formula (1) or Formula (2))

The conductive composition according to the invention contains a compound represented by the following Formula (1) or Formula (2):

$$P-(CR_1=Y)_n-Q \qquad \text{Formula (1)}$$

In Formula (1), P and Q each independently represent a group represented by OH, $NR_2R_3$ or $CHR_4R_5$. $R_2$ and $R_3$ each independently represent a hydrogen atom or a group that can be substituted on a nitrogen atom. $R_4$ and $R_5$ each independently represent a hydrogen atom or a substituent. Y represents $CR_6$ or a nitrogen atom, and $R_1$ and $R_6$ each independently represent a hydrogen atom or a substituent. At least two groups represented by $R_1$, $R_2$, $R_3$, $R_4$, $R_5$ and $R_6$, particularly $R_1$ and $R_6$, $R_2$ and $R_3$, or $R_4$ and $R_5$, may be bonded to each other and form a ring. n represents an integer from 0 to 5. When n is 0, neither P nor Q is a group represented by OH or $CHR_4R_5$.

When n represents a number of 2 or greater, the plurality of atomic groups each represented by $(CR_1=Y)$ may be the same as or different from each other.

$$R_7-C(=O)-H \qquad \text{Formula (2)}$$

In Formula (2), $R_7$ represents a hydrogen atom, an OH group, an alkyl group, an alkenyl group, an alkynyl group, an aryl group or a heterocyclic group.

Examples of the group that can be substituted on a nitrogen atom, which is represented by $R_2$ or $R_3$ in Formula (1), include an alkyl group (including a cycloalkyl group), an alkenyl group (including a cycloalkenyl group and a bicycloalkenyl group), an alkynyl group, an aryl group, a heterocyclic group, an alkyl- or arylsulfinyl group, an alkyl- or arylsulfonyl group, an acyl group, an alkoxycarbonyl group, an aryloxycarbonyl group, a carbamoyl group, a phosphino group, and a phosphinyl group.

More specifically, examples also include an alkyl group [representing a linear, branched or cyclic, substituted or unsubstituted alkyl group. Preferable examples thereof include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group obtained by eliminating one hydrogen atom from a bicycloalkane having 5 to 30 carbon atoms; for example, bicyclo[1.2.2]heptan-2-yl or bicyclo[2.2.2]octan-3-yl), and a tricyclo structure having further more cyclic structures. The alkyl group in substituents that are described below (for example, the alkyl group of an alkylthio group) also represents an alkyl group of such conception], an alkenyl group [representing a linear, branched or cyclic, substituted or unsubstituted alkenyl group. Examples thereof include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group obtained by eliminating one hydrogen atom from a cycloalkene having 3 to 30 carbon atoms; for example, 2-cyclopenten-1-yl or 2-cyclohexen-1-yl), a bicycloalkenyl group (a substituted or unsubstituted bicycloalkenyl group, and preferably a substituted or unsubstituted bicycloalkenyl group having 5 to 30 carbon atoms, that is, a monovalent group obtained by eliminating one hydrogen atom from a bicycloalkene having one double bond; for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, ethynyl, propargyl, or trimethylsilylethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group obtained by eliminating one hydrogen atom from a 5-membered or 6-membered substituted or unsubstituted, aromatic or non-aromatic heterocyclic compound, and more preferably a 5-membered or 6-membered aromatic heterocyclic group having 3 to 30 carbon atoms; for example, 2-furanyl, 2-thienyl, 2-pyrimidinyl, or 2-benzothiazolinyl), an alkyl- or arylsulfinyl group (preferably, a substituted or unsubstituted alkylsulfinyl group having 1 to 30 carbon atoms, or a substituted or unsubstituted arylsulfinyl group having 6 to 30 carbon atoms, for example, methylsulfinyl, ethylsulfinyl, phenylsulfinyl or p-methylphenylsulfinyl), an alkyl- or arylsulfonyl group (preferably a substituted or unsubstituted alkylsulfonyl group having 1 to 30 carbon atoms, or a substituted or unsubstituted arylsulfonyl group having 6 to 30 carbon atoms; for example, methylsulfonyl, ethylsulfonyl, phenylsulfonyl, or p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms, which is bonded to a carbonyl group through a carbon atom; for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably a substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), a phosphino group (preferably a substituted or unsubstituted phosphino group having 2 to 30 carbon atoms, for example, dimethylphosphino, diphenylphosphino, or methylphenoxyphosphino), and a phosphinyl group (preferably a substituted or unsubstituted phosphinyl group having 2 to 30 carbon atoms, for example, phosphinyl, dioctyloxyphosphinyl, or diethoxyphosphinyl).

Among the functional groups described above, in a functional group having a hydrogen atom, the hydrogen atom may be eliminated and be further substituted.

The alkyl group represented by $R_2$ or $R_3$ in the above Formula (1) represents a linear, branched or cyclic substituted or unsubstituted alkyl group, and preferably has 1 to 50 carbon atoms, more preferably 1 to 30 carbon atoms, and particularly preferably 1 to 20 carbon atoms. Preferred examples thereof include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, and triacontyl. More preferred examples thereof include methyl, ethyl, n-propyl, isopropyl, butyl, isobutyl, t-butyl, sec-butyl, t-butyl, pentyl, isopentyl, neopentyl, hexyl, cyclohexyl, octyl, 2-ethylhexyl, dodecyl, hexadecyl, and octadecyl, and particularly preferred examples thereof include methyl, ethyl, n-propyl, isopropyl, butyl, t-butyl, pentyl, isopentyl, hexyl, cyclohexyl, octyl, 2-ethylhexyl, dodecyl, hexadecyl, and octadecyl.

The alkyl group represented by $R_2$ or $R_3$ may further have a substituent. Examples of the substituent include a halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy, an amino group (including an anilino group), an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imide group, a phosphino group, a phosphinyl group, a phosphinyloxy group, a phosphinylamino group, and a silyl group.

More specifically, examples of the substituent include a halogen atom (for example, a chlorine atom, a bromine atom, or an iodine atom), an alkyl group [(representing a linear, branched or cyclic, substituted or unsubstituted alkyl group. Examples thereof include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group obtained by eliminating one hydrogen atom from a bicycloalkane having 5 to 30 carbon atoms; for example, bicyclo[1.2.2] heptan-2-yl or bicyclo[2.2.2]octan-3-yl), and a tricyclo structure having further more cyclic structures. The alkyl group in substituents that are described below (for example, the alkyl group of an alkylthio group) also represents an alkyl group of such conception], an alkenyl group [representing a linear, branched or cyclic, substituted or unsubstituted alkenyl group. Examples thereof include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group obtained by eliminating one hydrogen atom from a cycloalkene having 3 to 30 carbon atoms; for example, 2-cyclopenten-1-yl or 2-cyclohexen-1-yl), a bicycloalkenyl group (a substituted or unsubstituted bicycloalkenyl group, and preferably a substituted or unsubstituted bicycloalkenyl group having 5 to 30 carbon atoms, that is, a monovalent group obtained by eliminating one hydrogen atom from a bicycloalkene having one double bond; for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, ethynyl, propargyl, or trimethylsilylethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group obtained by eliminating one hydrogen atom from a 5-membered or 6-membered substituted or unsubstituted, aromatic or non-aromatic heterocyclic compound, and more preferably a 5-membered or 6-membered aromatic heterocyclic group having 3 to 30 carbon atoms; for example, 2-furanyl, 2-thienyl, 2-pyrimidinyl, or 2-benzothiazolinyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group having 2 to 30 carbon atoms, 1-phenyltetrazole-5-oxy or 2-tetrahydropyranyloxy), an acyloxy group (preferably a formyloxy group, a substituted or unsubstituted alkylcarbonyloxy group having 2 to 30 carbon atoms, a substituted or unsubstituted arylcarbonyloxy group having 6 to 30 carbon atoms; for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxycarbonyloxy), an amino group (preferably an amino group, a substituted or unsubstituted alkylamino group having 1 to 30 carbon atoms, or a substituted or unsubstituted anilino group having 6 to 30 carbon atoms, for example, amino, methylamino, dimethylamino, anilino, N-methylanilino, or diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms; for example, formylamino, acetylamino, pivaloylamino, lauroylamino, benzoylamino, or 3,4,5-tri-n-octyloxyphenylcarbonylamino), an aminocarbonylamino group (preferably a substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methylmethoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), an alkyl- or arylsulfonylamino group (preferably a substituted or unsubstituted alkylsulfonylamino having 1 to 30 carbon atoms, or a substituted or unsubstituted arylsulfonylamino having 6 to 30 carbon atoms, for example, methylsulfonylamino, butylsulfonylamino, phenylsulfonylamino, 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio or n-hexadecylthio), an arylthio group (preferably a substituted or unsubstituted arylthio having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, an alkyl- or arylsulfinyl group (preferably a substituted or unsubstituted alkylsulfinyl group having 1 to 30 carbon atoms, or a substituted or unsubstituted arylsulfinyl group having 6 to 30 carbon atoms, for example, methylsulfinyl, ethylsulfonyl, phenylsulfinyl, or p-methylphenylsulfinyl), an alkyl- or arylsulfonyl group (preferably a substituted or unsubstituted alkylsulfonyl group having 1 to 30 carbon atoms, or a substituted or unsubstituted arylsulfonyl group having 6 to 30 carbon atoms, for example, methylsulfonyl, ethylsulfonyl, phenylsulfonyl, or p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms, which is bonded to a carbonyl group through a carbon atom; for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorphenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably a substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), an aryl- or heterocyclic azo group (preferably a substituted or unsubstituted arylazo group having 6 to 30 carbon atoms, or a substituted or unsubstituted heterocyclic azo group having 3 to 30 carbon atoms, for example, phenylazo, p-chlorophenylazo, or 5-ethylthio-1,3,4-thiadiazol-2-ylazo), an imide group (preferably N-succinimide, or N-phthalimide), a phosphino group (preferably a substituted or unsubstituted phosphino group having 2 to 30 carbon atoms, for example, dimethylphosphino, diphenylphosphino, or methylphenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy, or dioctyloxyphosphinyloxy), a phosphinylamino group (preferably a substituted or unsubstituted phosphinylamino group having 2 to 30 carbon atoms, for example, dimethoxyphosphinylamino, or dimethylaminophosphinylamino), and a silyl group (preferably a substituted or unsubstituted silyl group having 3 to 30 carbon atoms, for example, trimethylsilyl, t-butyldimethylsilyl, or phenyldimethylsilyl).

Among the functional groups described above, in a functional group having a hydrogen atom, the hydrogen atom may be eliminated and be further substituted with the groups described above. Examples of such a functional group include an alkylcarbonylaminosulfonyl group, an arylcarbonylaminosulfonyl group, an alkylsulfonylaminocarbonyl group, and an arylsulfonylaminocarbonyl group. Examples thereof include methylsulfonylaminocarbonyl, p-methylphenylsulfonylaminocarbonyl, acetylaminosulfonyl, and benzoylaminosulfonyl groups.

The alkenyl group represented by $R_2$ or $R_3$ represents a linear, branched or cyclic substituted or unsubstituted alkenyl group, and preferably has 2 to 50 carbon atoms, more preferably 2 to 30 carbon atoms, and particularly preferably 2 to 20 carbon atoms. Preferred examples thereof include vinyl, allyl, prenyl, geranyl, oleyl, 2-cyclopenten-1-yl, 2-cyclohexen-1-yl, bicyclo[2.2.1]hept-2-en-1-yl, and bicyclo[2.2.2]oct-2-en-4-yl. More preferred examples thereof include vinyl, allyl, prenyl, geranyl, oleyl, 2-cyclopenten-1-yl, and 2-cyclohexen-1-yl, and particularly preferred examples thereof include vinyl, allyl, prenyl, geranyl, oleyl, 2-cyclopenten-1-yl, and 2-cyclohexen-1-yl.

The alkenyl group represented by $R_2$ or $R_3$ may further have a substituent. Examples of the substituent include the substituents for the alkyl group represented by $R_2$ or $R_3$ described above.

The alkynyl group represented by $R_2$ or $R_3$ represents a linear, branched or cyclic substituted or unsubstituted alkynyl group, and preferably has 2 to 50 carbon atoms, more preferably 2 to 30 carbon atoms, and particularly preferably 2 to 20 carbon atoms. Preferred examples thereof include ethynyl and propargyl.

The alkynyl group represented by $R_2$ or $R_3$ may further have a substituent. Examples of the substituent include the substituents for the alkyl group represented by $R_2$ or $R_3$ described above.

The aryl group represented by $R_2$ or $R_3$ represents a substituted or unsubstituted aryl group, and preferably has 6 to 50 carbon atoms, more preferably 6 to 30 carbon atoms, and particularly preferably 6 to 20 carbon atoms. Preferred examples thereof include phenyl, 2-methylphenyl, 3-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 3-chlorophenyl, 4-chlorophenyl, 2-methoxyphenyl, 3-methoxyphenyl, 4-methoxyphenyl, 2-benzylphenyl, 4-benzylphenyl, 2-methylcarbonylphenyl, and 4-methylcarbonylphenyl.

More preferred examples thereof include phenyl, 2-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 3-methoxyphenyl, 4-methoxyphenyl, 2-benzylphenyl, and 4-benzylphenyl. Particularly preferred examples thereof include phenyl, 2-methylphenyl, 4-methylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 4-methoxyphenyl, 2-benzylphenyl, and 4-benzylphenyl.

The aryl group represented by $R_2$ or $R_3$ may further have a substituent. Examples of the substituent include the substituents for the alkyl group represented by $R_2$ or $R_3$ described above.

$R_4$ and $R_5$ each independently represent a hydrogen atom, an alkyl group, an alkenyl group, an alkynyl group, or an aryl group. The groups represented by $R_4$ and $R_5$ may be bonded to each other to form a ring.

When $R_4$ and $R_5$ each represent an alkyl group, an alkenyl group, an alkynyl group or an aryl group, preferred examples of respective groups include the examples of $R_2$ and $R_3$ described above.

The alkyl group, alkenyl group, alkynyl group or aryl group represented by $R_4$ and $R_5$ may further have a substituent. Examples of the substituent include the substituents for the alkyl group represented by $R_2$ or $R_3$ described above.

$R_1$ and $R_6$ in Formula (1) each independently represent a hydrogen atom or a substituent. $R_1$ and $R_6$ may be bonded to each other to form a ring.

Examples of the substituent represented by $R_1$ and $R_6$ include the substituents for the alkyl group represented by $R_2$ and $R_3$ described above. Preferred examples thereof include an alkyl group, an alkenyl group, an alkynyl group, and an aryl group, and preferred examples for respective substituents include the examples of $R_2$ and $R_3$ described above.

The group represented by $R_1$ or $R_6$ may further have a substituent. Examples of the substituent include the substituents for the alkyl group represented by $R_2$ and $R_3$ described above.

n represents an integer from 0 to 5. However, when n is 0, neither P nor Q is a group represented by OH or $CHR_4R_5$. When n represents a number of 2 or greater, the plurality of atomic groups each represented by $(CR_1=Y)$ may be the same as or different from each other.

The compound represented by Formula (1) may be in a chain-like form or a cyclic form, and when the compound is in a cyclic form, it is expressed such that the groups represented by $R_1$, $R_2$, $R_3$, $R_4$, $R_5$ and $R_6$ are bonded to each other.

Next, the compound represented by Formula (2) is described.

In the invention, the compound represented by Formula (2) also includes a compound (aldose or the like) which exhibits reducing properties as a result of an equilibrium existing between an aldehyde form and a hemiacetal form, or a compound which is capable of forming an aldehyde form by isomerization between an aldose and a ketose induced by a Lobry-de Bruyn-van Ekenstein transformation reaction (fructose or the like).

In Formula (2), $R_7$ represents a hydrogen atom, an OH group, an alkyl group, an alkenyl group, an alkynyl group, an aryl group or a heterocyclic group. When $R_7$ represents an alkyl group, an alkenyl group, an alkynyl group or an aryl group, preferred examples of respective groups include the examples for $R_2$ and $R_3$ described above. When $R_7$ represents a heterocyclic group, the heterocyclic group is preferably a monovalent group obtained by eliminating one hydrogen atom from a 5-membered or 6-membered substituted or unsubstituted, aromatic or non-aromatic heterocyclic compound, and more preferably a 5-membered or 6-membered aromatic or non-aromatic heterocyclic group having 3 to 30 carbon atoms. Preferred examples thereof include 2-furanyl, 2-thienyl, 2-pyrimidinyl, 2-benzothiazolyl, 2-benzoxazolyl, 2-imidazolyl, 4-imidazolyl, triazolyl, benzotriazolyl, thiadiazolyl, pyrrolidinyl, piperidinyl, imidazolidinyl, pyrazolidinyl, morpholinyl, tetrahydrofuranyl, and tetrahydrothienyl.

$R_7$ is more preferably a hydrogen atom, an OH group, an alkyl group, an alkenyl group, an alkynyl group, or an aryl group; and particularly preferably an alkyl group or an aryl group.

The alkyl group, alkenyl group, alkynyl group, aryl group or heterocyclic group represented by $R_7$ may further have a substituent. Examples of the substituent include the substituents for the alkyl group represented by $R_2$ or $R_3$ in Formula (1) described above.

Particularly preferred examples of the compound represented by Formula (2) include reducing sugars that are generally called aldoses, and derivatives thereof. Preferred examples thereof include glyceraldehyde, erythrose, threose, ribose, arabinose, xylose, lyxose, allose, altrose, glucose, mannose, gulose, idose, galactose, talose, and compounds in which a part or all of hydroxyl groups of these compounds have been acylated (acetyl, propionyl, butyryl, benzoyl or the like) or etherified (methyl, ethyl, hydroxyethyl, benzyl, hydroxymethyl, carboxymethyl or the like).

Specific examples of the compound represented by Formula (2) are shown below. However, the invention is not intended to be limited to these.

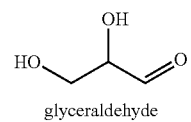

glyceraldehyde 2-1

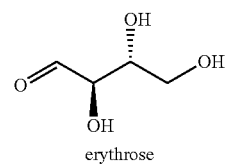

erythrose 2-2

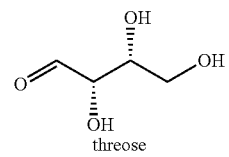

threose 2-3

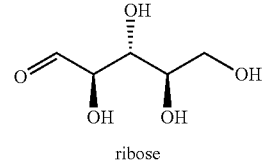

ribose 2-4

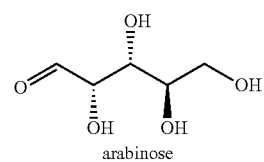

arabinose 2-5

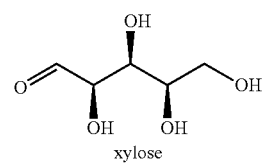

xylose 2-6

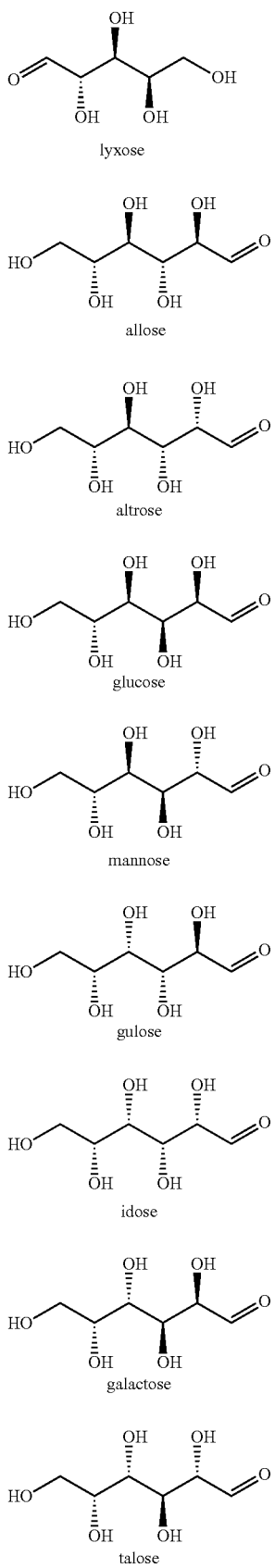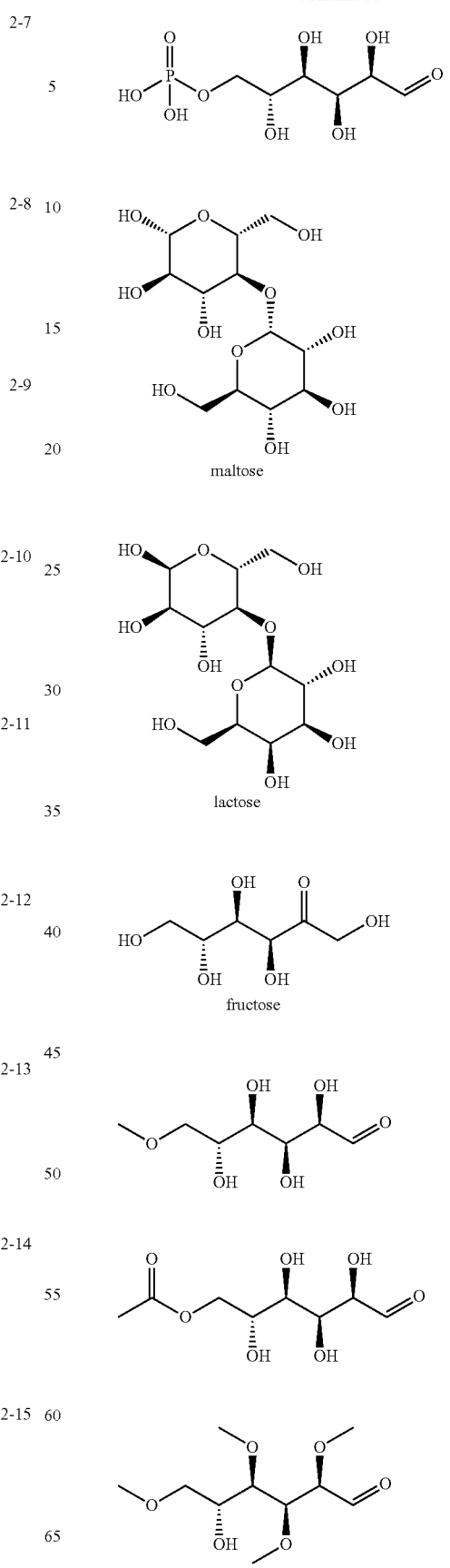

-continued
2-23
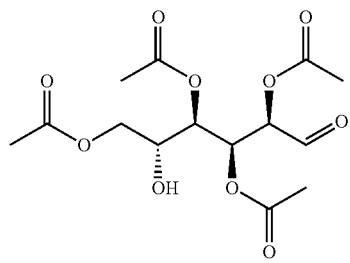
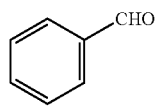
HCHO
HOCHO
CH₃CHO
C₁₃H₂₇CHO
C₁₅H₃₁CHO
C₁₇H₃₅CHO
H₂C=CHCHO
H—≡—CHO
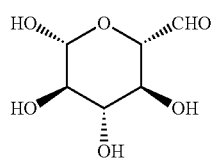
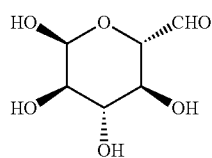
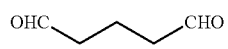
2-23
2-24
2-25
2-26
2-27
2-28
2-29
2-30
2-31
2-32
2-33
Preferred examples of the compound represented by Formula (1) include compounds represented by the following Formula (3) to Formula (17).
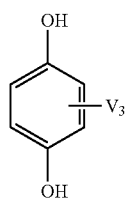
Formula (3)
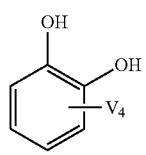
Formula (4)
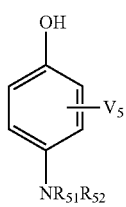
Formula (5)
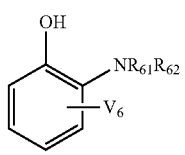
Formula (6)
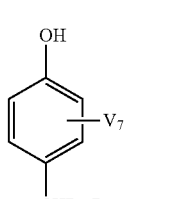
Formula (7)
Formula (8)
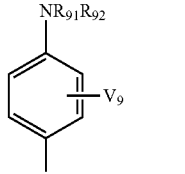
Formula (9)
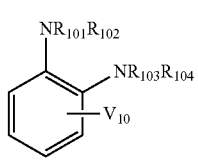
Formula (10)
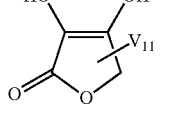
Formula (11)
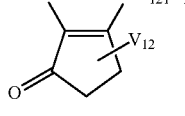
Formula (12)
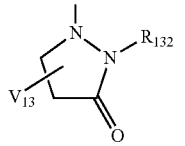
Formula (13)

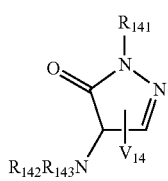
Formula (14)

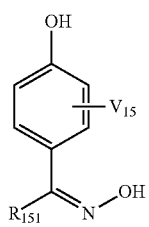
Formula (15)

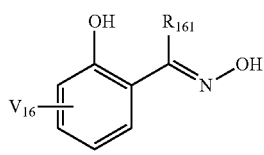
Formula (16)

$R_{171}R_{172}N—NR_{173}R_{174}$  Formula (17)

The compound represented by the above Formula (3) is a compound in which P and Q each represent OH; Y represents $CR_6$; and n represents 2, in Formula (1).

In Formula (3), $V_3$ represents a hydrogen atom or a substituent. The bonding form of the group represented by $V_3$ in Formula (3) represents that the group represented by $V_3$ is bonded, in a number of an arbitrary number in the range of from 1 to 4 groups, at an arbitrary position, where substitution is possible, of the cyclic structure contained in Formula (3). Preferred examples of the group when $V_3$ represents a substituent include the substituents for the alkyl group represented by $R_2$ or $R_3$ in Formula (1) described above. When there exists a plurality of groups represented by $V_3$ in Formula (3), the respective groups may be the same as or different from each other, or may be bonded to each other to form a ring.

Specific examples of the compound represented by Formula (3) are shown below. However, the invention is not intended to be limited to these.

3-1
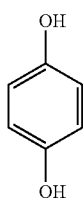

3-2
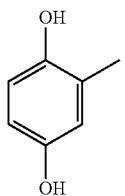

3-3
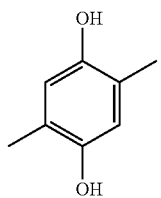

3-4
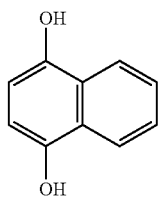

3-5
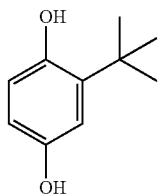

3-6
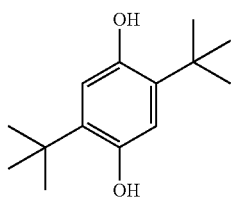

3-7
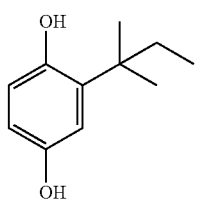

3-8
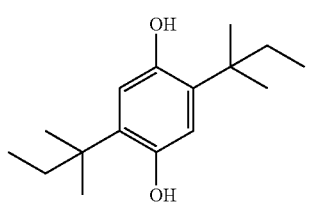

3-9
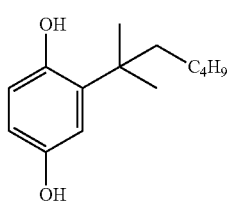

3-10
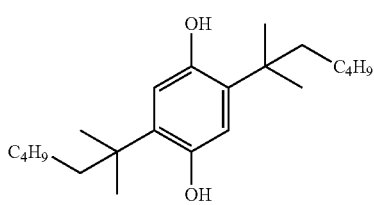

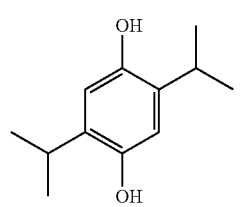 3-11
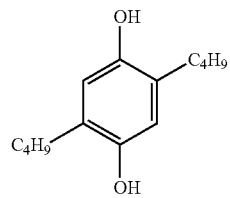 3-12
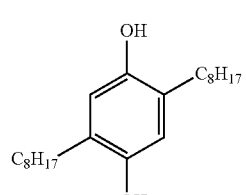 3-13
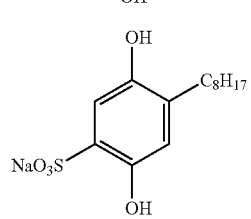 3-14
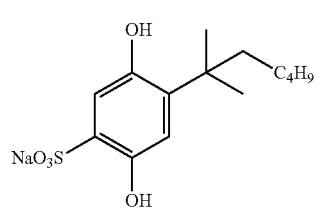 3-15
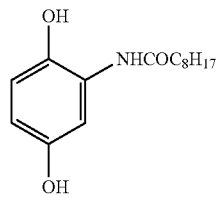 3-16
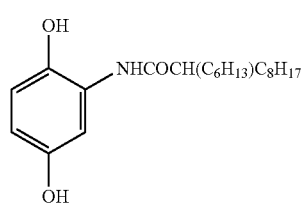 3-17
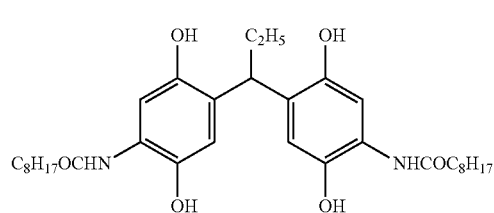 3-18
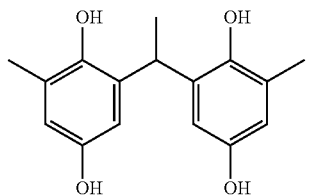 3-19
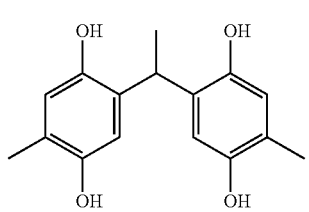 3-20
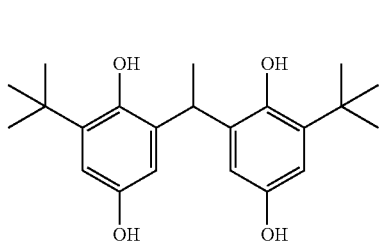 3-21
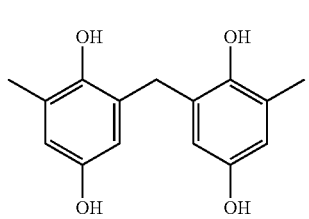 3-22
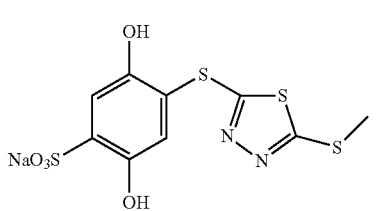 3-23
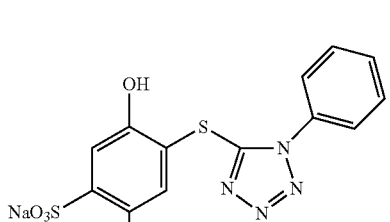 3-24
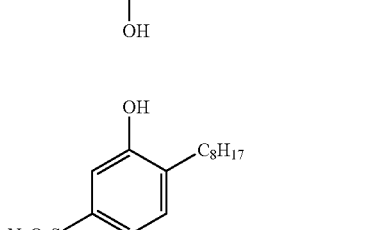 3-25

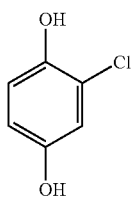
3-26

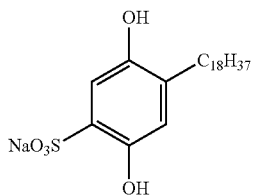
3-27

The compound represented by Formula (4) is an example in which P and Q each represent OH; Y represents $CR_6$; and n represents 1, in Formula (1).

In Formula (4), $V_4$ represents a hydrogen atom or a substituent. The bonding form of the group represented by $V_3$ in Formula (4) represents that the group represented by $V_4$ in Formula (4) is bonded, in a number of an arbitrary number in the range of 1 to 4 groups, at an arbitrary position, where substitution is possible, of the cyclic structure contained in Formula (4). Preferred examples of the group when $V_4$ represents a substituent include the substituents for the alkyl group represented by $R_2$ or $R_3$ in Formula (1) described above. When there exists a plurality of groups represented by $V_4$ in Formula (4), the respective groups may be the same as or different from each other, or may be bonded to each other to form a ring.

Specific examples of the compound represented by Formula (4) are shown below. However, the invention is not intended to be limited to these.

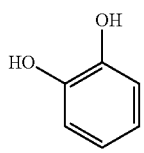
4-1

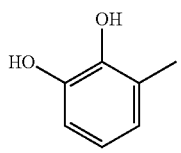
4-2

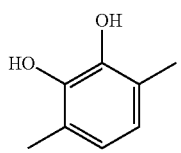
4-3

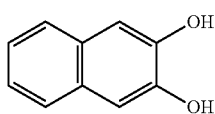
4-4

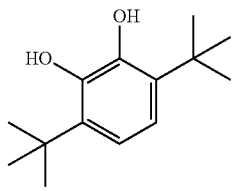
4-5

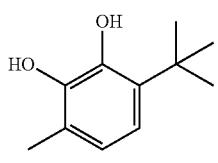
4-6

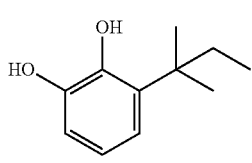
4-7

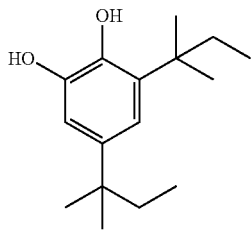
4-8

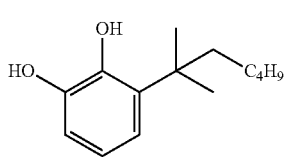
4-9

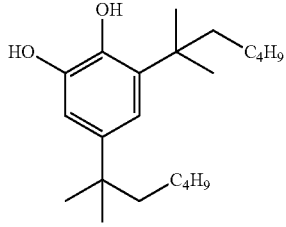
4-10

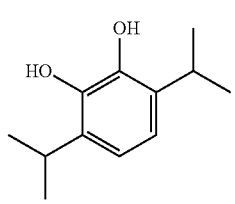
4-11

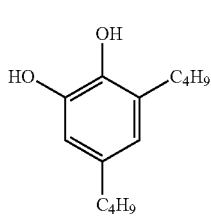
4-12

4-13 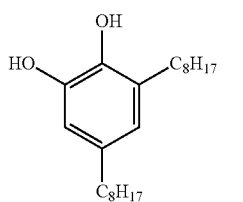

4-14 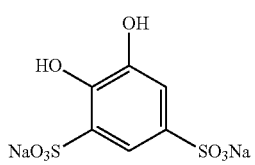

4-15 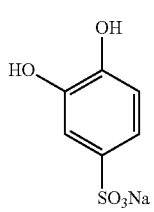

4-16 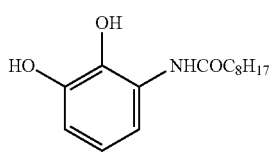

4-17 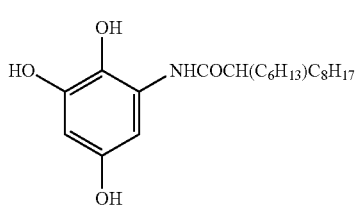

4-18 

4-19 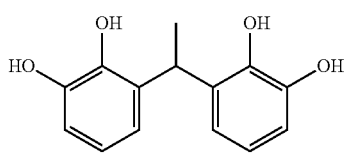

4-20 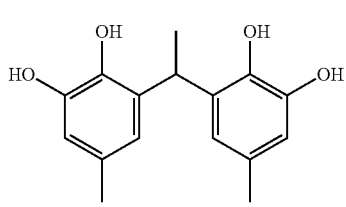

4-21 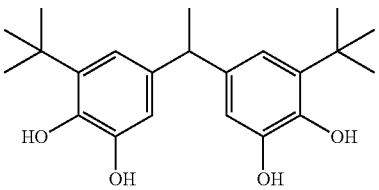

4-22 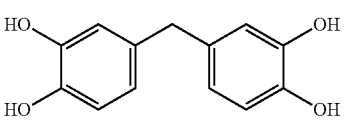

4-23 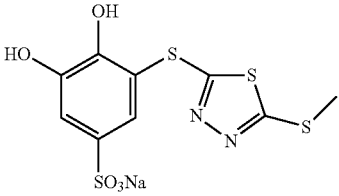

4-24 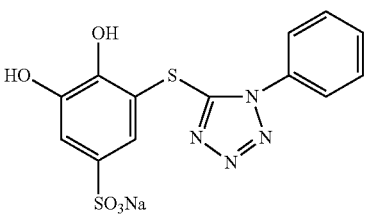

4-25 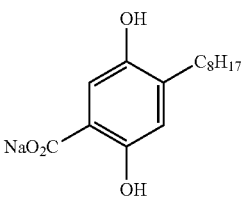

The compound represented by the above Formula (5) is an example in which P represents OH; Q represents $NR_2R_3$; Y represents $CR_6$; and n represents 2, in Formula (1).

$V_5$ in Formula (5) represents a hydrogen atom or a substituent.

The bonding form of the group represented by $V_5$ in Formula (5) represents that the group represented by $V_5$ in Formula (5) is bonded, in a number of an arbitrary number in the range of from 1 to 4 groups, at an arbitrary position, where substitution is possible, of the cyclic structure contained in Formula (5). Preferred examples of the group when $V_5$ represents a substituent include the substituents for the alkyl group represented by $R_2$ or $R_3$ in Formula (1) described above. When there exists a plurality of groups represented by $V_5$ in Formula (5), the respective groups may be the same as or different from each other, or may be bonded to each other to form a ring.

$R_{51}$ and $R_{52}$ each independently represent a hydrogen atom or a group that can be substituted on a nitrogen atom. Preferred examples of the group that can be substituted on a nitrogen atom include the groups exemplified for $R_2$ and $R_3$ of Formula (1) described above.

Specific examples of the compound represented by Formula (5) are shown below. However, the invention is not intended to be limited to these.

5-1 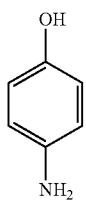 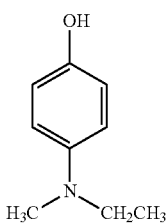
5-2 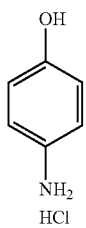 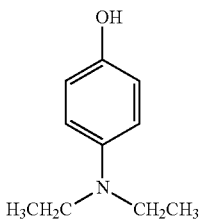 5-9
5-3 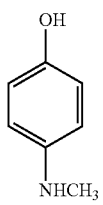 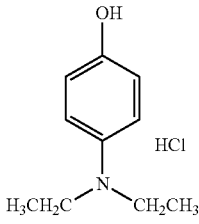 5-10
5-4 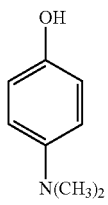 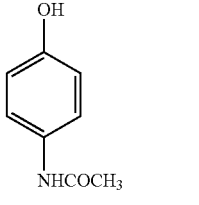 5-11
5-5 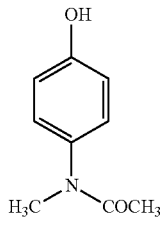 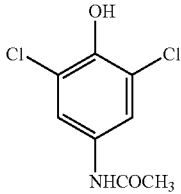 5-12
5-6 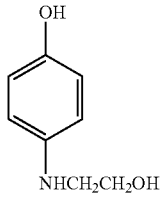 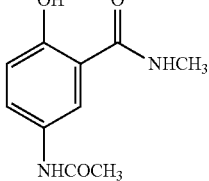 5-13
5-7 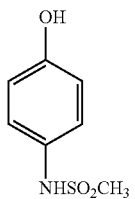 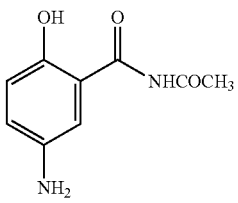 5-14

5-14 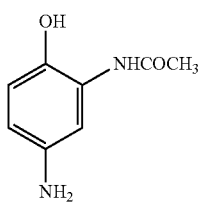
5-16 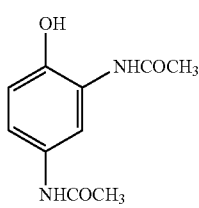
5-17 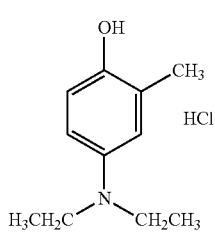
5-18 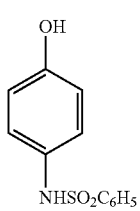
5-19 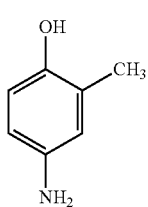
5-20 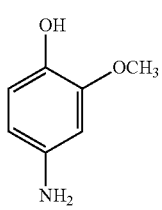
5-21 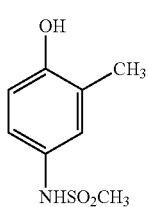
5-22 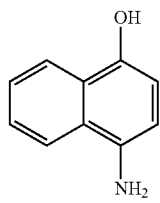
5-23 
5-24 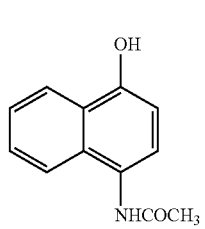
5-25 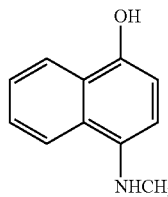
5-26 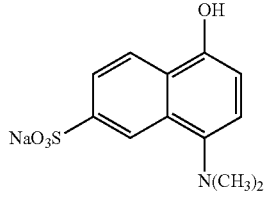
5-27 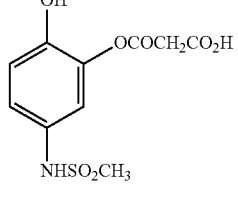
5-28 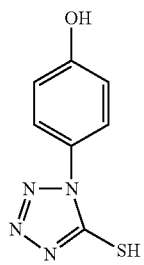

5-29

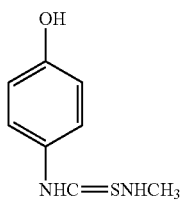

5-30

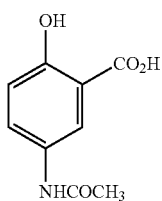

6-3

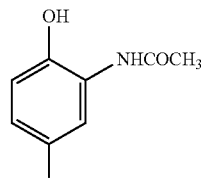

The compound represented by the above Formula (6) is an example in which P represents OH; Q represents $NR_2R_3$; Y represents $CR_6$; and n represents 1, in Formula (1).

$V_6$ in Formula (6) represents a hydrogen atom or a substituent.

The bonding form of the group represented by $V_6$ in Formula (6) represents that the group represented by $V_6$ in Formula (6) is bonded in a number of an arbitrary number in the range of from 1 to 4 groups, at an arbitrary position, where substitution is possible, of the cyclic structure contained in Formula (6). Preferred examples of the group when $V_6$ represents a substituent include the substituents for the alkyl group represented by $R_2$ or $R_3$ in Formula (1) described above. When there exists a plurality of groups represented by $V_6$ in Formula (6), the respective groups may be the same as or different from each other, or may be bonded to each other to form a ring.

$R_{61}$ and $R_{62}$ each independently represent a hydrogen atom or a group that can be substituted on a nitrogen atom. Preferred examples of the group that can be substituted on a nitrogen atom include the groups exemplified for $R_2$ and $R_3$ of Formula (1) described above.

Specific examples of the compound represented by Formula (6) are shown below. However, the invention is not intended to be limited to these.

6-1

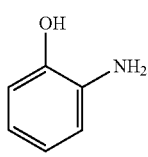

6-2

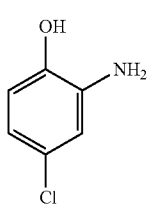

6-4

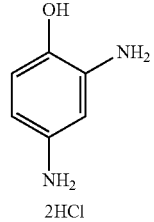

6-5

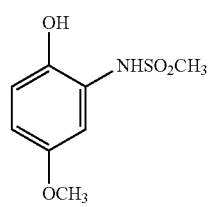

6-6

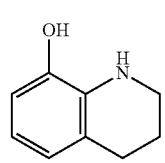

6-7

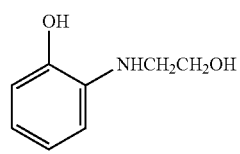

6-8

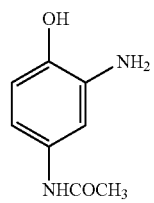

6-9

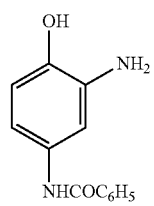

6-10

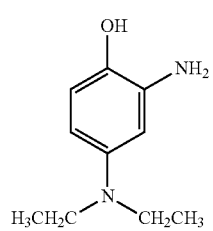

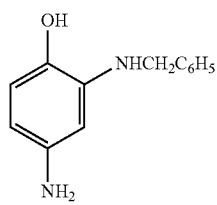
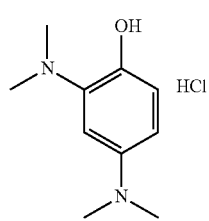
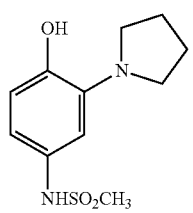
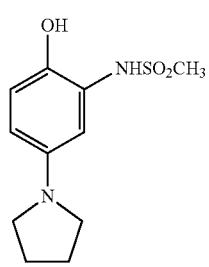
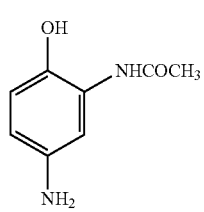
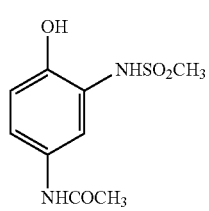
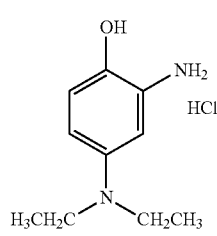
6-11
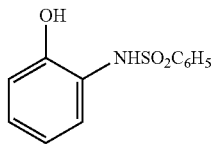
6-12
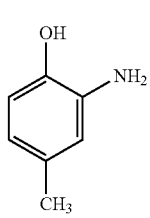
6-13
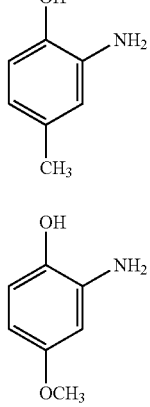
6-14
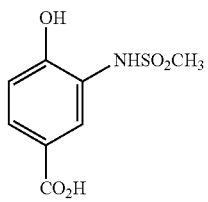
6-14
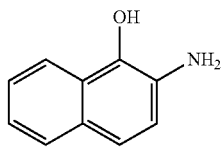
6-16
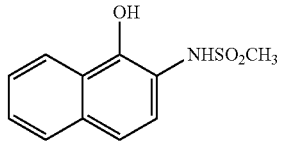
6-17
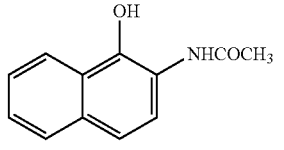
6-18
6-19
6-20
6-21
6-22
6-23
6-24
6-25
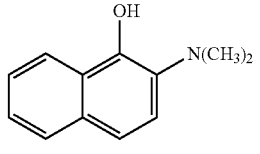
6-26
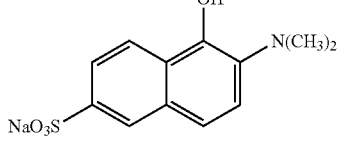

-continued 6-27

[Structure: phenol with NHSO₂CH₃ ortho and OCOCH₂CO₂H para]

6-28

[Structure: phenol with NHCOCH₃ and tetrazole-thiol substituent]

6-29

[Structure: phenol with NHCOCH₃ and NHC=SNHCH₃ substituent]

The compound represented by the above Formula (7) is an example in which P represents OH; Q represents $CHR_4R_5$; Y represents $CR_6$; and n represents 2, in Formula (1).

$V_7$ in Formula (7) represents a hydrogen atom or a substituent.

The bonding form of the group represented by $V_7$ in Formula (7) represents that the group represented by $V_7$ in Formula (7) is bonded, in a number of an arbitrary number in the range of from 1 to 4 groups, at an arbitrary position, where substitution is possible, of the cyclic structure contained in Formula (7). Preferred examples of the group when $V_7$ represents a substituent include the substituents for the alkyl group represented by $R_2$ or $R_3$ in Formula (1) described above. When there exists a plurality of groups represented by $V_7$ in Formula (7), the respective groups may be the same as or different from each other, or may be bonded to each other to form a ring.

$R_{71}$ and $R_{72}$ each independently represent a hydrogen atom or a substituent.

Examples of the substituent represented by $R_{71}$ or $R_{72}$ include the substituents for the alkyl group represented by $R_2$ or $R_3$ described above, and preferred examples thereof include an alkyl group, an alkenyl group, an alkynyl group, and an aryl group. Preferred examples of the respective groups include the examples for $R_2$ and $R_3$ described above.

When $R_{71}$ or $R_{72}$ represents a substituent, each of the groups may further have a substituent. Examples of the substituent include the substituents for the alkyl group represented by $R_2$ or $R_3$ of Formula (1) described above.

Specific examples of the compound represented by Formula (7) are shown below. However, the invention is not intended to be limited to these.

7-1

[4-methylphenol structure]

7-2

[4-ethylphenol structure]

7-3

[Structure: trihydroxy methylbenzene]

7-4

[Structure: phenol with OCH₃ and CH₃]

7-5

[Structure: trihydroxy ethylbenzene]

7-6

[Structure: phenol with NHSO₂CH₃ and CH₃]

7-7

[Structure: phenol with two NHSO₂CH₃ groups and CH₃]

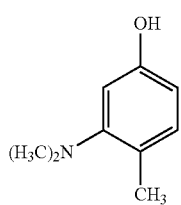
7-8
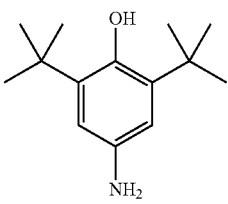
7-15
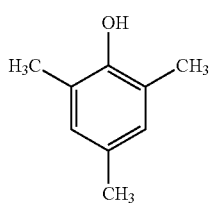
7-9
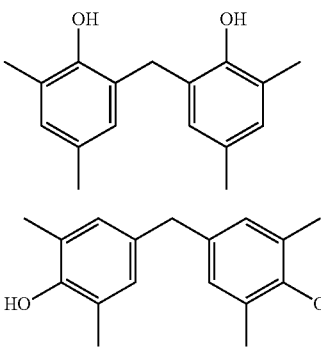
7-16
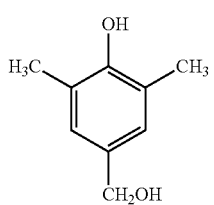
7-10
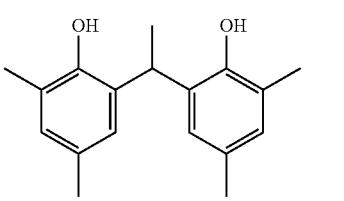
7-17
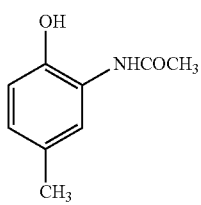
7-11
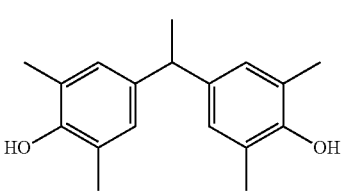
7-18
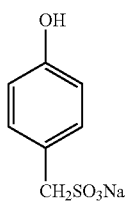
7-12
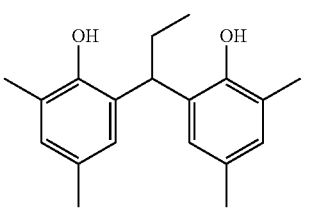
7-19
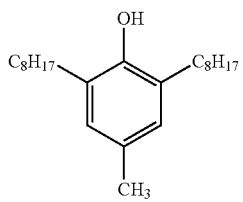
7-13
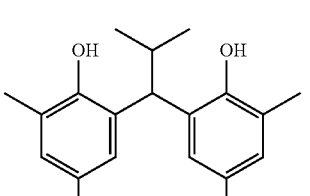
7-20
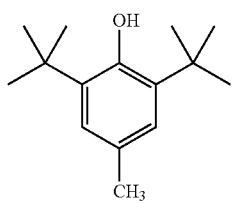
7-14
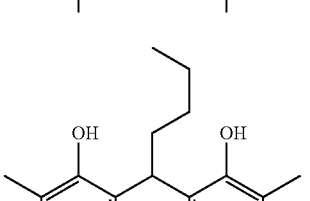
7-21
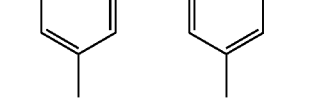
7-22

7-23

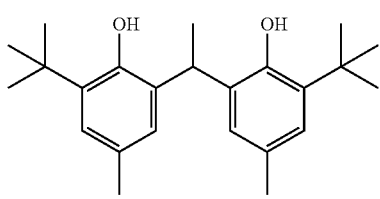

7-24

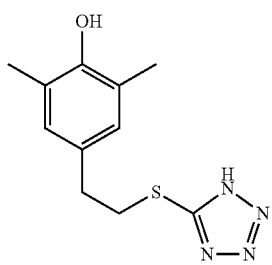

7-25

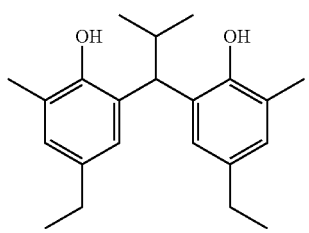

7-26

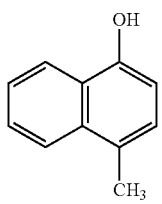

7-27

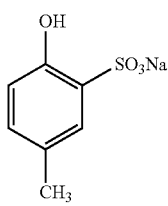

7-27

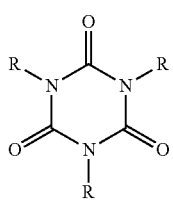

7-28

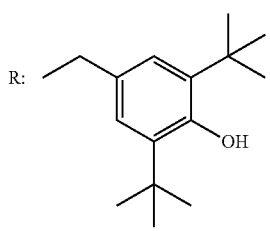

7-29

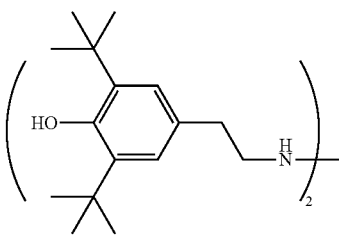

The compound represented by the above Formula (8) is an example in which P represents OH; Q represents $CHR_4R_5$; Y represents $CR_6$; and n represents 1, in Formula (1).

$V_8$ in Formula (8) represents a hydrogen atom or a substituent.

The bonding form of the group represented by $V_8$ in Formula (8) represents that the group represented by $V_8$ in Formula (8) is bonded, in a number of an arbitrary number in the range of from 1 to 4 groups, at an arbitrary position, where substitution is possible, of the cyclic structure contained in Formula (8). Preferred examples of the group when $V_8$ represents a substituent include the substituents for the alkyl group represented by $R_2$ or $R_3$ in Formula (1) described above. When there exists a plurality of groups represented by $V_8$ in Formula (8), the respective groups may be the same as or different from each other, or may be bonded to each other to form a ring.

$R_{81}$ and $R_{82}$ each independently represent a hydrogen atom or a substituent.

Examples of the substituent represented by $R_{81}$ or $R_{82}$ include the substituents for the alkyl group represented by $R_2$ or $R_3$ described above, and preferred examples thereof include an alkyl group, an alkenyl group, an alkynyl group, and an aryl group. Preferred examples of the respective groups include the examples for $R_2$ and $R_3$ described above.

When $R_{81}$ or $R_{82}$ represents a substituent, each of the groups may further have a substituent. Examples of the substituent include the substituents for the alkyl group represented by $R_2$ or $R_3$ of Formula (1) described above.

Specific examples of the compound represented by Formula (8) are shown below. However, the invention is not intended to be limited to these.

8-1

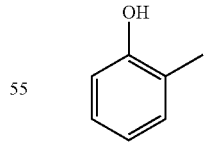

8-2

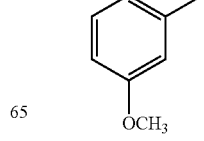

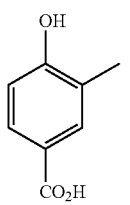
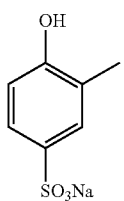
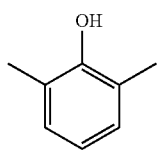
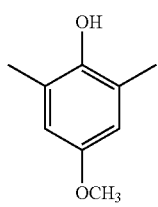
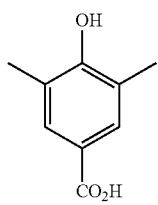
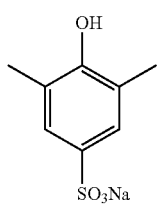
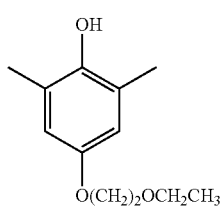
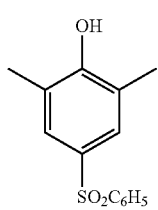
8-3
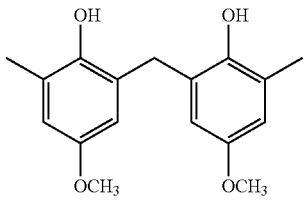
8-4
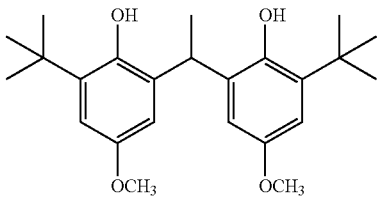
8-5
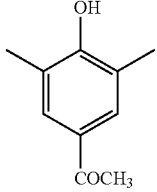
8-6
8-7
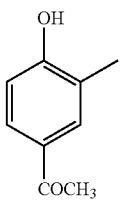
8-8
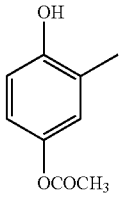
8-9
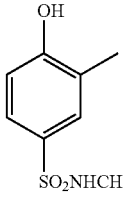
8-10
8-11
8-12
8-13
8-14
8-15
8-16
8-17
The compound represented by the above Formula (9) is an example in which P and Q each represent $NR_2R_3$; Y represents $CR_6$; and n represents 2, in Formula (1).
$V_9$ in Formula (9) represents a hydrogen atom or a substituent.
The bonding form of the group represented by $V_9$ in Formula (9) represents that the group represented by $V_9$ in Formula (9) is bonded, in a number of an arbitrary number in the range of from 1 to 4 groups, at an arbitrary position, where substitution is possible, of the cyclic structure contained in Formula (9). Preferred examples of the group when $V_9$ represents a substituent include the substituents for the alkyl group represented by $R_2$ or $R_3$ in Formula (1) described above. When there exists a plurality of groups represented by $V_9$ in Formula (9), the respective groups may be the same as or different from each other, or may be bonded to each other to form a ring.

$R_{91}$, $R_{92}$, $R_{93}$ and $R_{94}$ each independently represent a hydrogen atom or a group that can be substituted on a nitrogen atom. Preferred examples of the group that can be substituted on a nitrogen atom include the groups exemplified for $R_2$ and $R_3$ of Formula (1) described above.

Specific examples of the compound represented by Formula (9) are shown below. However, the invention is not intended to be limited to these.

9-1
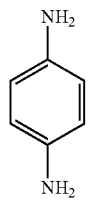

9-2
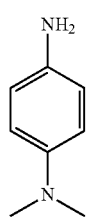

9-3
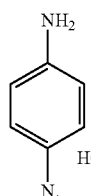

9-4
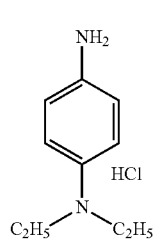

9-5
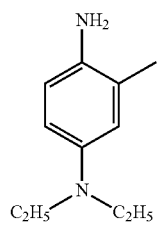

9-6
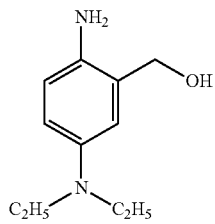

9-7
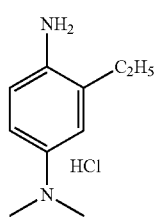

9-8
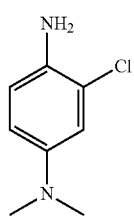

9-9
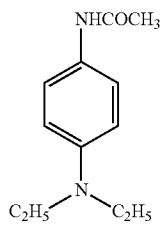

9-10
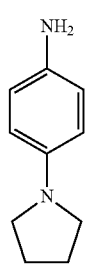

9-11
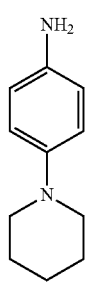

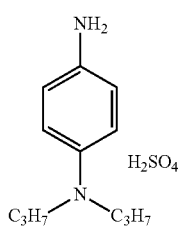
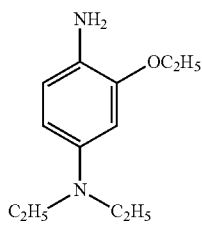
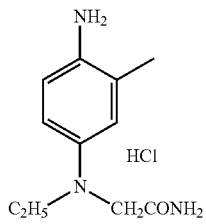
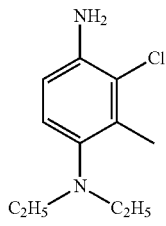
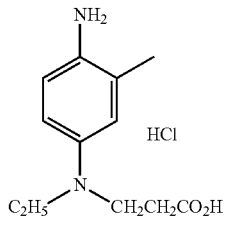
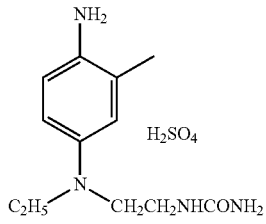
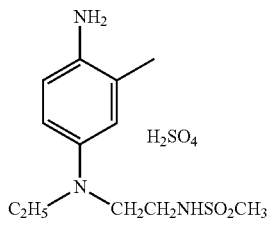
9-12
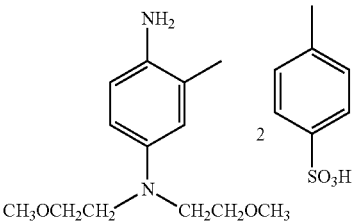
9-13
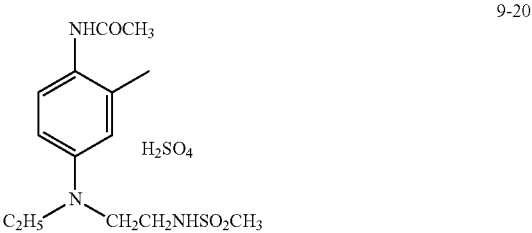
9-14
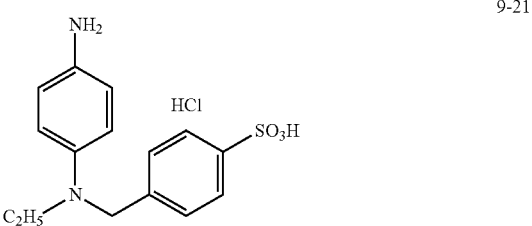
9-15
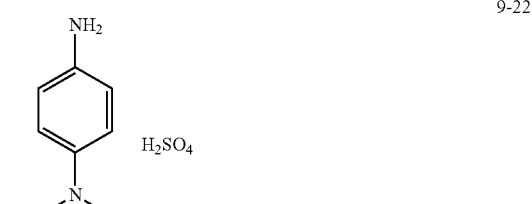
9-16
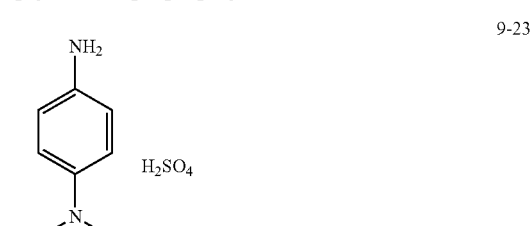
9-17
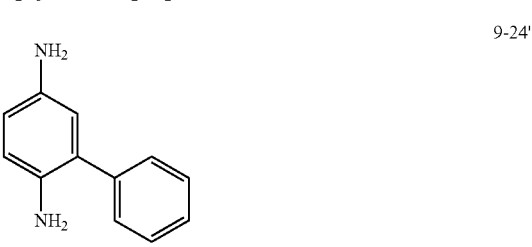
9-18
9-19
9-20
9-21
9-22
9-23
9-24'
9-25

9-26

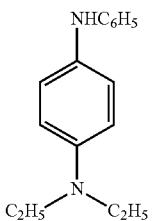

The compound represented by the above Formula (10) is an example in which P and Q each represent $NR_2R_3$; Y represents $CR_6$; and n represents 1, in Formula (1).

$V_{10}$ in Formula (10) represents a hydrogen atom or a substituent.

The bonding form of the group represented by $V_{10}$ in Formula (10) represents that the group represented by $V_{10}$ in Formula (10) is bonded, in a number of an arbitrary number in the range of from 1 to 4 groups, at an arbitrary position, where substitution is possible, of the cyclic structure contained in Formula (10). Preferred examples of the group when $V_{10}$ represents a substituent include the substituents for the alkyl group represented by $R_2$ or $R_3$ in Formula (1) described above. When there exists a plurality of groups represented by $V_{10}$ in Formula (10), the respective groups may be the same as or different from each other, or may be bonded to each other to form a ring.

$R_{101}$, $R_{102}$, $R_{103}$ and $R_{104}$ each independently represent a hydrogen atom or a group that can be substituted on a nitrogen atom. Preferred examples of the group that can be substituted on a nitrogen atom include the groups exemplified for $R_2$ and $R_3$ of Formula (1) described above.

Specific examples of the compound represented by Formula (10) are shown below. However, the invention is not intended to be limited to these.

10-1

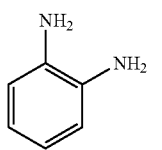

10-2

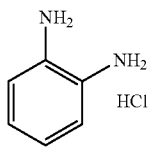

10-3

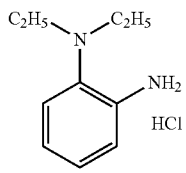

10-4

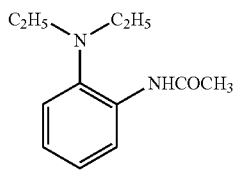

10-5

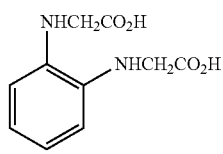

10-6

10-7

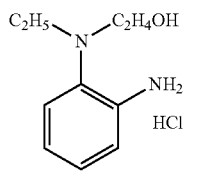

10-8

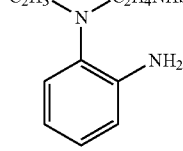

10-9

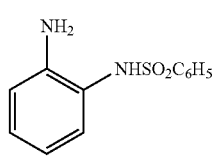

The compound represented by Formula (11) is an example in which P and Q each represent OH; Y represents $CR_6$; and n represents 1, in Formula (1).

$V_{11}$ in Formula (11) represents a hydrogen atom or a substituent.

The bonding form of the group represented by $V_{11}$ in Formula (11) represents that the group represented by $V_{11}$ in Formula (11) is bonded, in a number of an arbitrary number in the range of from 1 to 2 groups, at an arbitrary position, where substitution is possible, of the cyclic structure contained in Formula (11). Preferred examples of the group when $V_{11}$ represents a substituent include the substituents for the alkyl group represented by $R_2$ or $R_3$ in Formula (1) described above. When there exists a plurality of group represented by $V_{11}$ in Formula (11), the respective groups may be the same as or different from each other, or may be bonded to each other to form a ring.

Specific examples of the compound represented by Formula (11) are shown below. However, the invention is not intended to be limited to these.

11-1

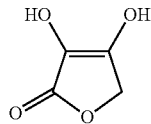

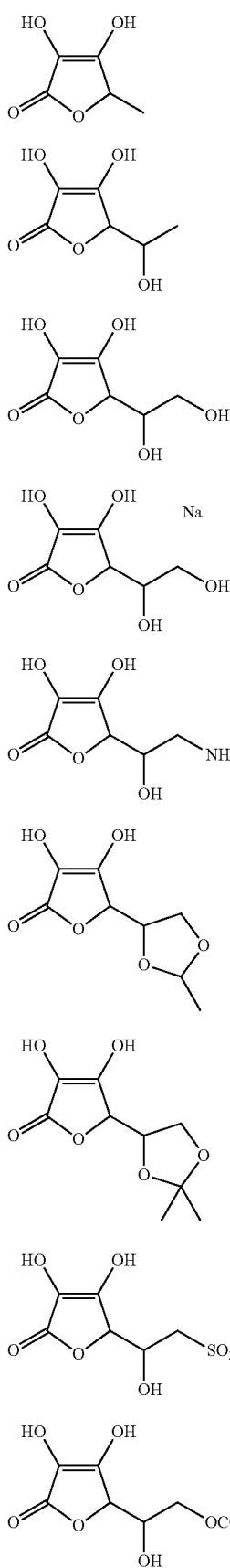
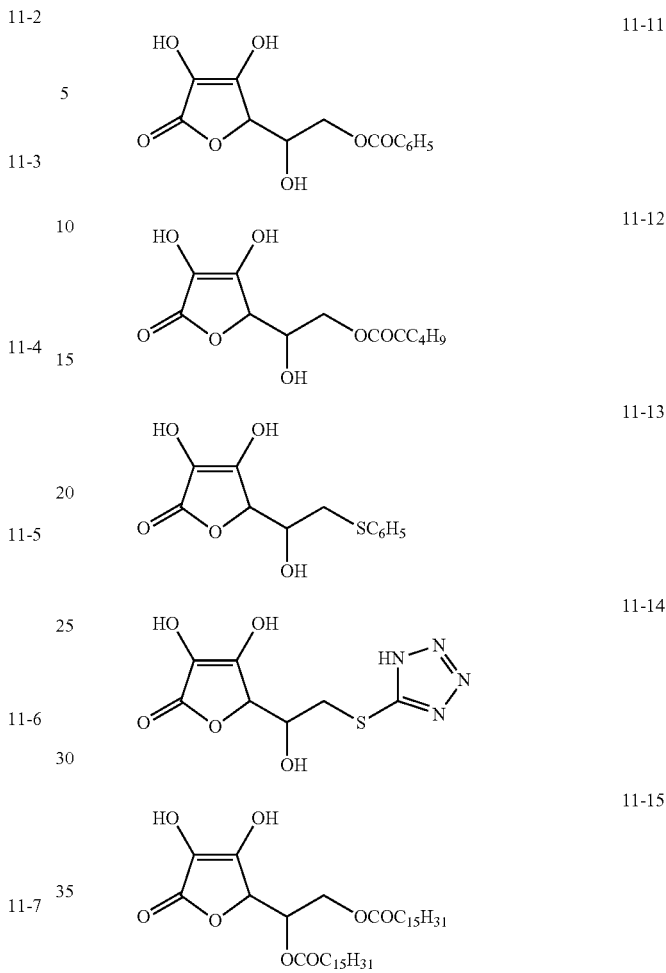

The compound represented by Formula (12) is an example in which P represents OH; Q represents $NR_2R_3$; Y represents $CR_6$; and n represents 1, in Formula (1).

$V_{12}$ in Formula (12) represents a hydrogen atom or a substituent.

The bonding form of the group represented by $V_{12}$ in Formula (12) represents that the group represented by $V_{12}$ in Formula (12) is bonded, in a number of an arbitrary number in the range of from 1 to 4 groups, at an arbitrary position, where substitution is possible, of the cyclic structure contained in Formula (12). Preferred examples of the group when $V_{12}$ represents a substituent include the substituents for the alkyl group represented by $R_2$ or $R_3$ in Formula (1) described above. When there exists a plurality of groups represented by $V_{12}$ in Formula (12), the respective groups may be the same as or different from each other, or may be bonded to each other to form a ring.

$R_{121}$ and $R_{122}$ each independently represent a hydrogen atom or a group that can be substituted on a nitrogen atom. Preferred examples of the group that can be substituted on a nitrogen atom include the groups exemplified for $R_2$ and $R_3$ of Formula (1) described above.

Specific examples of the compound represented by Formula (12) are shown below. However, the invention is not intended to be limited to these.

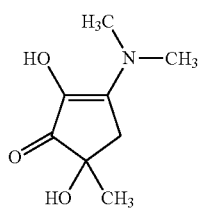
12-1

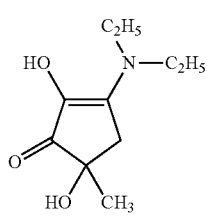
12-2

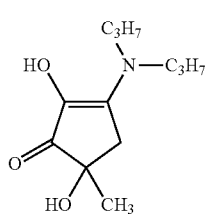
12-3

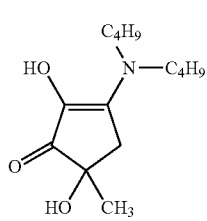
12-4

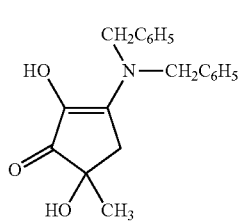
12-5

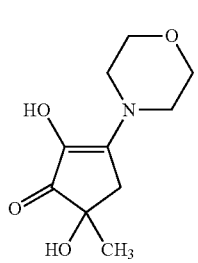
12-6

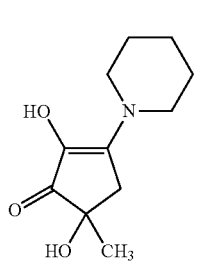
12-7

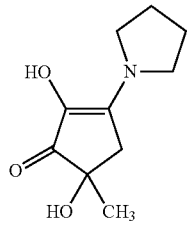
12-8

12-9

12-10

The compound represented by Formula (13) is an example in which P and Q each represent $NR_2R_3$; and n represents 0, in Formula (1).

$V_{13}$ in Formula (13) represents a hydrogen atom or a substituent.

The bonding form of the group represented by $V_{13}$ in Formula (13) represents that the group represented by $V_{13}$ in Formula (13) is bonded, in a number of an arbitrary number in the range of from 1 to 4 groups, at an arbitrary position, where substitution is possible, of the cyclic structure contained in Formula (13). Preferred examples of the group when $V_{13}$ represents a substituent include the substituents for the alkyl group represented by $R_2$ or $R_3$ in Formula (1) described above. When there exists a plurality of groups represented by $V_{13}$ in Formula (13), the respective groups may be the same as or different from each other, or may be bonded to each other to form a ring.

$R_{131}$ and $R_{132}$ each independently represent a hydrogen atom or a group that can be substituted on a nitrogen atom. Preferred examples of the group that can be substituted on a nitrogen atom include the groups exemplified for $R_2$ and $R_3$ of Formula (1) described above.

Specific examples of the compound represented by Formula (13) are shown below. However, the invention is not intended to be limited to these.

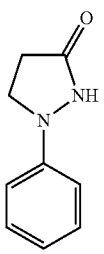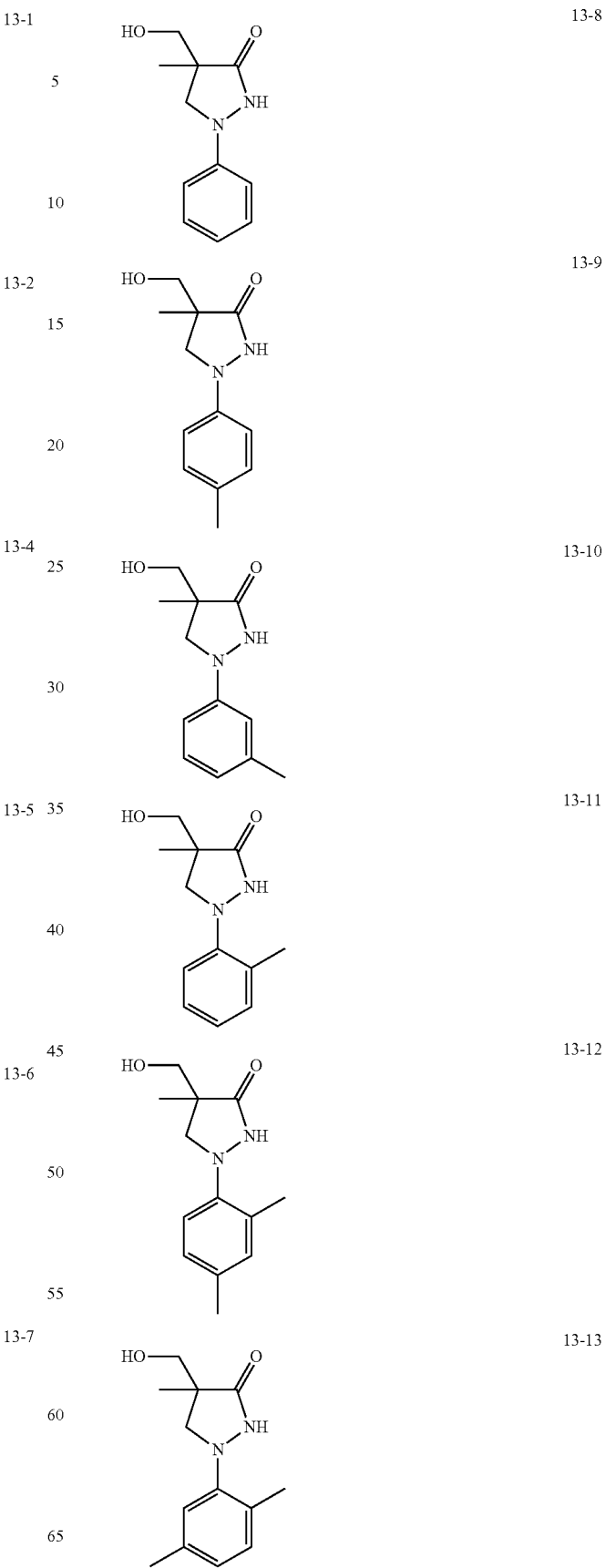

13-14 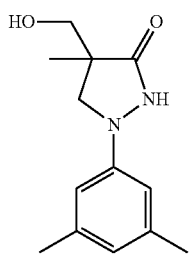
13-15 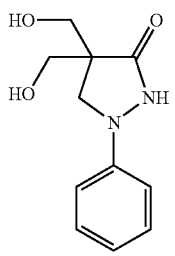
13-16 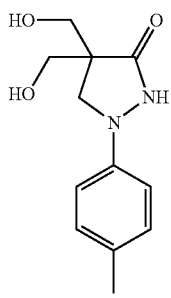
13-17 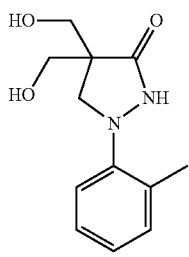
13-18 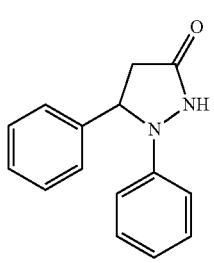
13-19 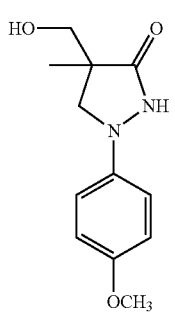
13-20 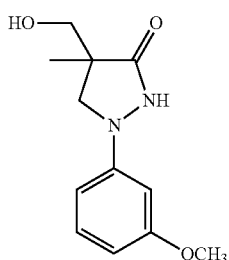
13-21 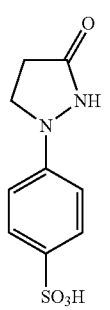
13-22 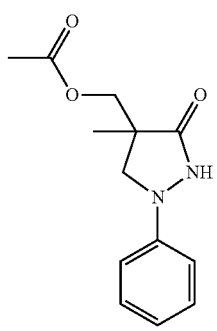
12-23 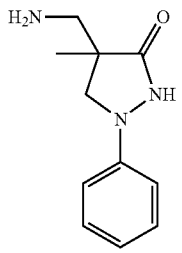
13-24 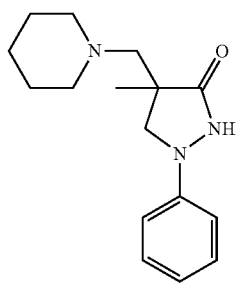

13-25

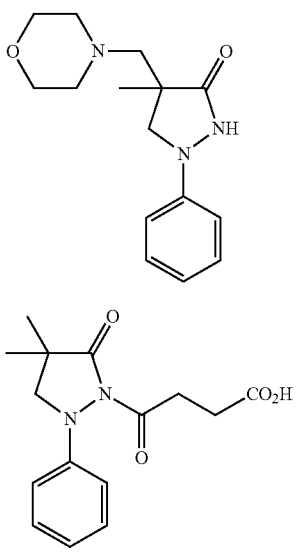

13-26

The compound represented by Formula (14) is an example in which P and Q each represent $NR_2R_3$; and n represents 0, in Formula (1).

$V_{14}$ in Formula (14) represents a hydrogen atom or a substituent.

The bonding form of the group represented by $V_{14}$ in Formula (14) represents that the group represented by $V_{14}$ in Formula (14) is bonded, in a number of an arbitrary number in the range of from 1 to 2 groups, at an arbitrary position, where substitution is possible, of the cyclic structure contained in Formula (14). Preferred examples of the group when $V_{14}$ represents a substituent include the substituents for the alkyl group represented by $R_2$ or $R_3$ in Formula (1) described above. When there exists a plurality of groups represented by $V_{14}$ in Formula (14), the respective groups may be the same as or different from each other, or may be bonded to each other to form a ring.

$R_{141}$, $R_{142}$ and $R_{143}$ each independently represent a hydrogen atom or a group that can be substituted on a nitrogen atom. Preferred examples of the group that can be substituted on a nitrogen atom include the groups exemplified for $R_2$ and $R_3$ of Formula (1) described above.

Specific examples of the compound represented by Formula (14) are shown below. However, the invention is not intended to be limited to these.

14-1

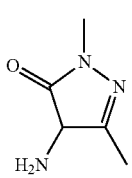

14-2

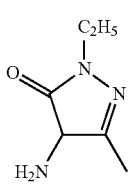

14-3

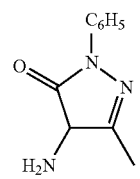

14-4

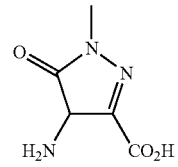

14-5

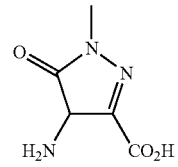

14-6

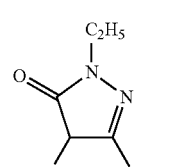

14-7

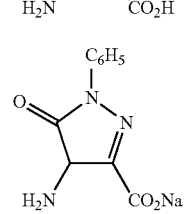

14-8

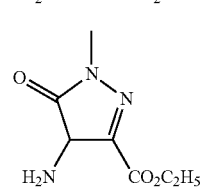

14-9

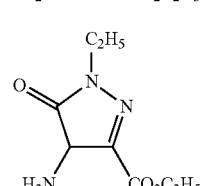

14-10

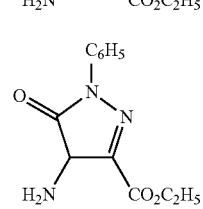

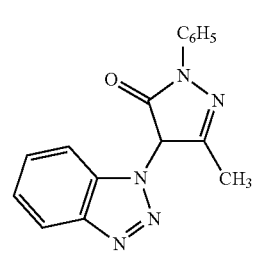

The compound represented by Formula (15) is an example in which P and Q each represent OH; Y represents $CR_6$ and a nitrogen atom; and n represents 3, in Formula (1).

$V_{15}$ in Formula (15) represents a hydrogen atom or a substituent.

The bonding form of the group represented by $V_{15}$ in Formula (15) represents that the group represented by $V_{15}$ in Formula (15) is bonded, in a number of an arbitrary number in the range of from 1 to 4 groups, at an arbitrary position, where substitution is possible, of the cyclic structure contained in Formula (15). Preferred examples of the group when $V_{15}$ represents a substituent include the substituents for the alkyl group represented by $R_2$ or $R_3$ in Formula (1) described above. When there exists a plurality of groups represented by $V_{15}$ in Formula (15), the respective groups may be the same as or different from each other, or may be bonded to each other to form a ring.

$R_{151}$ represents a hydrogen atom or a substituent.

Examples of the substituent represented by $R_{151}$ include the substituents for the alkyl group represented by $R_2$ and $R_3$ described above, and preferred examples thereof include an alkyl group, an alkenyl group, an alkynyl group, and an aryl group. Preferred examples of the respective groups include the examples for $R_2$ and $R_3$ described above.

When $R_{151}$ represents a substituent, $R_{151}$ may further have a substituent. Examples of the substituent include the substituents for the alkyl group represented by $R_2$ or $R_3$ of Formula (1) described above.

Specific examples of the compound represented by Formula (15) are shown below. However, the invention is not intended to be limited to these.

15-1
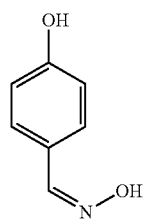

15-2
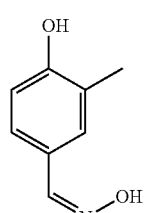

15-3
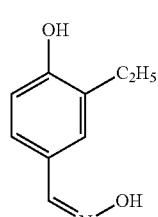

15-4
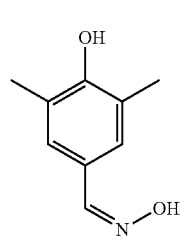

-continued 15-5
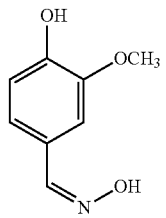

15-6
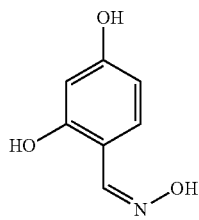

15-7
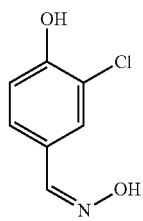

15-8
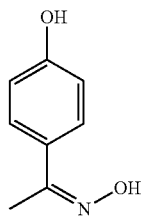

15-9
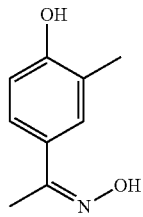

15-10
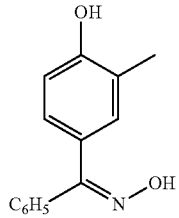

15-11
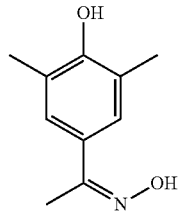

-continued 15-12 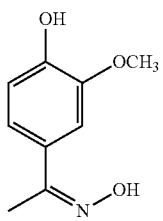

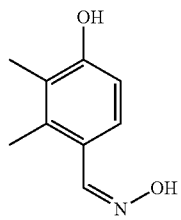

15-19

15-13 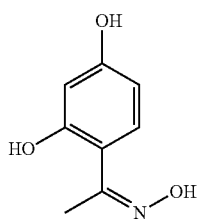

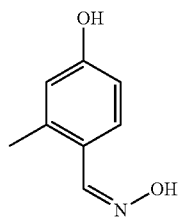

15-20

15-14

15-15 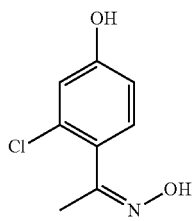

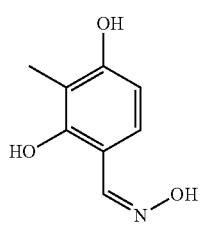

15-21

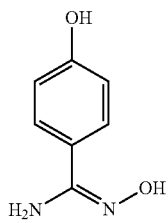

The compound represented by Formula (16) is an example in which P and Q each represent OH; Y represents $CR_6$ and a nitrogen atom; and n represents 2, in Formula (1).

$V_{16}$ in Formula (16) represents a hydrogen atom or a substituent.

15-16 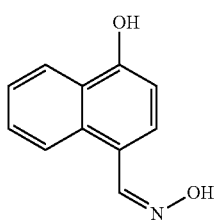

The bonding form of the group represented by $V_{16}$ in Formula (16) represents that the group represented by $V_{16}$ in Formula (16) is bonded, in a number of an arbitrary number in the range of from 1 to 4 groups, at an arbitrary position, where substitution is possible, of the cyclic structure contained in Formula (16). Preferred examples of the group when $V_{16}$ represents a substituent include the substituents for the alkyl group represented by $R_2$ or $R_3$ in Formula (1) described above. When there exists a plurality of groups represented by $V_{16}$ in Formula (16), the respective groups may be the same as or different from each other, or may be bonded to each other to form a ring.

15-17 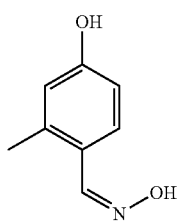

$R_{161}$ represents a hydrogen atom or a substituent.

Examples of the substituent represented by $R_{161}$ include the substituents for the alkyl group represented by $R_2$ and $R_3$ described above, and preferred examples thereof include an alkyl group, an alkenyl group, an alkynyl group, and an aryl group. Preferred examples of the respective groups include the examples for $R_2$ and $R_3$ described above.

15-18 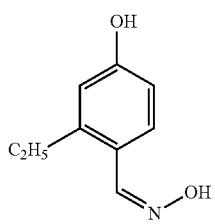

When $R_{161}$ represents a substituent, $R_{161}$ may further have a substituent. Examples of the substituent include the substituents for the alkyl group represented by $R_2$ or $R_3$ of Formula (1) described above.

Specific examples of the compound represented by Formula (16) are shown below. However, the invention is not intended to be limited to these.

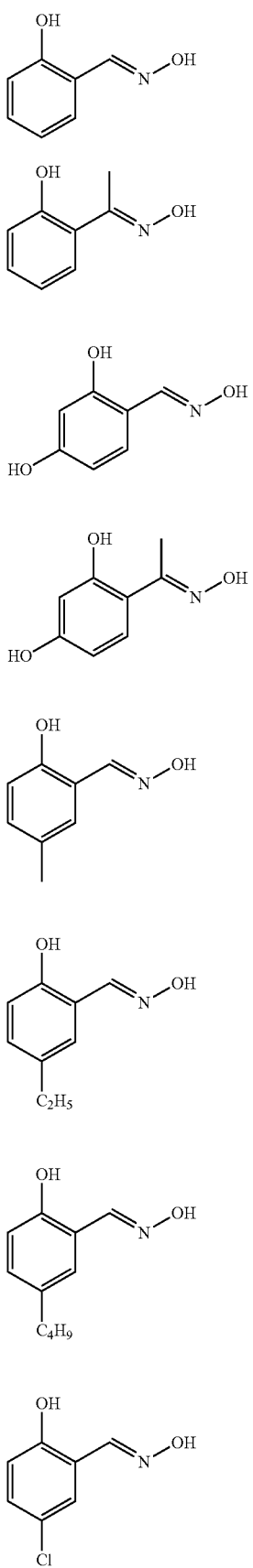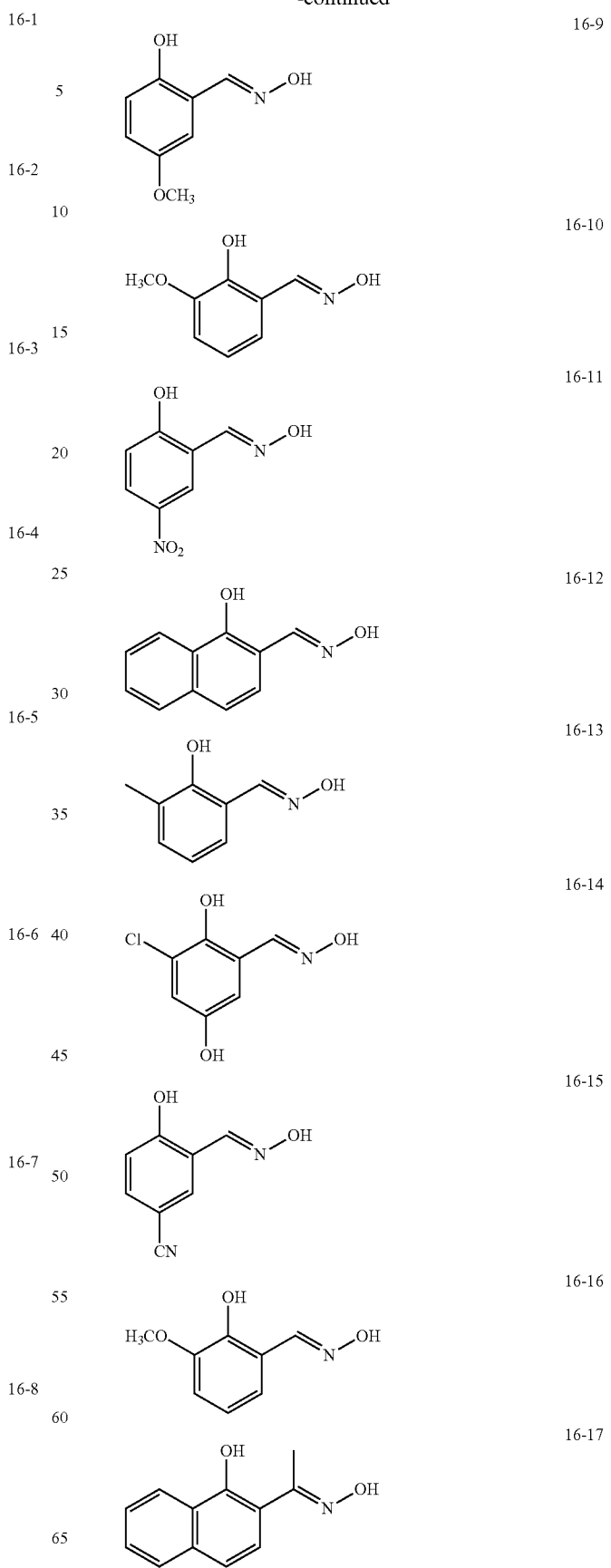

-continued

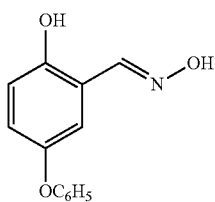
16-18

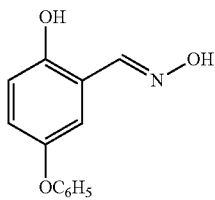
16-19

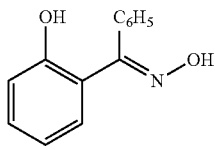
16-20

The compound represented by Formula (17) is an example in which P and Q each represent $NR_2R_3$; and n represents 0, in Formula (1).

$R_{171}$, $R_{172}$, $R_{173}$ and $R_{174}$ in Formula (17) each independently represent a hydrogen atom or a group that can be substituted on a nitrogen atom.

Preferred examples of the group that can be substituted on a nitrogen atom include the groups exemplified for $R_2$ and $R_3$ of Formula (1) described above.

Specific examples of the compound represented by Formula (17) are shown below. However, the invention is not intended to be limited to these.

$NH_2NH_2$    17-1

$NH_2NH_2$   HCl    17-2

17-3

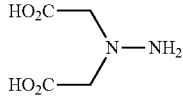

$CH_3NH-NHCH_3$    17-4

$C_2H_5HN-NHC_2H_5$    17-5

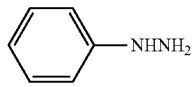
17-6

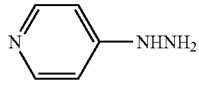
17-7

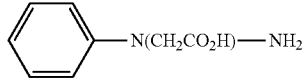
17-8

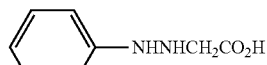
17-9

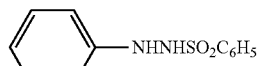
17-10

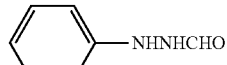
17-11

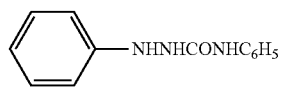
17-12

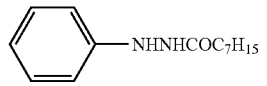
17-13

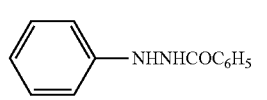
17-14

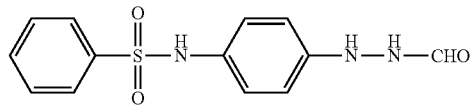
17-15

Among the compounds represented by Formula (1) and Formula (2), compounds represented by Formula (1) are preferred. Among the compounds represented by Formula (1), compounds represented by Formula (3) to Formula (17) are preferred; and compounds represented by Formula (3), Formula (4), Formula (7), Formula (8), Formula (11), Formula (12), Formula (13) or Formula (14) are more preferred, and compounds represented by Formula (11) or Formula (12) are particularly preferred.

As the method for producing a compound represented by Formula (1) or (2), any known method can be used. The conditions such as the temperature at the time of producing these compounds, selection of the solvent, and the kinds and amounts of reaction reagents can be easily set by those ordinarily skilled in the art and can be experimentally determined. Thus, a person skilled in the art can easily produce those compounds.

The amount of addition of the compound represented by Formula (1) or (2) is from 0.1% by mass to 1000% by mass, with respect to the metal conductive fibers. When the amount of addition is in the above range, a conductive composition with which a conductive layer having high conductivity and transparency is obtained even if the composition is stored under conditions such as high temperature conditions, high humidity conditions or the presence of ozone. That is, when the amount of addition is less than 0.1%, the effects of the invention are not sufficiently exhibited, and when the amount of addition is more than 1000%, there is a case that inhibition of conductivity occurs, or that transparency is deteriorated due to a problem with solubility in the coating liquid, thus is not preferable. From the viewpoint of achieving both the basic characteristics such as conductivity and transparency that are required in a transparent conductive material, and resistance properties in a high temperature and high humidity environment, the amount of addition is preferably from 0.1% by mass to 100% by mass, more preferably from 1% by mass to 50% by mass, and particularly preferably from 2% by mass to 30% by mass.

The method for adding the compound represented by Formula (1) or (2) into the conductive layer can be selected from an arbitrary method that can be carried out. Preferred examples thereof include a method of adding the compound represented by Formula (1) or (2) into a conductive composition; a method of forming, on a base material, a layer containing metal conductive fibers in advance, and immersing the layer into a solution containing the compound represented by Formula (1) or (2); and a method of adding the compound represented by Formula (1) or (2) in advance into a separate layer other than the conductive layer, and introducing the compound into the conductive layer by diffusing the compound from the separate layer into the conductive layer at the time of coating and drying of the conductive layer is applied and dried.

More preferred examples thereof include a method of adding the compound represented by Formula (1) or (2) into a conductive composition; and a method of forming, on a base material, a layer containing metal conductive fibers in advance, and immersing the layer into a solution containing the compound represented by Formula (1) or (2). A particularly preferred examples thereof include a method adding the compound represented by Formula (1) or (2) into a conductive composition.

There is a case that a method of adding the compound represented by Formula (1) or (2) in advance at the time of producing metal conductive fibers adversely affects the control of the form of the metal conductive fibers, and most of the compounds are removed during the washing process after the formation of the metal conductive fibers, and as a result of which, the amount becomes smaller than the amount required to exhibit the effects according to the invention so that a shortfall thereof needs to be replenished again; thus is not efficient.

The conductive composition according to the invention is provided on a base material to serve as a conductive layer. As the conductive layer contains the compound represented by Formula (1) or Formula (2) described above, a distinct and unexpected effect of suppressing the decrease in conductivity that occurs when the conductive layer is exposed for a long time to harsh conditions such as high temperature conditions, high humidity conditions or the presence of ozone is exerted.

The detailed mechanism of the effect described above has not been fully revealed. However, the compound represented by Formula (1) is an organic compound exhibiting reducing properties that are known to follow the Kendal-Pelz rule, or a reducing organic compound that is known as a main developer agent for a thermally developing photographic sensitive material. The general structural formula of the compound is illustrated in, for example, T. H. James, "The Theory of the Photographic Process", 4th ed., Macmillan Publishing Co., Inc., p. 299; and U.S. Pat. No. 4,845,019, column 12, lines 22 to 34. Representative compounds are illustrated in T. H. James, "The Theory of the Photographic Process", 4th ed., Macmillan Publishing Co., Inc., pp. 298-327; Japanese Patent No. 2788831, p. 6; Japanese Patent No. 2890055, pp. 1-4; Japanese Patent No. 4727637, pp. 12-15; and the like. Furthermore, the compound represented by Formula (2) is an aldehyde compound or a precursor thereof, and is a compound exhibiting reducing properties.

It is assumed that, when the compound represented by Formula (1) or Formula (2) exhibiting reducing properties exists in a certain amount or more in the vicinity of the metal conductive fibers, the compound reacts with chemical species that cause oxidation of the metal conductive fibers, such as oxygen, ozone and peroxides, prior to the metal conductive fibers, under conditions such as high temperature conditions, high humidity conditions or the presence of ozone, so that the compound itself is oxidized, and thus the decomposition of the metal conductive fibers induced by oxidation is suppressed, and as a result of which, a decrease in conductivity is suppressed.

It is assumed that due to such a mechanism, when the compound represented by Formula (1) or Formula (2) is contained in an amount of 0.1% by mass or more with respect to the metal conductive fibers, the effect according to the invention such as described above is exhibited.

Furthermore, in the invention, from the viewpoint of enhancing durability of the metal conductive fibers under high temperature conditions or high humidity conditions, or in the presence of ozone, which is the effect of the invention, among the compounds represented by Formula (1) and Formula (2), a compound represented by Formula (1) is preferably selected. Furthermore, among the compounds represented by Formula (1), compounds represented by Formula (3) to Formula (17) are preferably selected; and compounds represented by Formula (3), Formula (4), Formula (7), Formula (8), Formula (11), Formula (12), Formula (13) or Formula (14) are more preferably selected; and a compound represented by Formula (11) or Formula (12) is particularly preferably selected. The compounds of Formula (1) to Formula (17) all exhibit the effect of the invention by exhibiting reducing properties. However, in addition to reducing properties, the extent of exhibition of the effect is also influenced by factors such as stability of the compounds, affinity or adsorbability to the metal conductive fibers, compatibility with the binder, dissolubility in the solvent, and resistance to bleed out at the time of drying of the conductive composition, thus, it is assumed that in a preferable compound, these factors are combined to preferably exhibit the effect.

(Compound Capable of Adsorbing to Metal, or Compound Capable of Coordinating with Metal Ion)

It is preferable that the conductive composition according to the invention further contain c) a compound capable of adsorbing to a metal, or a compound capable of coordinating with a metal ion. The compound capable of adsorbing to a metal or the compound capable of coordinating with a metal ion is not particular limited, and can be appropriately selected according to the purpose; however, suitable examples thereof include azole compounds (benzotriazole, 4-methylbenzotriazole, 5-methylbenzotriazole, 4-ethylbenzotriazole, 5,6-dimethylbenzotriazole, tolyltriazole, benzyltriazole, 5,6-dimethylbenzimidazole, thiadiazole, tetrazole, and the like), triazine compounds, ammonium compounds, phosphonium compounds, mercapto compounds (2-mercaptobenzoxazole, 2-mercaptobenzothiazole, 2-mercaptotetrazole, 2-mercaptopyrimidine or 2-mercaptobenzimidazole, dithiothiadiazole, alkyldithiothiadiazole, alkylthiol, and the like), sulfide compounds, and disulfide compounds.

These compounds capable of adsorbing to a metal or compounds capable of coordinating with a metal ion can further enhance the effect of the invention by adsorbing to a metal surface or forming a complex to form a coating film, and thereby preventing corrosion or exhibiting an anti-rusting effect.

The method for adding a compound capable of adsorbing to a metal or a compound capable of coordinating with a metal ion can be selected from any methods; and, for example, the compound may be added alone, or as a solution in which the compound is dissolved or dispersed in an appropriate solvent, into a composition for conductive layer formation, or a conductive layer that has been produced may be immersed in a solution of a compound capable of adsorbing to a metal or a compound capable of coordinating with a metal ion.

A preferred amount of addition of the compound capable of adsorbing to a metal or the compound capable of coordinating with a metal ion is preferably from 0.1% to 100%, more preferably from 1% to 50%, and particularly preferably from 2% to 25%, with respect to the mass of the metal conductive fibers. When the amount of addition is adjusted to from 0.1% to 100%, corrosion of the metal conductive fibers or the occurrence of rusting is effectively prevented, while high conductivity is maintained.

When the conductive composition according to the invention is prepared into a coating liquid containing a solvent, and the coating liquid is applied onto a surface of a base material to form a conductive layer, whereby a conductive member can be obtained.

(Conductive Composition-Coating Liquid)

The conductive composition according to the invention preferably contains a solvent for formation onto a preferable base material by application. In the production of metal conductive fibers, when an aqueous dispersion liquid in which metal conductive fibers are dispersed in an aqueous medium is prepared using water as a solvent, the compound represented by Formula (1) or Formula (2) described above may be incorporated into the aqueous dispersion liquid in an amount in the range of from 0.1% by mass to 1000% by mass with respect to the metal conductive fibers.

When a solvent which is different from the solvent used in the production of the metal conductive fibers (for example, water), for example, an organic solvent such as propylene glycol monomethyl ether, propylene glycol monomethyl ether acetate, or the like is preferred as a solvent for the conductive composition-coating liquid, the compound represented by Formula (1) or Formula (2) described above may be incorporated in an amount in the range of from 0.1% by mass to 1000% by mass with respect to the metal conductive fibers, after carrying out solvent replacement of replacing a part of or entire solvent used in the production of the metal conductive fibers (for example, water) with a preferable solvent (for example, propylene glycol monomethyl ether acetate).

In this manner, the conductive composition-coating liquid in the invention can be prepared. Examples of the solvent for a coating liquid include the solvents described above, and further examples thereof include alcohol-based solvents such as methanol, ethanol, 1-propanol, 2-propanol, butanol, 1-methoxy-2-propanol, and 3-methoxybutanol; ketone-based solvents such as acetone, methyl ethyl ketone, methyl isobutyl ketone, and cyclohexanone; ester-based solvents such as methyl acetate, ethyl acetate, propyl acetate, isopropyl acetate, butyl acetate, ethyl 3-ethoxypropionate, methyl 3-methoxypropionate, ethyl lactate, γ-butyrolactone, and propylene carbonate; amide-based solvents such as N-methyl-2-pyrrolidinone and N-ethyl-2-pyrrolidinone; benzene-based solvents such as toluene and xylene; and mixture solvents thereof.

The concentration of the metal conductive fibers in the coating liquid described above is appropriately selected in the range of from 0.001% by mass to 50% by mass, according to the preferable thickness of the conductive layer.

(Conductive Member)

The conductive member of the invention has, on a base material, a conductive layer containing at least: a) metal conductive fibers having an average minor axis length of from 1 nm to 150 nm, and b) a compound represented by Formula (1) or Formula (2).

The conductive layer may be provided directly on the base material, or may be provided on a single or a plurality of other layers such as an undercoat layer, an intermediate layer, a cushion layer, or the like that is provided on the base material. Furthermore, other layers such as a surface protective layer, a hard coat layer, an oxygen barrier layer, and an antistatic layer may be further provided on the conductive layer.

(Base Material)

As the base material, there are no particular limitations on the shape, structure, size and the like as long as the base material is capable of carrying the conductive layer, and the base material can be appropriately selected according to the purpose. Examples of the shape include a plate shape, a film shape, and a sheet shape. Examples of the structure include a single layer structure and a layered structure. The base material may be transparent or may be opaque.

The material of the base material is not particularly limited, and can be appropriately selected according to the purpose. Examples thereof include a transparent glass substrate, a sheet (film) made of a synthetic resin, a metal substrate, a ceramic plate, and a silicon wafer that is used in semiconductor substrates.

Examples of the transparent glass substrate include super white glass, blue sheet glass, and silica coated blue sheet glass. Also, a thin layer glass base material having a thickness of from 10 μm to several hundred micrometers (μm), which has been developed in recent years, may also be used.

Examples of the sheet made of a synthetic resin include a polyethylene terephthalate (PET) sheet, a polycarbonate sheet, a triacetyl cellulose (TAC) sheet, a polyether sulfone sheet, a polyester sheet, an acrylic resin sheet, a vinyl chloride resin sheet, an aromatic polyamide resin sheet, a polyamide-imide sheet, and a polyimide sheet.

Examples of the metal substrate include an aluminum plate, a copper plate, a nickel plate, and a stainless steel plate.

The base material can be optionally subjected to a pretreatment such as a chemical treatment with a silane coupling agent or the like, a plasma treatment, ion plating, sputtering, a vapor phase reaction method, or vacuum deposition.

The average thickness of the base material is not particularly limited, and can be appropriately selected according to the purpose. Generally, the average thickness is preferably selected in the range of from 1 μm to 500 μm, more preferably from 3 μm to 400 μm, and particularly preferably from 5 μm to 300 μm. When the average thickness of the base material is adjusted to 1 μm or greater, handling of the conductive member is easier, and when the average thickness is adjusted to 500 μm or less, adequate flexibility of the base material is obtained, handling is easier, and even in a case in which the conductive member is used as a transfer type conductive member, transfer uniformity is easily secured.

When transparency is required in the conductive member, a base material having a total visible light transmittance of 70% or higher is preferred, a base material having a total visible light transmittance of 85% or higher is more preferred, and a base material having a total visible light transmittance of 90% or higher is particularly preferred.

In the invention, a base material that has been colored to the extent that the purpose of the invention is not impaired can also be used as the base material.

(Conductive Layer)

The conductive layer according to the invention contains: a) metal conductive fibers having an average minor axis length of from 1 nm to 150 nm, and b) a compound represented by Formula (1) or Formula (2).

The average thickness of the conductive layer in the invention is preferably from 0.01 μm to 2 μm, more preferably from 0.02 µm to 1 µm, even more preferably from 0.03 µm to 0.8 µm, and particularly preferably from 0.05 µm to 0.5 µm. When the average thickness of the conductive layer is 0.01 µm or greater, it is more likely to achieve a conductive layer having sufficient durability or film strength, and in-plane distribution of conductivity becomes uniform. Furthermore, when the average thickness of the conductive layer is set to 2 µm or less, a conductive layer having high transmittance and high transparency can be easily obtained.

As the method for forming a conductive layer on a base material, a general coating method can be carried out using the conductive composition-coating liquid described above. The method is not particularly limited and can be appropriately selected according to the purpose. Examples thereof include a roll coating method, a bar coating method, a dip coating method, a spin coating method, a casting method, a die coating method, a blade coating method, a gravure coating method, a curtain coating method, a spray coating method, and a doctor coating method.

In the conductive layer according to the invention, another conductive material, for example, conductive fine particles, can be used in combination in addition to the metal conductive fibers as long as the other conductive material does not impair the effect of the invention. From the viewpoint of the effect, the proportion of the metal conductive fibers described above is preferably 50% or more, more preferably 60% or more, and particularly preferably 75% or more, as a volume ratio in the conductive layer. The proportion of the metal conductive fibers may be hereinafter referred to as a "proportion of the metal conductive fibers".

When the proportion of the metal conductive fibers is adjusted to 50% or more, sufficient conductivity can be easily secured, and durability tends to be favorable. Furthermore, particles having a shape other than that of the metal conductive fibers are not preferable since the particles do not contribute significantly to conductivity and has absorption. Particularly, in the case of a metal, when the particles have a shape with strong plasmon absorption such as a spherical shape, there is a case that transparency is deteriorated.

Here, regarding the proportion of the metal conductive fibers, for example, in a case in which the metal conductive fibers are silver nanowires, the proportion of the metal conductive fibers can be determined by filtering an aqueous dispersion liquid of the silver nanowire to separate the silver nanowires from other particles, and measuring the amount of silver remaining on paper and the amount of the conductive material that has penetrated through the filter paper, respectively, using an ICP atomic emission spectrometer. The proportion is determined by observing the metal conductive fibers remaining on the filter paper by TEM, observing the average minor axis length of 300 metal conductive fibers, and examining the distribution of the metal conductive fibers.

The method for measuring the average minor axis length and the average major axis length of the metal conductive fiber is as described above.

(Matrix)

The conductive layer of the conductive member may further contain a matrix. Here, the term "matrix" is a general name for a substance that forms a layer containing metal conductive fibers, and has a function of stably maintaining the dispersion of the metal conductive fibers. The matrix may be a non-photosensitive material, or may be a photosensitive material.

When the conductive layer is configure to include a composition containing only metal conductive fibers and a compound represented by Formula (1) or Formula (2), an embodiment in which an adhesive layer is provided, on a base material, in advance, and a conductive layer configured to have the composition described above is provided on the adhesive layer is preferable. When the conductive layer contains a matrix, dispersion of the metal conductive fibers in the conductive layer is maintained in a stable manner, and strong adhesion between the base material and the conductive layer is secured even in a case in which the conductive layer is formed on the surface of the base material without interposing an adhesive layer therebetween, thus is more preferable.

When the conductive layer contains a matrix, the content ratio of the matrix/metal conductive fibers is appropriately in the range of from 0.001/1 to 100/1 in a mass ratio. When the content ratio is selected in such a range, a conductive layer having appropriate adhesive force to the base material and having an appropriate surface resistance can be obtained. The content ratio of the matrix/metal conductive fibers is, in a mass ratio, more preferably in the range of from 0.01/1 to 20/1, even more preferably in the range of from 1/1 to 15/1, and particularly preferably in the range of from 2/1 to 8/1.

(Non-Photosensitive Matrix)

A non-photosensitive matrix is explained. Suitable examples of the non-photosensitive matrix include a matrix containing an organic polymer or an inorganic polymer.

Examples of the organic polymer include polymers having high aromaticity, such as polymethacrylate (for example, polymethyl methacrylate, and copolymers containing polymethacrylic acid esters), polyacrylates (for example, polymethyl acrylate, and copolymers containing polyacrylic acid esters), polyacrylonitrile, polyvinyl alcohol, polyesters (for example, polyethylene terephthalate (PET), polyethylene naphthalate, and polycarbonate), phenol- or cresol-formaldehyde resins (for example, NOVOLACS (registered trademark)), polystyrene, polyvinyltoluene, polyvinylxylene, polyimides, polyamides, polyamideimides, polyether imides, polysulfides, polysulfones, polyphenylene, and polyphenyl ethers; polyurethane (PU), epoxy resins, polyolefins (for example, polyethylene, polypropylene, and polycycloolefins), acrylonitrile-butadiene-styrene copolymers (ABS), cellulose derivatives, silicones, silicon-containing polymers (for example, polysilsesquioxane and polysilanes), polyvinyl chloride (PVC), polyacetate, polynorbornene, synthetic rubbers (for example, EPR, SBR, and EPDM), fluorine-containing polymers (for example, polyvinylidene fluoride, polytetrafluoroethylene (PTFE), polyhexafluoropropylene), and hydrocarbon olefins (for example, "LUMIFLON" (registered trademark) manufactured by Asahi Glass Co., Ltd.), and amorphous fluorocarbon polymers or copolymers (for example, "CYTOP" (registered trademark) manufactured by Asahi Glass Co., Ltd., and "TEFLON" (registered trademark) AF manufactured by DuPont Company), but the invention is not intended to be limited to these.

Examples of the inorganic polymer include sol-gel cured products obtained by subjecting an alkoxide compound of an element selected from the group consisting of Si, Ti, Zr and Al (hereinafter, also referred to as "specific alkoxide compound") to hydrolysis and polycondensation, and further optionally heating and drying the product.

From the viewpoint that the sol-gel cured product having high resistance to scratches and abrasion can be easily produced, the sol-gel cured product is preferred (Specific Alkoxide Compound)

The specific alkoxide compound in the invention is preferably a compound represented by the following Formula (18):

$$M(OR^p)_a R^q_{4-a} \tag{18}$$

wherein, in Formula (18), M represents an element selected from the group consisting of Si, Ti, Al and Zr; $R^p$ and $R^q$ each independently represent a hydrogen atom or a hydrocarbon group; and a represents an integer from 2 to 4.

Preferred examples of the hydrocarbon group represented by each of $R^p$ and $R^q$ in Formula (18) include an alkyl group and an aryl group.

The number of carbon atoms in a case in which the hydrocarbon group represents an alkyl group is preferably from 1 to 18, more preferably from 1 to 8, and even more preferably from 1 to 4. Furthermore, when the hydrocarbon group represents an aryl group, a phenyl group is preferred. The alkyl group or aryl group may further have a substituent, and examples of the substituent that can be introduced include the substituents for the compound of Formula (1) described above. The compound preferably has a molecular weight of 1000 or less.

Specific examples of the compound represented by Formula (18) are shown below, the invention is not intended to be limited to these.

(Alkoxysilane)

Examples of a compound in which M represents Si and a represents 2, that is, examples of a dialkoxysilane, include dimethyldimethoxysilane, diethyldimethoxysilane, propylmethyldimethoxysilane, dimethyldiethoxysilane, diethyldiethoxysilane, dipropyldiethoxysilane, γ-chloropropylmethyldiethoxysilane, acetoxymethylmethyldiethoxysilane, acetoxymethylmethyldimethoxysilane, phenylmethyldimethoxysilane, phenylethyldiethoxysilane, phenylmethyldipropoxysilane, vinylmethyldimethoxysilane, vinylmethyldiethoxysilane, vinylmethyldibutoxysilane, isopropenylmethyldimethoxysilane, isopropenylmethyldiethoxysilane, and isopropenylmethyldibutoxysilane. Among these, particularly preferred examples thereof include, from the viewpoint of ease of availability and from the viewpoint of adhesiveness to a hydrophilic layer, dimethyldimethoxysilane, diethyldimethoxysilane, dimethyldiethoxysilane, and diethyldiethoxysilane.

Examples of a compound in which M represents Si and a represents 3, that is, examples of a trialkoxysilane, include methyltrimethoxysilane, ethyltrimethoxysilane, propyltrimethoxysilane, methyltriethoxysilane, ethyltriethoxysilane, propyltriethoxysilane, chloromethyltriethoxysilane, vinyltrimethoxysilane, isopropenyltrimethoxysilane, and isopropenyltriethoxysilane. Among these, particularly preferred examples thereof include, from the viewpoint of ease of availability and from the viewpoint of adhesiveness to a hydrophilic layer, methyltrimethoxysilane, ethyltrimethoxysilane, methyltriethoxysilane, and ethyltriethoxysilane.

Examples of a compound in which M represents Si and a represents 4, that is, examples of a tetraalkoxysilane, include tetramethoxysilane, tetraethoxysilane, tetrapropoxysilane, tetrabutoxysilane, methoxytriethoxysilane, ethoxytrimethoxysilane, methoxytripropoxysilane, ethoxytripropoxysilane, propoxytrimethoxysilane, propoxytriethoxysilane, and dimethoxydiethoxysilane. Among these, particularly preferred examples thereof include tetramethoxysilane and tetraethoxysilane.

(Alkoxy Titanate)

Examples of a compound in which M represents Ti and a represents 2, that is, examples of a dialkoxy titanate, include dimethyldimethoxy titanate, diethyldimethoxy titanate, propylmethyldimethoxy titanate, dimethyldiethoxy titanate, diethyldiethoxy titanate, dipropyldiethoxy titanate, phenylethyldiethoxy titanate, phenylmethyldipropoxy titanate, and dimethyldipropoxy titanate.

Examples of a compound in which M represents Ti and a represents 3, that is, examples of a trialkoxy titanate, include methyltrimethoxy titanate, ethyltrimethoxy titanate, propyltrimethoxy titanate, methyltriethoxy titanate, ethyltriethoxy titanate, propyltriethoxy titanate, chloromethyltriethoxy titanate, phenyltrimethoxy titanate, phenyltriethoxy titanate, and phenyltripropoxy titanate.

Examples of a compound in which M represents Ti and a represents 4, that is, examples of a tetraalkoxy titanate, include tetramethoxy titanate, tetraethoxy titanate, tetrapropoxy titanate, tetraisopropoxy titanate, and tetrabutoxy titanate.

(Alkoxide of Zirconium or Aluminum)

Examples of a compound in which M represents Zr, that is, examples of alkoxides of zirconium, include zirconates corresponding to the compounds mentioned as examples containing titanium.

Examples of a compound in which M represents Al, that is, examples of alkoxides of aluminum, include trimethoxy aluminate, triethoxy aluminate, tripropoxy aluminate, and tetraethoxy aluminate.

These specific alkoxides can be easily obtained as commercially available products, and may also be produced by a known synthesis method, for example, a reaction between various metal chlorides and arbitrary alcohols.

Regarding the alkoxides, one kind of compound may be used alone, or two or more kinds of compounds may be used in combination.

A conductive layer containing a sol-gel cured film as a matrix is preferably formed by forming a coating liquid film by applying, onto a base material, a water-containing solution containing metal conductive fibers and a specific alkoxide compound as a coating liquid (hereinafter, also referred to as "sol-gel coating liquid"), causing a reaction of hydrolysis and polycondensation (hereinafter, the reaction of hydrolysis and polycondensation are also referred to as a "sol-gel reaction") of the specific alkoxide compound in the coating liquid film, and further heating the reaction product as needed to evaporate water and dry the reaction product. At the time of the preparation of a sol-gel coating liquid, a dispersion liquid of metal conductive fibers may be prepared separately, and then may be mixed with a specific alkoxide compound. Furthermore, after a solution containing a specific alkoxide compound is prepared, the solution is heated such that at least a part of the specific alkoxide compound is subjected to hydrolysis and polycondensation to form into a sol state, and the solution in a sol state is mixed with a dispersion liquid of metal conductive fibers, whereby a sol-gel coating liquid may be prepared.

(Catalyst)

In order to accelerate the sol-gel reaction, it is preferable to add an acidic catalyst or a basic catalyst. Hereinafter, the catalyst is explained.

As the catalyst, any catalyst can be used, as long as the reaction of hydrolysis and polycondensation of an alkoxide compound is accelerated.

Examples of such a catalyst include acids and basic compounds, and these compounds may be used as they are, or may be used in a state of being dissolved in a solvent such as water or alcohol (hereinafter, these are also collectively referred to as acidic catalysts and basic catalysts, respectively).

There are no particular limitations on the concentration when an acid or a basic compound is dissolved in a solvent, and the concentration may be appropriately selected in accordance with the characteristics of the acid or basic compound used, the desired content of the catalyst, and the like. Here, when the concentration of the acid or the basic compound that forms a part of the catalyst is high, the rate of hydrolysis and polycondensation tend to increase. However, when a basic catalyst having an excessively high concentration is used, there is a case in which a precipitate is produced and appears as defects in the conductive layer. Therefore, in the case of using a basic catalyst, the concentration is preferably 1 N or less as calculated in terms of the concentration in an aqueous solution.

The kind of the acidic catalyst or basic catalyst is not particularly limited. When it is necessary to use a catalyst at a high concentration, a compound in which a residual amount is few in the conductive layer after drying is preferred. Specific examples thereof include, as acidic catalysts, hydrogen halides such as hydrochloric acid; nitric acid, sulfuric acid, sulfurous acid, hydrogen sulfide, perchloric acid, hydrogen peroxide, carbonic acid; carboxylic acids such as formic acid and acetic acid; substituted carboxylic acids in which R in a structural formula represented by RCOOH is substituted with another element or a substituent; and sulfonic acids such as benzenesulfonic acid. Examples of the basic catalyst include ammoniacal bases such as aqueous ammonia; and amines such as ethylamine and aniline.

A Lewis acid catalyst containing a metal complex can also be preferably used. Particularly preferred examples of the catalyst include a metal complex catalyst, which is formed from a metal element selected from Group 2, Group 13, Group 4 and Group 5 of the Periodic Table of Elements and an oxo- or hydroxyloxygen-containing compound selected from β-diketones, keto esters, hydroxycarboxylic acids or esters thereof, amino alcohols, and enolic active hydrogen compounds.

Among the constituent metal elements, Group 2 elements such as Mg, Ca, St and Ba; Group 13 elements such as Al and Ga; Group 4 elements such as Ti and Zr; and Group 5 elements such as V, Nb and Ta are preferred, and each of them forms a complex having excellent catalytic effects. Among them, a complex obtained from Zr, Al or Ti is excellent and preferable.

In the invention, examples of the oxo- or hydroxyl oxygen-containing compound that forms a ligand of the metal complex described above include β-diketones such as acetylacetone (2,4-pentanedione) and 2,4-heptanedione; keto esters such as methyl acetoacetate, ethyl acetoacetate, and butyl acetoacetate; hydroxycarboxylic acids and esters thereof such as lactic acid, methyl lactate, salicylic acid, ethyl salicylate, phenyl salicylate, malic acid, tartaric acid, and methyl tartrate; keto alcohols such as 4-hydroxy-4-methyl-2-pentanone, 4-hydroxy-2-pentanone, 4-hydroxy-4-methyl-2-heptanone, and 4-hydroxy-2-heptanone; amino alcohols such as monoethanolamine, N,N-dimethylethanolamine, N-methylmonoethanolamine, diethanolamine, and triethanolamine; enolic active compounds such as methylolmelamine, methylol urea, methylol acrylamide, and malonic acid diethyl ester; and compounds having a substituent at a methyl group, a methylene group, or a carbonyl carbon of acetylacetone (2,4-pentanedione).

Preferred ligands are acetylacetone derivatives, and in the invention, the acetylacetone derivatives refer to compounds having a substituent at a methyl group, a methylene group or a carbonyl carbon of acetylacetone. Examples of the substituent that is attached to a methyl group of acetylacetone include a linear or branched alkyl group, acyl group, hydroxyalkyl group, carboxyalkyl group, alkoxy group, and alkoxyalkyl group, each of which has 1 to 3 carbon atoms, and examples of the substituent that is substituted on a methylene group of acetylacetone include a carboxyl group, and a linear or branched carboxyalkyl group and hydroxyalkyl group, each of which has 1 to 3 carbon atoms. Examples of the substituent that is substituted on a carbonyl carbon of acetylacetone include an alkyl group having 1 to 3 carbon atoms, and in this case, a hydrogen atom is added to the carbonyl oxygen to form a hydroxyl group.

Specific examples of preferred acetylacetone derivatives include ethylcarbonyl acetone, n-propylcarbonylacetone, i-propylcarbonylacetone, diacetylacetone, 1-acetyl-1-propionylacetylacetone, hydroxyethylcarbonylacetone, hydroxypropylcarbonylacetone, acetoacetic acid, acetopropionic acid, diacetoacetic acid, 3,3-diacetopropionic acid, 4,4-diacetobutyric acid, carboxyethylcarbonylacetone, carboxypropylcarbonylacetone, and diacetone alcohol. Among them, acetylacetone and diacetylacetone are particularly preferred. The complex of the aforementioned acetylacetone derivative and the aforementioned metal element is a single nuclear complex in which 1 to 4 molecules of an acetylacetone derivative are coordinated per one molecule of a metal element, and when the number of bonds of the metal element capable of coordination is larger than total number of bonds of the acetylacetone derivative capable of coordination, a ligand that is generally used in conventional complexes, such as a water molecule, a halogen ion, a nitro group and an ammonio group, may be coordinated.

Preferred examples of the metal complex include a tris(acetylacetonato)aluminum complex salt, a di(acetylacetonato)aluminum aquo complex salt, a mono(acetylacetonato)aluminum chloro complex salt, a di(diacetylacetonato)aluminum complex salt, ethyl acetoacetate aluminum diisopropylate, aluminum tris(ethyl acetoacetate), cyclic aluminum oxide isopropylate, a tris(acetylacetonato)barium complex salt, a di(acetylacetonato)titanium complex salt, a tris(acetylacetonato)titanium complex salt, a di-i-propoxybis(acetylacetonato)titanium complex salt, zirconium tris(ethyl acetoacetate), and a zirconium tris(benzoic acid) complex salt. These have excellent stability in a water-based coating liquid, and an excellent gelation accelerating effect in the sol-gel reaction at the time of heating and drying. Among them, ethyl acetoacetate aluminum diisopropylate, aluminum tris(ethyl acetoacetate), di(acetylacetonato)titanium complex salt, and zirconium tris(ethyl acetoacetate) are particularly preferred.

Description of a counter salt of the metal complex described above is not given in the present specification, and the kind of the counter salt is arbitrary as long as the salt is a water-soluble salt which maintains neutrality of the charge as a complex compound. For example, a form of a salt that secures stoichiometric neutrality, such as a nitric acid salt, a halogen acid salt, a sulfuric acid salt, or a phosphoric acid salt, is used.

In regard to the behavior of a metal complex in a silica sol-gel reaction, detailed descriptions are given in J. Sol-Gel. Sci. and Tec. 16. 209 (1999). Regarding the reaction mechanism, the following scheme is contemplated. That is, it is assumed that a metal complex adopts a coordinated structure and is stabilized in a coating liquid, and in a dehydration condensation reaction that begins in the course of heating and drying after coating, the metal complex accelerates crosslinking by a mechanism similar to that of an acid catalyst. Whatsoever, when the metal complex is used, a coating liquid having excellent stability over time, and a conductive layer having excellent coating film surface quality and high durability can be obtained.

The metal complex catalysts described above can be easily obtained as commercially available products, and can also be obtained by a known synthesis method, for example, a reaction between various metal chlorides and alcohols.

In the invention, the catalyst is used in the sol-gel coating liquid in an amount in the range of preferably from 0% to 50% by mass, and more preferably from 5% to 25% by mass, with respect to the non-volatile components. The catalyst may be used singly, or two or more kinds may be used in combination.

(Solvent)

In the sol-gel coating liquid, a solvent may be incorporated if desired, in order to secure the ability to form a uniform coating liquid film on a substrate.

Examples of the solvent include water, ketone-based solvents (for example, acetone, methyl ethyl ketone, and diethyl ketone), alcohol-based solvents (for example, methanol, ethanol, 2-propanol, 1-propanol, 1-butanol, and tert-butanol), chlorine-based solvents (for example chloroform and dichloromethane), aromatic solvents (for example, benzene and toluene), ester-based solvents (for example, ethyl acetate, butyl acetate, and isopropyl acetate), ether-based solvents (for example, diethyl ether, tetrahydrofuran, and dioxane), and glycol ether-based solvents (for example, ethylene glycol monomethyl ether and ethylene glycol dimethyl ether).

In the coating liquid film of a sol-gel coating liquid formed on a substrate, a reaction of hydrolysis and condensation of a specific alkoxide compound occur, and in order to accelerate the reaction, it is preferable to heat and dry the coating liquid film. The heating temperature for accelerating the sol-gel reaction is suitably in the range of from 30° C. to 200° C., and more preferably in the range of from 50° C. to 180° C. The heating and drying time is preferably from 10 seconds to 300 minutes, and more preferably from 1 minute to 120 minutes.

As the non-photosensitive matrix, a sol-gel cured product as described above is preferred from the viewpoint that a conductive layer having high film strength is obtained.

(Photosensitive Matrix)

Next, a photosensitive matrix is explained.

Preferred examples of the photosensitive matrix include photoresist compositions that are suitable for lithographic processes. When a photoresist composition is included as a matrix, it is preferable from the viewpoint that a conductive layer having a conductive region and a non-conductive region in a pattern form, can be formed by a lithographic process. Among such photoresist compositions, particularly preferred examples thereof include a photopolymerizable composition, from the viewpoint that a conductive layer having excellent transparency, excellent flexibility, and excellent adhesiveness to the base material is obtained. Hereinafter, the photopolymerizable composition is explained.

(Photopolymerizable Composition)

A photopolymerizable composition contains, as basic components, (a) an addition polymerizable unsaturated compound, and (b) a photopolymerization initiator that generates a radical when irradiated with light, and if desired, further contains (c) a binder, and (d) an additive other than the components (a) to (c).

These components are explained below.

[(a) Addition Polymerizable Unsaturated Compound]

The addition polymerizable unsaturated compound of the component (a) (hereinafter, also referred to as a "polymerizable compound") is a compound which forms into a polymer by undergoing an addition polymerization reaction in the presence of a radical, and usually, a compound having at least one, more preferably two or more, and even more preferably four or more, ethylenically unsaturated bonds at a molecule end thereof is used.

The compound has chemical forms of, for example, a monomer, a prepolymer, namely, a dimer, a trimer or an oligomer, or mixtures thereof.

As such polymerizable compounds, various compounds are known, and those can be used as the component (a).

Among these, particularly preferred examples of the polymerizable compound include, from the viewpoint of film strength, trimethylolpropane tri(meth)acrylate, pentaerythritol tetra(meth)acrylate, dipentaerythritol hexa(meth)acrylate, and dipentaerythritol penta(meth)acrylate.

The content of the component (a) is preferably from 2.6% by mass to 37.5% by mass, and more preferably from 5.0% by mass to 20.0% by mass, with respect to the total mass of the solid content of the composition containing the metal conductive fibers described above.

[(b) Photopolymerization Initiator]

The photopolymerization initiator of the component (b) is a compound which generates a radical when irradiated with light. Examples of the photopolymerization initiator include a compound which generates an acid radical that finally becomes an acid when irradiated with light, and a compound which generates another radical. Hereinafter, the former is called a "photoacid generator", and the latter is called a "photoradical generator".

—Photoacid Generator—

As the photoacid generator, a photoinitiator for photocationic polymerization, a photoinitiator for photo-radical polymerization, a photo-decoloring agent for coloring matters, a photo-discoloring agent, known compounds that generate acid radicals when irradiated with active light or radiation, which are used in microresists and the like, or mixtures thereof can be appropriately selected and used.

Such a photoacid generator is not particularly limited and can be appropriately selected according to the purpose, and examples thereof include triazine or 1,3,4-oxadiazole having at least one di- or trihalomethyl group, naphthoquinone-1,2-diazido-4-sulfonyl halide, a diazonium salt, a phosphonium salt, a sulfonium salt, an iodonium salt, imide sulfonate, oxime sulfonate, diazodisulfone, disulfone, and o-nitrobenzyl sulfonate. Among these, imide sulfonate, oxime sulfonate, and o-nitrobenzyl sulfonate, which are compounds generating sulfonic acid, are particularly preferred.

Furthermore, a compound in which a group or compound that generates an acid radical when irradiated with active light or radiation has been introduced into the main chain or a side chain of a resin, for example, the compounds described in U.S. Pat. No. 3,849,137, German Patent No. 3914407, JP-A Nos. S63-26653, S55-164824, S62-69263, S63-146038, S63-163452, S62-153853, and S63-146029 can be used.

Furthermore, the compounds described in U.S. Pat. No. 3,779,778 and European Patent No. 126,712 can also be used as acid radical generators.

—Photoradical Generator—

A photoradical generator is a compound having a function of generating a radical by directly absorbing light or by being photosensitized to cause a decomposition reaction or a hydrogen abstraction reaction. The photoradical generator is preferably a compound having absorption in the wavelength range of from 200 nm to 500 nm.

Regarding such a photoradical generator, a large number of compounds are known, and examples thereof include a carbonyl compound, a ketal compound, a benzoin compound, an acridine compound, an organic peroxide compound, an azo compound, a coumarin compound, an azide compound, a metallocene compound, a hexaarylbiimidazole compound, an organic boric acid compound, a disulfonic acid compound, an oxime ester compound, and an acylphosphine (oxide) compound, as described in JP-A No. 2008-268884. These can be appropriately selected according to the purpose. Among these, a benzophenone compound, an acetophenone compound, a hexaarylbiimidazole compound, an oxime ester compound, and an acylphosphine (oxide) compound are particularly preferred from the viewpoint of exposure sensitivity.

Examples of the benzophenone compound include benzophenone, Michler's ketone, 2-methylbenzophenone, 3-methylbenzophenone, N,N-diethylaminobenzophenone, 4-methylbenzophenone, 2-chlorobenzophenone, 4-bromobenzophenone, and 2-carboxybenzophenone. These may be used singly, or two or more kinds may be used in combination.

Examples of the acetophenone compound include 2,2-dimethoxy-2-phenylacetophenone, 2,2-diethoxyacetophenone, 2-(dimethylamino)-2-[(4-methylphenyl)methyl]-1-[4-(4-morpholinyl)phenyl]-1-butanone, 1-hydroxycyclohexyl phenyl ketone, α-hydroxy-2-methylphenylpropanone, 1-hydroxy-1-methylethyl(p-isopropylphenyl) ketone, 1-hydroxy-1-(p-dodecylphenyl) ketone, 2-methyl-1-(4-methylthiophenyl)-2-morpholinopropan-1-one, 1,1,1-trichloromethyl-(p-butylphenyl) ketone, and 2-benzyl-2-dimethylamino-1-(4-morpholinophenyl)-butanone-1. Specific examples of commercially available products that are suitable include IRGACURE 369, IRGACURE 379 and IRGACURE 907 manufactured by BASF GmbH. These may be used singly, or two or more kinds may be used in combination.

Examples of the hexaarylbiimidazole compound include the various compounds described in Japanese Patent Application Publication (JP-B) No. H06-29285, U.S. Pat. Nos. 3,479,185, 4,311,783, and 4,622,286, and specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole. These may be used singly, or two or more kinds may be used in combination.

Examples of the oxime ester compound include the compounds described in J. C. S. Perkin II (1979) 1653-1660; J. C. S. Perkin II (1979) 156-162; Journal of Photopolymer Science and Technology (1995) 202-232; and JP-A No. 2000-66385; and the compounds described in JP-A No. 2000-80068 and Japanese National-Phase Publication No. 2004-534797. Specifically, suitable examples thereof include IRGACURE OXE-01 and OXE-02 manufactured by BASF GmbH. These may be used singly, or two or more kinds may be used in combination.

Examples of the acylphosphine (oxide) compound include IRGACURE 819, DAROCUR 4265 and DAROCUR TPO manufactured by BASF GmbH.

Particularly preferred examples of the photoradical generator include, from the viewpoints of exposure sensitivity and transparency, 2-(dimethylamino)-2-[(4-methylphenyl) methyl]-1-[4-(4-morpholinyl)phenyl]-1-butanone, 2-benzyl-2-dimethylamino-1-(4-morpholinophenyl)-butanone-1,2-methyl-1-(4-methylthiophenyl)-2-moprholinopropan-1-one, 2,2'-bis(2-chlorophenyl)-4,4',5,5'-tetraphenylbiimidazole, N,N-diethylaminobenzophenone, 1,2-octanedione, and 1-[4-(phenylthio)-,2-(o-benzoyloxime)].

The photopolymerization initiator of the component (b) may be used singly, or two or more kinds may be used in combination, and the content thereof is preferably from 0.1% by mass to 50% by mass, more preferably from 0.5% by mass to 30% by mass, and even more preferably from 1% by mass to 20% by mass, with respect to the total mass of the solid content of the photopolymerizable composition containing metal conductive fibers. When the content is in such a numerical value range, in the case of forming the pattern including a conductive region and a non-conductive region that are described below on the conductive layer, favorable sensitivity and ability to form a pattern can be obtained.

[(c) Binder]

The binder is a linear organic high molecular weight polymer, and can be appropriately selected from alkali-soluble resins having at least one group that promotes alkali-solubility (for example, a carboxyl group, a phosphoric acid group, or a sulfonic acid group) in the molecule (preferably, a molecule having an acrylic copolymer or a styrenic copolymer, as the main chain).

Among these, a compound that is soluble in an organic solvent and soluble in an aqueous alkali solution is preferred, and a compound that has a dissociable group and becomes alkali-soluble when the dissociable group is dissociated under the action of a base is particularly preferred. Here, a dissociable group indicates a functional group capable of being dissociated in the presence of a base.

For the production of the binder, for example, a method according to a known radical polymerization method can be applied. The polymerization conditions such as temperature, pressure, the kind and amount of the radical initiator, and the kind of the solvent, which are employed when an alkali-soluble resin is produced by the radical polymerization method, can be easily set by an ordinarily skilled person, and the conditions can be determined experimentally.

The linear organic high molecular weight polymer is preferably a polymer having a carboxylic acid in a side chain.

Examples of the polymer having a carboxylic acid in a side chain include the methacrylic acid copolymers, acrylic acid copolymers, itaconic acid copolymers, crotonic acid copolymers, maleic acid copolymers, and partially esterified maleic acid copolymers described in JP-A No. S59-44615; JP-B Nos. S54-34327, S58-12577 and S54-25957; and JP-A No. S59-53836 and S59-71048; and acidic cellulose derivatives having a carboxylic acid in a side chain, and products obtained by adding an acid anhydride to a polymer having a hydroxyl group. Further, preferable examples thereof include high molecular weight polymers having a (meth)acryloyl group in a side chain.

Among these, a benzyl(meth)acrylate/(meth)acrylic acid copolymer, and a multi-component copolymer formed from benzyl(meth)acrylate/(meth)acrylic acid/other monomers are particularly preferred.

Furthermore, useful examples thereof include a high molecular weight polymer having a (meth)acryloyl group in a side chain, and a multi-component copolymer formed from (meth)acrylic acid/glycidyl(meth)acrylate/other monomers. The polymers can be incorporated and mixed in an arbitrary amount and used.

In addition to the compounds described above, examples thereof include a 2-hydroxyproyl(meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, described in JP-A No. H07-140654.

As a specific constituent unit for the alkali-soluble resin, (meth)acrylic acid and other monomers capable of copolymerizing with (meth)acrylic acid are suitable.

Examples of the other monomers capable of copolymerizing with (meth)acrylic acid include alkyl(meth)acrylates, aryl (meth)acrylates, and vinyl compounds. In the monomer a hydrogen atom of the alkyl group or aryl group may be substituted with a substituent.

Examples of alkyl(meth)acrylates and aryl(meth)acrylates include methyl(meth)acrylate, ethyl(meth)acrylate, propyl (meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl (meth)acrylate, naphthyl(meth)acrylate, cyclohexyl(meth) acrylate, dicyclopentanyl(meth)acrylate, dicyclopentenyl (meth)acrylate, and dicyclopentenyloxyethyl(meth)acrylate. These may be used singly, or two or more kinds may be used in combination.

Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, polystyrene macromonomer, polymethyl methacrylate macromonomer, $CH_2=CR^1R^2$, and $CH_2=C(R^1)(COOR^3)$ (wherein $R^1$ represents a hydrogen atom or an alkyl group having 1 to 5 carbon atoms; $R^2$ represents an aromatic hydrocarbon ring having 6 to 10 carbon atoms; and $R^3$ represents an alkyl group having 1 to 8 carbon atoms or an aralkyl group having 6 to 12 carbon atoms). These may be used singly, or two or more kinds may be used in combination.

The weight average molecular weight of the binder is preferably from 1,000 to 500,000, more preferably from 3,000 to 300,000, and even more preferably from 5,000 to 200,000, from the viewpoints of the rate of alkali dissolution, the film properties, and the like.

Here, the weight average molecular weight can be determined by measurement by a gel permeation chromatographic method, and using a standard polystyrene calibration curve.

The content of the binder of the component (c) is preferably from 5% by mass to 90% by mass, more preferably from 10% by mass to 85% by mass, and even more preferably from 20% by mass to 80% by mass, with respect to the total mass of the solid content for the photopolymerizable composition containing the metal conductive fibers described above. When the content is in the preferred content range, both developing property and conductivity of the metal conductive fibers can be achieved.

[(d) Additional Additives Other than Components (a) to (c)]

Examples of additional additives other than the components (a) to (c) include various additives such as a sensitizer, a chain transfer agent, a crosslinking agent, a dispersant, a solvent, a surfactant, an oxidation inhibitor, a sulfuration inhibitor, a metal corrosion preventing agent, a viscosity adjusting agent, and an antiseptic agent.

(d-1) Chain Transfer Agent

A chain transfer agent is used to increase the exposure sensitivity of the photopolymerizable composition. Examples of such a chain transfer agent include N,N-dialkylaminobenzoic acid alkyl esters such as N,N-dimethylaminobenzoic acid ethyl ester; mercapto compounds having a heterocyclic ring such as 2-mercaptobenzothiazole, 2-mercaptobenzoxazole, 2-mercaptobenzimidazole, N-phenylmercaptobenzimidazole, and 1,3,5-tris(3-mercaptobutyloxyethyl)-1,3,5-triazine-2,4,6-(1H,3H,5H)-trione; and polyfunctional aliphatic mercapto compounds such as pentaerythritol tetrakis(3-mercaptopropionate), pentaerythritol tetrakis(3-mercaptobutyrate), and 1,4-bis(3-mercaptobutyryloxy)butane. These may be used singly, or two or more kinds may be used in combination.

The content of the chain transfer agent is preferably from 0.01% by mass to 15% by mass, more preferably from 0.1% by mass to 10% by mass, and even more preferably from 0.5% by mass to 5% by mass, with respect to the total mass of the solid content of the photopolymerizable composition containing the metal conductive fibers described above.

(d-2) Crosslinking Agent

A crosslinking agent is a compound which forms a chemical bonding by a free radical or an acid and heat to cure the conductive layer. Examples thereof include a melamine-based compound, a guanamine-based compound, a glycoluril-based compound, a urea-based compound, a phenol-based compound or an ether compound of phenol, an epoxy-based compound, an oxetane-based compound, a thioepoxy-based compound, an isocyanate-based compound, or an azide-based compound, each of which is substituted with at least one group selected from a methylol group, an alkoxymethyl group, and an acyloxymethyl group; and a compound having an ethylenically unsaturated group including a methacryloyl group or an acryloyl group. Among these, from the viewpoints of the film properties, heat resistance and solvent resistance, an epoxy-based compound, an oxetane-based compound, and a compound having an ethylenically unsaturated group are particularly preferred.

Furthermore, the oxetane resin can be used singly, or as a mixture with an epoxy resin. Particularly, when the oxetane resin is used in combination with an epoxy resin, it is preferable from the viewpoint of having high reactivity and enhancing the film properties.

When a compound having an ethylenically unsaturated double bond group is used as a crosslinking agent, the crosslinking agent is also included in the (c) polymerizable compound, and it should be noted that the content of the crosslinking agent is included in the content of the (c) polymerizable compound, in the invention.

The content of the crosslinking agent is preferably from 1 part by mass to 250 parts by mass, and more preferably from 3 parts by mass to 200 parts by mass, with respect to the total mass of the solid content of the photopolymerizable compound containing the metal conductive fibers described above.

(d-3) Dispersant

A dispersant is used in order to disperse the metal conductive fibers in a photopolymerizable composition while preventing aggregation of the metal conductive fibers. The dispersant is not particularly limited as long as it is capable of dispersing the metal conductive fibers, and the dispersant can be appropriately selected according to the purpose. For example, dispersants that are commercially available as pigment dispersants can be used, and particularly, polymeric dispersants having a property of adsorbing to metal conductive fibers are preferred. Examples of such polymeric dispersants include polyvinylpyrrolidone, BYK series (manufactured by BYK Chemie GmbH), SOLSPERSE series (manufactured by Lubrizol Japan, Ltd.), and AJISPER series (manufactured by Ajinomoto Co., Inc.).

When a polymeric dispersant is further added separately as a dispersant in addition to the dispersant used in the production of the metal conductive fibers, the polymeric dispersant is also included in the binder of the component (c), and it should be noted that the content of the polymeric dispersant is included in the content of the component (c) described above.

The content of the dispersant is preferably from 0.1 parts by mass to 50 parts by mass, more preferably from 0.5 parts by mass to 40 parts by mass, and particularly preferably from 1 part by mass to 30 parts by mass, with respect to 100 parts by mass of the binder of the component (c).

When the content of the dispersant is adjusted to 0.1 parts by mass or more, aggregation of the metal conductive fibers in the dispersion liquid is effectively suppressed, and when the content of the dispersant is adjusted to 50 parts by mass or less, it is preferable because a liquid film that is stable in the coating process is formed, and the occurrence of coating unevenness is suppressed.

(d-4) Solvent

A solvent is a component used to obtain a coating liquid for forming the photopolymerizable composition containing the metal conductive fibers described above in a film form on the surface of a base material, and the solvent can be appropriately selected according to the purpose. Examples thereof include propylene glycol monomethyl ether, propylene glycol monomethyl ether acetate, methanol, ethanol, 1-propanol, 2-propanol, butanol, 1-methoxy-2-propanol, 3-methoxybutanol, acetone, methyl ethyl ketone, methyl isobutyl ketone, cyclohexanone, methyl acetate, ethyl acetate, propyl acetate, isopropyl acetate, butyl acetate, ethyl 3-ethoxypropionate, methyl 3-methoxypropionate, ethyl lactate, γ-butyrolactone, propylene carbonate, N-methyl-2-pyrrolidinone, and N-ethyl-2-pyrrolidinone. These may be used singly, or two or more kinds may be used in combination.

The solid content concentration of a coating liquid containing such a solvent is preferably adjusted in the range of from 0.1% by mass to 20% by mass.

In addition, as the matrix, the polymer compound as a dispersant used at the time of production of the metal conductive fibers can be used as at least a part of the components that form the matrix.

The conductive member according to the invention is preferably prepared such that the surface resistance is from 1 Ω/Square to 1000 Ω/Square. The surface resistance of the conductive member according to the invention is more preferably adjusted to the range of from 1 Ω/Square to 500 Ω/Square, and particularly preferably to the range of from 1 Ω/Square to 200 Ω/Square.

The surface resistance is a value measured by a four-probe method at the surface on the side opposite to a side of the base material of the conductive layer in the conductive member according to the invention. Regarding the method for measuring the surface resistance by a four-probe method, measurement can be made according to, for example, JIS K 7194: 1994 (method for testing resistivity of conductive plastics by four-probe method) or the like, and the surface resistance can be measured conveniently using a commercially available surface resistivity meter. In order to control the surface resistance, at least one of the kind and content ratio, of the metal conductive fibers contained in the conductive layer may be adjusted. More specifically, for example, a conductive layer having a surface resistance in a preferable range can be formed by adjusting the content ratio of the matrix to the metal conductive fibers.

The conductive member according to the invention has the total light transmittance of preferably 70% or higher, more preferably 85% or higher, and particularly preferably 90% or higher.

The conductive member according to the invention has the haze value of preferably 10% or less, more preferably 5% or less, and particularly preferably 2% or less.

Preferred Embodiments of Invention

Preferred embodiments of the conductive member according to the invention include the three embodiments described below.

A first preferred embodiment of the invention is an embodiment of a conductive member in which a conductive layer containing metal conductive fibers is provided on a base material, and when the conductive member is observed in a direction perpendicular to the surface of the base material, the entire region of the conductive layer is a conductive region (hereinafter, such a conductive layer may also be referred to as "non-patterned conductive layer"). The conductive member according to the first embodiment can be preferably used in, for example, transparent electrodes of solar cells, electromagnetic wave shielding materials, and antistatic materials.

A second preferred embodiment of the invention is an embodiment of a conductive member in which a conductive layer containing metal conductive fibers is provided on a base material, and the conductive layer includes a conductive region and a non-conductive region (hereinafter, such a conductive layer may also be referred to as "patterned conductive layer"). The non-conductive region may or need not contain metal conductive fibers. When metal conductive fibers are contained in the non-conductive region, the non-conductive region becomes substantially non-conductive by disconnecting the metal conductive fibers contained in the non-conductive regions, or by extremely high contact resistance between the metal conductive fibers. The conductive member according to the second embodiment is used, for example, in the case of producing a touch panel or a wiring material. In this case, a conductive region and a non-conductive region having a desired shape are formed and examples thereof include an electrode shape which is provided in an existing ITO transparent conductive film. Specific examples thereof include the stripe-shaped patterns and patterns called diamond patterns, which are disclosed in WO 2005/114369, WO 2004/061808, JP-A Nos. 2010-33478, and 2010-44453.

A third preferred embodiment of the invention is a conductive member in which at least a cushion layer and a conductive layer containing metal conductive fibers are provided in this order on a first base material, and which is used by transferring the conductive layer onto a second base material. In this embodiment, the base material is detached after the conductive member is transferred onto a transfer-receiving body, and the cushion layer and the conductive layer are transferred to the transfer-receiving body.

In the third embodiment, the entire region of the conductive layer may be conductive (non-patterned conductive layer), or may be a patterned conductive layer having a conductive region and a non-conductive region. Preferred uses in the case of a non-patterned conductive layer are the same as those of the first preferred embodiment of the invention as described above, and the preferred uses and shape in the case of a patterned conductive layer are the same as those of the second preferred embodiment of the invention as described above.

The first preferred embodiment and the second preferred embodiment of the invention are described in detail.

Each of the first preferred embodiment and the second preferred embodiment of the invention is a conductive member in which a conductive layer containing metal conductive fibers is provided on a base material, and an arbitrary combination of the base material and conductive layer described above can be selected, according to the purpose.

In the invention, it is preferable to use the sol-gel cured film described above as the matrix of the conductive layer.

The patterned conductive layer according to the preferred second embodiment of the invention is prepared by, for example, the patterning method described below.

(1) A patterning method including forming a non-patterned conductive layer in advance, irradiating the metal conductive fibers contained in a desired region of the non-patterned conductive layer with high energy laser light such as a carbon dioxide laser, a YAG laser or the like, and disconnecting or eliminating a part of the metal conductive fibers to form the desired region into a non-conductive region. The method is described in, for example, JP-A No. 2010-4496.

(2) A patterning method including providing a photoresist layer on a non-patterned conductive layer that has been formed in advance, performing desired patterned exposure and development on the photoresist layer to form a resist in the pattern form, and then removing by etching the metal conductive fibers in the conductive layer in a region that is not protected by the resist by a wet process of treating the metal conductive fibers with an etching liquid capable of etching the metal conductive fibers, or by a dry process such as reactive ion etching. The method is described in, for example, Japanese National-Phase Publication No. 2010-507199 (particularly, paragraphs 0212 to 0217).

(3) A patterning method including forming a photosensitive non-patterned conductive layer in advance, exposing the non-patterned conductive layer in a patterned manner by, for example, surface exposure using a photomask, scanning exposure using a laser beam, or the like, and then performing development, and the method includes an exposure process and a developing process, and further includes other process as necessary. The method is described in, for example, JP-A No. 2010-251186.

Among the methods described above, the methods (1) and (2) are patterning methods that are suitable in a case in which the conductive layer is composed of metal conductive fibers alone, or in a case in which the conductive layer contains metal conductive fibers and a non-photosensitive matrix.

Furthermore, the light source used for the exposure described in items (2) and (3) is selected in relation to the photosensitization wavelength range of the photoresist composition, but generally, ultraviolet radiation such as g-line, h-line, i-line or j-line is preferably used. Furthermore, a blue LED may also be used.

The method for patterned exposure is not particularly limited, and the exposure may be carried out by surface exposure using a photomask, or may be carried out by scanning exposure using a laser beam or the like. At this time, the exposure mode may be refraction type exposure using a lens, or may be reflection type exposure using a reflecting mirror. Exposure methods such as contact exposure, proximity exposure, reduction projection exposure, and reflection projection exposure can be used.

The dissolving liquid that dissolves the metal conductive fibers in the patterning method described in the above item (2) can be appropriately selected depending on the metal conductive fibers. For example, when the metal conductive fibers are silver nanowires, a bleaching-fixing liquid that is used mainly in the bleaching and fixing process of a photographic paper of a silver halide color photosensitive material in the so-called photographic science industry, examples thereof include a strong acid, an oxidizing agent, and hydrogen peroxide. Among these, the bleaching-fixing liquid, dilute nitric acid, and hydrogen peroxide are more preferred, and the bleaching-fixing liquid and dilute nitric acid are particularly preferred. Regarding the dissolution of silver nanowires using a dissolving liquid that dissolves the metal conductive fibers, a part of the silver nanowires to which the dissolving liquid is applied need not be completely dissolved, and a part of the silver nanowires may remain, as long as conductivity is lost.

The concentration of the dilute nitric acid is preferably from 1% by mass to 20% by mass.

The concentration of the hydrogen peroxide is preferably from 3% by mass to 30% by mass.

Regarding the bleaching-fixing liquid, for example, the treatment material or the treatment method described in page 26, lower right column, line 1 to page 34, upper right column, line 9 of JP-A No. H02-207250, and page 5, upper left column, line 17 to page 18, lower right column, line 20 of JP-A No. H04-97355 can be preferably applied.

The bleaching-fixing time is preferably 180 seconds or shorter, more preferably 120 seconds or shorter and 1 second or longer, and even more preferably 90 seconds or shorter and 5 seconds or longer. Furthermore, the water-washing or stabilization time is preferably 180 seconds or shorter, and more preferably 120 seconds or shorter and 1 second or longer.

The bleaching-fixing liquid is not particularly limited as long as it is a photographic bleaching-fixing liquid, and can be appropriately selected according to the purpose. Examples thereof include CP-48S and CP-49E (bleaching-fixing agents for color paper) manufactured by Fujifilm Corp.; EKTA-COLOR RA bleaching-fixing liquid manufactured by Eastman Kodak Co.; and bleaching-fixing liquids D-J2P-02-P2, D-30P2R-01 and D-22P2R-01 manufactured by Dainippon Printing Co., Ltd. Among these, CP-48S and CP-49E are particularly preferred.

The viscosity at 25° C. of the dissolving liquid that dissolves the metal conductive fibers is preferably from 5 mPa·s to 300,000 mPa·s, and more preferably from 10 mPa·s to 150,000 mPa·s. When the viscosity is adjusted to 5 mPa·s or greater, it is easier to control the diffusion of the dissolving liquid to a desired range, and patterning with clear boundaries between a conductive region and a non-conductive region is secured. On the other hand, when the viscosity is adjusted to 300,000 mPa·s or less, implementation of printing of the dissolving liquid without any load can be secured, and also, the treatment time required for the dissolution of the metal conductive fibers can be completed within a desired time.

Patterned application of the dissolving liquid that dissolves the metal conductive fibers is not particularly limited as long as the dissolving liquid can be applied in a patterned manner, and the method can be appropriately selected according to the purpose. Examples thereof include screen printing, inkjet printing, and a method of forming an etching mask in advance using a resist agent or the like and performing coater coating, roller coating, dipping coating, or spray coating thereon using a dissolving liquid. Among these, screen printing, inkjet printing, coater coating, and dip (immersion) coating are particularly preferred.

Regarding the inkjet printing, for example, any of the piezo mode and the thermal mode can be used.

The kind of the pattern is not particularly limited and can be appropriately selected according to the purpose. Examples thereof include characters, symbols, shapes, figures, and wiring patterns.

The size of the pattern is not particularly limited and can be appropriately selected according to the purpose. The size may be any size ranging from a nanometer size to a millimeter size.

(Intermediate Layer)

In the first preferred embodiment and the second preferred embodiment of the invention, it is preferable to have at least one intermediate layer between the base material and the conductive layer. When an intermediate layer is provided between the base material and the conductive layer, an enhancement of at least one of the adhesiveness between the base material and the conductive layer, the total light transmittance of the conductive layer, the haze value of the conductive layer, and the film strength of the conductive layer can be achieved.

Examples of the intermediate layer include an adhesive layer for enhancing the adhesive force between the base material and the conductive layer, and a functional layer for enhancing the functionality by an interaction with the components contained in the conductive layer. These layers are appropriately provided according to the purpose.

There are no particular limitations on the material used in the intermediate layer, as long as a material enhances at least any one of the characteristics described above.

For example, when an adhesive layer is provided as an intermediate layer, a material selected from the polymers, silane coupling agents, and titanium coupling agents that are used in adhesives, and a sol-gel film obtained by hydrolysis and polycondensation of an alkoxysilane compound, is included.

Furthermore, it is preferable that the intermediate layer that is in contact with the conductive layer (that is, referring to the intermediate layer when the intermediate layer is a single layer, and referring to an intermediate layer that is in contact with the conductive layer when the intermediate layer includes a plurality of layers) is a functional layer containing a compound which has a functional group capable of interacting with the metal conductive fibers contained in the conductive layer, from the viewpoint that a conductive layer having excellent total light transmittance, haze value and film strength is obtained. In the case of having such an intermediate layer, when the conductive layer contains metal conductive fibers and a matrix, a conductive layer having excellent film strength is obtained.

The mechanism for this is not clear, but it is contemplated that when an intermediate layer containing a compound which has a functional group capable of interacting with the metal conductive fibers contained in the conductive layer is provided, by the interaction between the metal conductive fibers contained in the conductive layer and the compound which has the above-described functional group and is contained in the intermediate layer, aggregation of conductive materials in the conductive layer is suppressed so that uniform dispersibility is improved, a decrease in transparency or haze that is caused by aggregation of the conductive materials in the conductive layer is suppressed, and also, an increase in the film strength is achieved due to the adhesiveness. An intermediate layer that is capable of exhibiting such an interaction may be hereinafter referred to as a functional layer.

As the functional group that is capable of interacting with the metal conductive fibers, for example, in a case in which the metal conductive fibers are silver nanowires, the functional group is more preferably at least one selected from the group consisting of an amide group, an amino group, a mercapto group, a carboxylic acid group, a sulfonic acid group, a phosphoric acid group, a phosphonic acid group, or salts thereof. Even more preferably, the functional group is preferably an amino group, a mercapto group, a phosphoric acid group, a phosphonic acid group, or a salt thereof, and most preferably an amino group.

Examples of the compound having such a functional group described above include compounds having an amide group such as ureidopropyltriethoxysilane, polyacrylamide and poly(N-methylacrylamide); compounds having an amino group such as N-β-(aminoethyl)-γ-aminopropyltrimethoxysilane, 3-aminopropyltriethoxysilane, bis(hexamethylene) triamine, and poly(2-aminoethylacrylamide); compounds having a mercapto group such as 3-mercaptopropyltrimethoxysilane and 2-mercaptoethyltrimethoxysilane; compounds having a group of sulfonic acid or a salt thereof such as poly(sodium p-styrenesulfonate) and poly(acrylamido-2-methylpropanesulfonic acid); compounds having a carboxylic acid group such as polyacrylic acid, polymethacrylic acid, and polyacrylic acid-partial sodium salt; compounds having a phosphoric acid group such as poly(2-phosphonoxyethyl methacrylate); and compounds having a phosphonic acid group such as polyvinylphosphonic acid.

When these functional groups are selected, aggregation of the metal conductive fibers at the time of drying is suppressed by the occurrence of an interaction between the metal conductive fibers and the functional group contained in the intermediate layer after application of a coating liquid for conductive layer formation, whereby a conductive layer in which the metal conductive fibers are uniformly dispersed can be formed.

The intermediate layer can be formed by applying, onto a substrate, a liquid in which a compound that forms the intermediate layer is dissolved, or dispersed and emulsified, and drying the liquid. Regarding the coating method, a general method can be used. There are no particular limitations on the method, and the method can be appropriately selected according to the purpose. Examples thereof include a roll coating method, a bar coating method, a dip coating method, a spin coating method, a casting method, a die coating method, a blade coating method, a gravure coating method, a curtain coating method, a spray coating method, and a doctor coating method.

Figure 2:
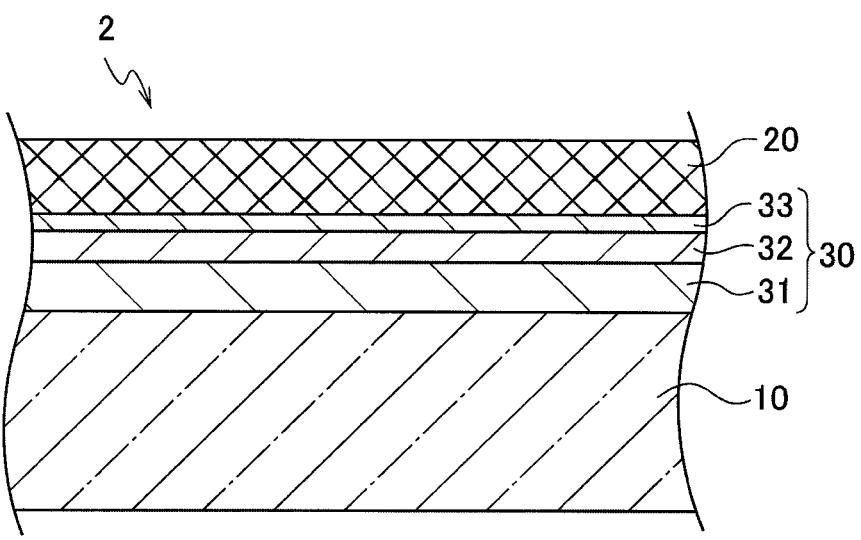
FIG. 2 is a schematic cross-sectional diagram of a conductive member according to a second embodiment of the invention.

FIG. 1 and FIG. 2 are schematic cross-sectional diagrams illustrating conductive members 1 and 2 according to a first preferred exemplary embodiment and a second preferred exemplary embodiment of the invention, respectively. In FIG. 1, included between a base material 10 and a conductive layer 20 is an intermediate layer 30 including: a first adhesive layer 31 having excellent affinity with the base material 10; and a second adhesive layer 32 having excellent affinity with the conductive layer 20.

In FIG. 2, included between a base material 10 and a conductive layer 20 is an intermediate layer 30 configured to include a functional layer 33 adjacent to the conductive layer 20, in addition to the first adhesive layer 31 and the second adhesive layer 32 similar to the first exemplary embodiment. The intermediate layer 30 as used in the present specification refers to a layer configured to include at least one layer selected from the first adhesive layer 31, the second adhesive layer 32, and the functional layer 33.

Figure 3:
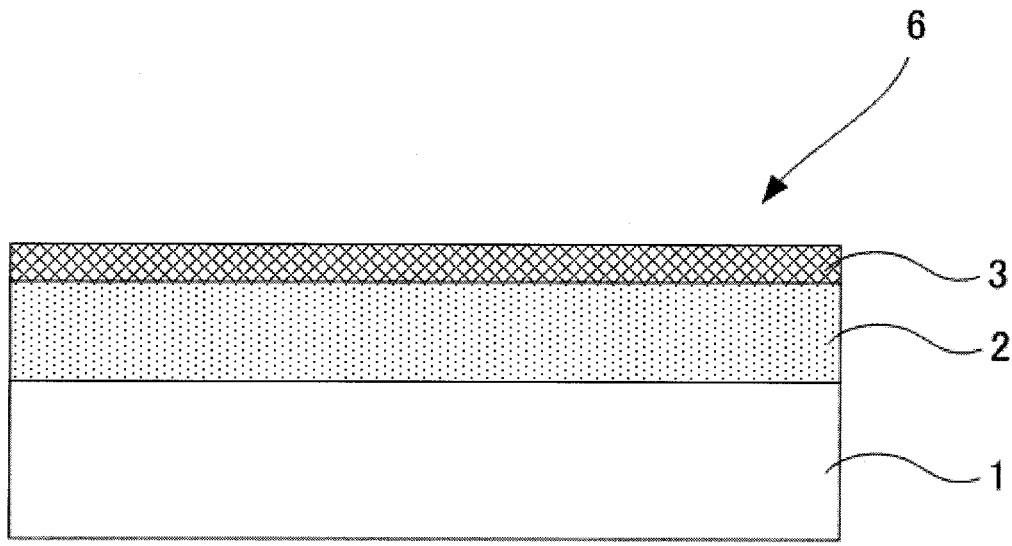
FIG. 3 is a schematic cross-sectional diagram of a conductive member according to a third embodiment of the invention.
Figure 4:
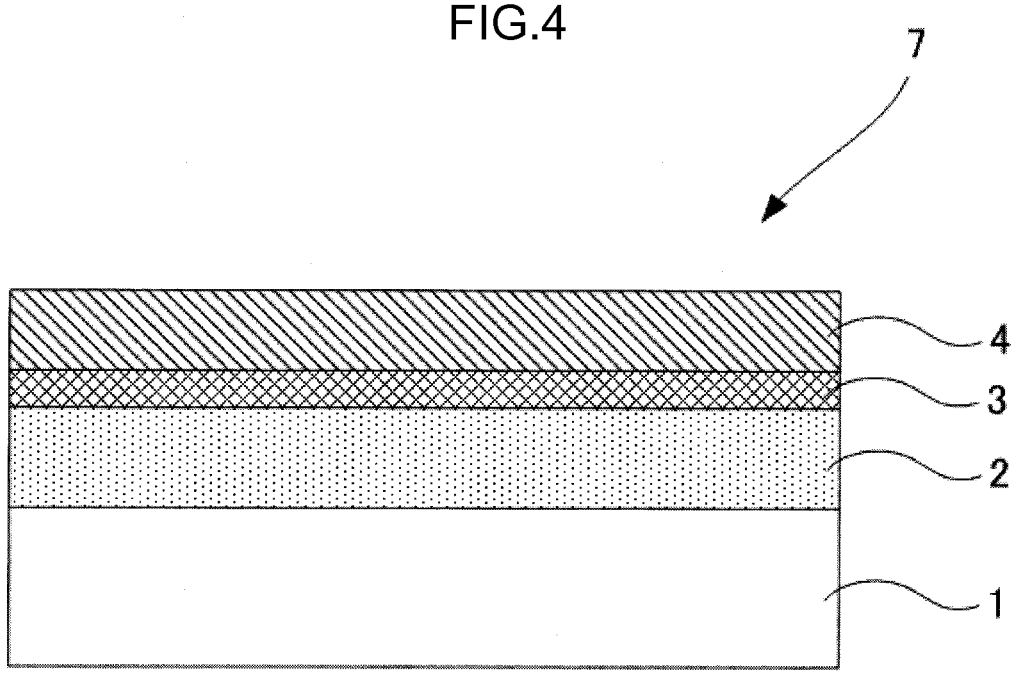
FIG. 4 is a schematic cross-sectional diagram of a conductive member according to a fourth embodiment of the invention.

FIG. 3 and FIG. 4 are schematic cross-sectional diagrams illustrating conductive members 6 and 7 according to a third preferred exemplary embodiment and a fourth preferred exemplary embodiment, respectively. Here, the conductive member 6 of FIG. 3 includes a base material 10, and a cushion layer 12 and a conductive layer 3 in this order on one surface of the base material 10. Furthermore, the conductive member 7 of FIG. 4 is a conductive member in which an adhesive layer 4 is provided on the conductive layer 3 in connection with the conductive member 6 of FIG. 3.

The conductive member 6 according to the third preferred exemplary embodiment of the invention is described in detail.

The conductive member 6 includes, on the base material 10, the cushion layer 12 and the conductive layer 3 containing metal conductive fibers in this order, and may further include other layers as necessary.

The average thickness of the cushion layer 12 is from 1 µm to 50 µm, and preferably from 5 µm to 20 µm. When the average thickness of the cushion layer 12 is less than 1 µm, there are cases in which transfer uniformity and followability to the surface asperities are impaired, and when the average thickness is more than 50 µm, there are cases in which the curl balance of the conductive member 3 is deteriorated.

The shape, structure, size or the like is not particularly limited as long as the conductive member has the configurations described above, and can be appropriately selected according to the purpose. Examples of the shape include a film form and a sheet form, and examples of the structure include a single layer structure and a layered structure. The size can be appropriately selected according to the use or the like.

It is preferable that the conductive member is flexible and transparent, and transparency includes colorless transparency, as well as colored transparency, translucency and colored translucency.

(Cushion Layer)

When the conductive member has the cushion layer, no disconnecting occurs when the conductive layer is provided over the surface asperities on the substrate side, whereby the followability to surface asperities is enhanced.

The shape, structure, size or the like of the cushion layer is not particularly limited, and can be appropriately selected according to the purpose. Examples of the shape include a film form and a sheet form. Examples of the structure include a single layer structure and a layered structure. The size can be appropriately selected according to the use or the like.

The cushion layer is a layer that accomplishes the role of enhancing transferability to a transfer-receiving body, and the cushion layer contains at least a polymer and may further contain other components as necessary.

(Polymer Contained in Cushion Layer)

The polymer contained in the cushion layer is not particularly limited as long as it is a polymer that softens at the time of heating, and can be appropriately selected according to the purpose. For example, a thermoplastic resin may be used. Examples of the thermoplastic resin include an acrylic resin, a styrene-acrylic copolymer, polyvinyl alcohol, polyethylene, an ethylene-vinyl acetate copolymer, an ethylene-ethyl acrylate copolymer, an ethylene-methacrylic acid copolymer, polyvinyl chloride gelatin; cellulose esters such as cellulose nitrate, cellulose triacetate, cellulose diacetate, cellulose acetate butyrate, and cellulose acetate propionate; homopolymers or copolymers containing vinylidene chloride, vinyl chloride, styrene, acrylonitrile, vinyl acetate, alkyl (carbon number of 1-4) acrylate, vinylpyrrolidone or the like; soluble polyesters, polycarbonates, and soluble polyamides. These may be used singly, or two or more kinds may be used in combination.

The glass transition temperature of the cushion layer is preferably from 40° C. to 150° C., and more preferably from 90° C. to 120° C. When the glass transition temperature is lower than 40° C., there is a case in which the cushion layer is excessively soft at room temperature, and handling ability is poor. When the glass transition temperature is higher than 150° C., there is a case in which the cushion layer is not softened in a thermal lamination method, and transferability of the conductive layer is poor. The glass transition temperature may be adjusted by adding a plasticizer or the like.

Examples of the other components include the organic polymer materials described in paragraph [0007] and thereafter of JP-A No. H05-72724; various plasticizers for adjusting the adhesive force to the base material, overcooling materials, adhesion improving agents, fillers, oxidation inhibitors, surfactants, mold releasing agents, thermal polymerization inhibitors, viscosity adjusting agents, and solvents.

The cushion layer can be formed by applying, onto a base material, a coating liquid for a cushion layer containing the polymer and optionally the other components described above, and drying the coating liquid.

The coating method is not particularly limited, and can be appropriately selected according to the purpose. Examples thereof include a roll coating method, a bar coating method, a dip coating method, a spin coating method, a casting method, a die coating method, a blade coating method, a gravure coating method, a curtain coating method, a spray coating method, and a doctor coating method.

Since the conductive member according to the invention exhibits excellent conductivity and transparency and has low surface resistance, when exposed to harsh conditions such as high temperature or high humidity, the conductive member is widely applicable to, for example, touch panels, electrodes for displays, electromagnetic wave shields, electrodes for organic EL displays, electrodes for inorganic EL displays, electronic papers, electrodes for flexible displays, integrated type solar cells, liquid crystal display devices, display devices with touch panel functions, and other various devices. Among these, application to touch panels is particularly preferred.

(Touch Panel)

The conductive member according to the invention is applied, for example, to a surface type electrostatic capacitance system touch panel, a transmission type electrostatic capacitance system touch panel, and a resistant film type touch panel. Here, the touch panel includes so-called touch sensors and touch pads.

It is preferable that the layer configuration of the touch panel sensor electrode unit in the touch panel is any of a bonding system of bonding two sheets of transparent electrodes, a system including transparent electrodes on both surfaces of one sheet of base material, a single-surface jumper or through-hole system, and a single-surface lamination system.

The surface type electrostatic capacitance system touch panel is described in, for example, Japanese National-Phase Publication No. 2007-533044.

(Solar Cell)

The conductive member according to the invention is useful as a transparent electrode in an integrated type solar cell (hereinafter, also referred to as solar cell device).

There are no particular limitations on the integrated type solar cell, and those generally used as solar cell devices can be used. Examples thereof include a single crystal silicon-based solar cell device, a polycrystalline silicon-based solar cell device, an amorphous silicon-based solar cell device configured in a single bonded type or a tandem structure type, a Group III-V compound semiconductor solar cell device of gallium-arsenic (GaAs), indium-phosphor (InP) or the like, a Group II-VI compound semiconductor solar cell device of cadmium-tellurium (CdTe) or the like, a Group compound semiconductor solar cell device of a copper/indium/selenium system (so-called CIS system), a copper/indium/gallium/selenium system (so-called CIGS system), a copper/indium/gallium/selenium/sulfur system (so-called CIGSS system) or the like, a dye-sensitized solar cell device, and an organic solar cell device. Among these, in the invention, it is preferable that the solar cell device is an amorphous silicon-based solar cell device configured in a tandem structure type or the like, and a Group compound semiconductor solar cell device of a copper/indium/selenium system (so-called CIS system), a copper/indium/gallium/selenium system (so-called CIGS system), a copper/indium/gallium/selenium/sulfur system (so-called CIGSS system) or the like.

In the case of the amorphous silicon-based solar cell device configured in a tandem structure type or the like, amorphous silicon or finely crystalline silicon thin film layer, and a thin film in which Ge is contained in addition to these, and a tandem structure having two or more layers thereof are used as the photoelectric conversion layer. Film formation is carried out using plasma CVD or the like.

The conductive member according to the invention can be applied to all the solar cell devices described above. The conductive member may be included in any part of a solar cell device, but it is preferable that the conductive layer be disposed adjacent to the photoelectric conversion layer. In regard to the positional relationship with the photoelectric conversion layer, the configurations described below are preferred, but the invention is not intended to be limited to these. Furthermore, the configurations described below do not describe all the parts that form a solar cell device, but are described to the extent that the positional relationship of the transparent conductive layer is understood. Here, the configuration indicated inside brackets "[ ]" corresponds to the conductive member according to the invention.

(A) [Base material-conductive layer]-photoelectric conversion layer (B) [Base material-conductive layer]-photoelectric conversion layer-[conductive layer-base material]

(C) Substrate-electrode-photoelectric conversion layer-[conductive layer-base material]

(D) Back surface electrode-photoelectric conversion layer-[conductive layer-base material]

The details of such a solar cell are described in, for example, JP-A No. 2010-87105.

EXAMPLES

Hereinafter, Examples of the invention are described, but the invention is not intended to be limited to these Examples. The expressions "percent (%)" and "parts" indicated as content ratios in the Examples are all on a mass basis. In addition, an additive liquid described in the following Examples can be prepared as an additive liquid in any arbitrary amount by scaling-up or scaling-down of the volume while maintaining the composition ratio.

In the following Examples, the average diameter (average minor axis length) and average major axis length of metal nanowires, the coefficient of variation of the average minor axis length, and the proportion of silver nanowires having an aspect ratio of 50 or greater were measured as described below.

<Average Diameter (Average Minor Axis Length) and Average Major Axis Length of Metal Nanowires>

The diameters (average minor axis lengths) and the major axis lengths of 300 metal nanowires randomly selected from metal nanowires that were observed under magnification using a transmission electron microscope (TEM; manufactured by JEOL, Ltd., JEM-2000FX) were measured, and from the average values, the average diameter (average minor axis length) and the average major axis length of the metal nanowires were determined.

<Coefficient of Variation of Average Minor Axis Length (Diameter) of Metal Nanowires>

The coefficient of variation was determined by measuring the average minor axis length (diameter) of 300 nanowires randomly selected from the electron microscopic (TEM) images, and calculating the standard deviation and the average value for the 300 nanowires.

<Proportion of Silver Nanowires Having Aspect Ratio of 50 or Greater>

The average minor axis length of silver nanowires was determined by observing 300 silver nanowires using a transmission electron microscope (TEM; manufactured by JEOL, Ltd., JEM-2000FX), and measuring the amount of silver that had penetrated through a filter paper, and the proportion of silver nanowires having an average minor axis length of 50 nm or less and an average major axis length of 5 μm or more was determined as the proportion (%) of silver nanowires having an aspect ratio of 50 or greater.

Separation of the silver nanowires at the time when the proportion of silver nanowires was determined, was carried out using a membrane filter (manufactured by Millipore Corp., FALP 02500, pore size: 1.0 μm).

Preparation Example 1

Preparation of Silver Nanowire-Dispersion Liquid

The following additive liquids A, G and 1-1 were prepared in advance.

[Additive Liquid A]

0.51 g of a silver nitrate powder was dissolved in 50 mL of pure water. Thereafter, 1 N aqueous ammonia was added thereto until the solution turned transparent. Then, pure water was added thereto such that the entire amount was 100 mL.

[Additive Liquid G]

0.5 g of a glucose powder was dissolved in 140 mL of pure water, and thus additive liquid G was prepared.

[Additive Liquid H]

0.5 g of a HTAB (hexadecyltrimethylammonium bromide) powder was dissolved in 27.5 mL of pure water, whereby additive liquid H was prepared.

Next, a silver nanowire-dispersion liquid was prepared as described below.

410 mL of pure water was introduced into a three-necked flask, and while the content of the flask was stirred at 20° C., 82.5 mL of the additive liquid H and 206 mL of the additive liquid G were added using a funnel (first stage). To this liquid, 206 mL of the additive liquid A was added at a flow rate of 2.0 mL/min and at a rotation rate of stirring of 800 rpm (second stage). After 10 minutes had passed, 82.5 mL of the additive liquid H was added thereto (third stage). Thereafter, the temperature was increased to an internal temperature of 73° C. at a rate of 3° C./min. Thereafter, the rate rotation of stirring was decreased to 200 rpm, and the content of the flask was heated for 5.5 hours.

The aqueous dispersion liquid thus obtained was cooled down, and then an ultrafiltration module SIP1013 (manufactured by Asahi Kasei Chemicals Corp., cut-off molecular weight: 6,000), a magnet pump, and a stainless steel cup were connected with tubes made of silicone to prepare an ultrafiltration apparatus.

A silver nanowire-dispersion liquid (aqueous dispersion liquid) was introduced into the stainless steel cup, and ultrafiltration was performed by operating the pump. At the time point when 50 mL of the filtrate from the module was collected, 950 mL of distilled water was added to the stainless steel cup, and washing was carried out. The aforementioned washing was repeated until the conductivity was 50 μS/cm or less, and then concentration as carried out, whereby a 0.78% aqueous dispersion liquid of silver nanowire was obtained.

With respect to the silver nanowires of Preparation Example 1 thus obtained, the average minor axis length, the average major axis length, the proportion of silver nanowires having an aspect ratio of 50 or greater, and the coefficient of variation of the silver nanowire-average minor axis length were measured as described above.

As a result, silver nanowires having an average minor axis length of 17.2 nm, an average major axis length of 34.2 μm and a coefficient of variation of 17.8% were obtained. Among the silver nanowires thus obtained, the proportion of silver nanowires having an aspect ratio of 50 or greater was 82.5%. Hereinafter, when it is described as "silver nanowire-aqueous dispersion liquid", it indicates an aqueous dispersion liquid of silver nanowire obtained by the method described above.

(Quantification of Glucose in Silver Nanowire-Dispersion Liquid)

1 Mol/L nitric acid was added to the silver nanowire-dispersion liquid obtained in Preparation Example 1 to dissolve silver nanowires. Furthermore, 0.1 Mol/L aqueous ammonia was added thereto to adjust the pH to 7. The solution was concentrated under reduced pressure, and then the residual amount of glucose in the solution thus obtained was quantitatively measured using an enzymatic method glucose analysis kit (TC Sucrose/D-Glucose/D-Fructose manufactured by Roche Diagnostics GmbH). The residual amount of glucose was 0.002% per metal conductive fibers.

Preparation Example 2

Pretreatment of Glass Substrate

An alkali-free glass plate having a thickness of 0.7 µm was immersed in a 1% aqueous solution of sodium hydroxide, and irradiation with ultrasonic waves was performed for 30 minutes using an ultrasonic cleaning machine. Subsequently, the glass plate was washed with ion-exchanged water for 60 seconds, and then was subjected to a heating treatment for 60 minutes at 200° C. Subsequently, a silane coupling liquid (a 0.3% aqueous solution of N-β-(aminoethyl)-γ-aminopropyl-trimethoxysilane, trade name: KBM603, manufactured by Shin-Etsu Chemical Co., Ltd.) was sprayed thereon for 20 seconds by showering, and the glass plate was shower-washed with pure water. Hereinafter, when it is described as "glass substrate", it indicates an alkali-free glass substrate obtained by the pretreatment described above.

Preparation Example 3

Production of PET Substrate 101 Having Configuration Illustrated in FIG. 1

An adhesion solution 1 having the following composition was prepared.
[Adhesion Solution 1]

| | |
|---|---|
| TAKELAC WS-4000 (polyurethane for coating, solid content concentration: 30%, manufactured by Mitsui Chemicals Corp.) | 5.0 parts |
| Surfactant (NAROACTY HN-100, manufactured by Sanyo Chemical Industries, Ltd.) | 0.3 parts |
| Surfactant (SANDET BL, solid content concentration: 43%, manufactured by Sanyo Chemical Industries, Ltd.) | 0.3 parts |
| Water | 94.4 parts |

One surface of a PET film (base material 10) having a thickness of 125 µm was subjected to a corona discharge treatment, and onto the surface that had been subjected to a corona discharge treatment, the adhesion solution 1 described above was applied and dried for 2 minutes at 120° C., whereby a first adhesive layer 31 having a thickness of 0.11 µm was formed.

An adhesion solution 2 having the following composition was prepared.
[Adhesion Solution 2]

| | |
|---|---|
| Tetraethoxysilane (KBE-04, manufactured by Shin-Etsu Chemical Co., Ltd.) | 5.0 parts |
| 3-Glycidoxypropyltrimethoxysilane (KBM-403, manufactured by Shin-Etsu Chemical Co., Ltd.) | 3.2 parts |
| 2-(3,4-Epoxycyclohexyl)ethyltrimethoxysilane (KBM-303, manufactured by Shin-Etsu Chemical Co., Ltd.) | 1.8 parts |
| Aqueous solution of acetic acid (acetic acid concentration = 0.05%, pH = 5.2) | 10.0 parts |
| Curing agent (boric acid, manufactured by Wako Pure Chemical Industries, Ltd.) | 0.8 parts |
| Colloidal silica (SNOWTEX O, average particle size: 10 nm to 20 nm, solid content concentration: 20%, pH = 2.6, manufactured by Nissan Chemical Industries Co., Ltd.) | 60.0 parts |
| Surfactant (NAROACTY HN-100, manufactured by Sanyo Chemical Industries, Ltd.) | 0.2 parts |
| Surfactant (SANDET BL, solid content concentration: 43%, manufactured by Sanyo Chemical Industries, Ltd.) | 0.2 parts |

The adhesion solution 2 was prepared by the following method. While the aqueous solution of acetic acid was agitated vigorously, 3-glycidoxypropyltrimethoxysilane was added dropwise to this aqueous solution of acetic acid over 3 minutes. Subsequently, 2-(3,4-epoxycyclohexyl)ethyltrimethoxysilane was added to the aqueous solution of acetic acid over 3 minutes while agitating vigorously. Subsequently, tetramethoxysilane was added to the aqueous solution of acetic acid over 5 minutes while agitating vigorously, and thereafter, the mixture was continuously agitated for another 2 hours. Next, colloidal silica, the curing agent, and the surfactants were sequentially added thereto, whereby an adhesion solution 2 was prepared.

The surface of the first adhesive layer 31 described above was subjected to a corona discharge treatment, and then the adhesion solution 2 was applied onto the surface by a bar coating method. Heating at 170° C. for one minute was performed for drying, to form a second adhesive layer 32 having a thickness of 0.5 µm was formed, whereby a PET substrate 101 having the configuration illustrated in FIG. 1 was obtained.

Example 1 and Comparative Example 1

Production of Conductive Member 1-1

A solution containing an alkoxysilane compound having the following composition (hereinafter, also called a sol-gel solution) was agitated at 60° C. for one hour, and it was confirmed that the solution became uniform.

An aqueous solution of compound 2-10 was mixed with 3.44 parts of the sol-gel solution thus obtained and 16.56 parts of the silver nanowire-aqueous dispersion liquid obtained in Preparation Example 1 as described above, such that the proportion of the compound 2-10 was 9% with respect to silver nanowires.

Furthermore, the mixture was diluted with distilled water and 1-propanol, whereby a conductive layer-coating liquid 1-1 having a silver concentration of 0.25% and a 1-propanol concentration of 30% was prepared. The surface of the second adhesive layer 32 of the PET substrate 101 was subjected to a corona discharge treatment, and the conductive layer-coating liquid 1-1 was applied onto the surface by a bar coating method such that the amount of silver was 0.012 g/m$^2$, and the total solid content coating amount was 0.096 g/m$^2$. Subsequently, drying at 140° C. for one minute was performed to proceed a sol-gel reaction, whereby a conductive layer 20 was formed. In this manner, a conductive member 1-1 having the configuration illustrated in the cross-sectional diagram of FIG. 1 was obtained. The mass ratio of compound (II)/metal conductive fibers in the conductive layer was 7.0/1.

<Solution of Alkoxysilane Compound>

| | |
|---|---|
| Tetraethoxysilane (compound (II)) (KBE-04, manufactured by Shin-Etsu Chemical Co., Ltd.) | 5.0 parts |
| 1% Aqueous solution of acetic acid | 10.0 parts |
| Distilled water | 4.2 parts |

(Production of Conductive Members 1-2 to 1-73)

Conductive member 1-2 which is outside the scope of the invention was produced according to a method that was different from the production method for the conductive member 1-1, only in that the compound 2-10 was not added at the time of preparing the conductive layer-coating liquid.

Furthermore, conductive members 1-3 to 1-52 of the invention were produced by a method that was different from the production method for the conductive member 1-1, only in that the kind and amount of addition (indicated as percent (%) by mass with respect to silver nanowires) of the compound represented by Formula (1) or Formula (2) according to the invention to be added were changed as described in Table 1 or Table 2.

Also, conductive members 1-53 to 1-62 of the invention were produced, in which, in addition to the compound represented by Formula (1) or Formula (2), compounds A-1 to A-4 described below were added (the kind and amount of addition are described in Table 1) as the compound capable of adsorbing to a metal or as the compound capable of coordinating with a metal ion in the invention.

Furthermore, conductive members 1-63 to 1-67 were produced using C-1, C-2, C-3 or C-4 described below in the amount of addition indicated in Table 1, instead of the compound represented by Formula (1) or Formula (2). Also, conductive members 1-68 to 1-72 were obtained using A-1, A-2, A-3 or A-4 in the amount of addition indicated in Table 1 as the compound capable of adsorbing to a metal or the compound capable of coordinating with a metal ion, without adding the compound represented by Formula (1) or Formula (2).

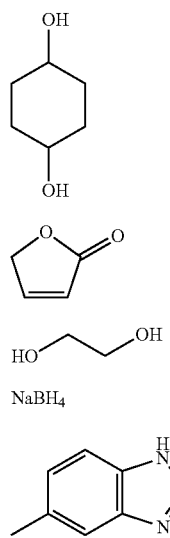

C-1
C-2
C-3
C-4
A-1

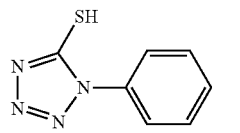

A-2

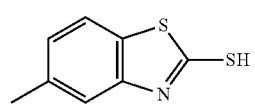

A-3

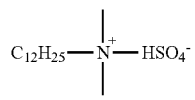

A-4

(Production of Conductive Member 1-73)

A silver nanowire-aqueous dispersion liquid was prepared by the method described in Example 1 of JP-A No. 2010-84173. Residual glucose was quantitatively determined by the same method for quantitatively determining glucose in the silver nanowire-dispersion liquid obtained in Preparation Example 1 in the invention, and the amount was found to be 0.003% per metal conductive fibers.

Conductive member 1-73 as a Comparative Example was produced in the same manner as in the case of conductive member 1-2 of the invention, using the dispersion liquid described above.

<Evaluation>

The following evaluations were carried out with respect to each of the conductive members thus obtained. The results are shown in Table 1 to Table 2.

<Conductivity (Surface Resistance)>

The surface resistance value of each of the conductive members was measured using LORESTA-GP MCP-T600 manufactured by Mitsubishi Chemical Corp., and the surface resistance value was rated according to the criteria described below.

5: A surface resistance value of from 150 Ω/Square to less than 165 Ω/Square, which is a pre-eminent level 4: A surface resistance value of from 165 Ω/Square to less than 180 Ω/Square, which is an excellent level 3: A surface resistance value of from 180 Ω/Square to less than 200 Ω/Square, which is an acceptable level 2: A surface resistance value of from 200 Ω/Square to less than 250 Ω/Square, which is a problematic level 1: A surface resistance value of 250 Ω/square or greater, which is a very problematic level <Optical Characteristics (Total Light Transmittance)>

The total light transmittance (%) of each of the conductive members was measured using HAZE-GARD PLUS manufactured by Paul N. Gardner Co., Inc. Measurement was carried out at a measurement angle of 0° with respect to the CIE luminosity function y under C light source, and the results were rated according to the following criteria.

A: A transmittance of 90% or higher, which is a favorable level

B: A transmittance of from 85% to lower than 90%, which is a slightly problematic level <Optical Characteristics (Haze)>

The haze value of each of the conductive members was measured using a HAZE-GARD PLUS manufactured by Paul N. Gardner Co., Inc.

(Evaluation of Weather Resistance)

As an evaluation of weather resistance for each of the conductive members, heat resistance, moist-heat resistance, and ozone resistance were measured by the measurement methods described below.

<Heat Resistance>

For each of the conductive members, a forced heating treatment was carried out in an oven at 170° C. for 90 minutes using a dry oven OFW-600 manufactured by As One Corp. Heat resistance of each of the conductive members was evaluated by measuring the surface resistance value (RDT) of each of the conductive members after the heating treatment according to the method described above, and determining the change ratio (RDT/R0) of the surface resistance value with respect to the surface resistance value before the heating treatment (R0). Then, the conductive members were rated according to the following criteria.

Grade 5: A change ratio of the surface resistance value of less than 10%, which is a very preferred level Grade 4: A change ratio of the surface resistance value of from 10% to less than 20%, which is a preferred level Grade 3: A change ratio of the surface resistance value of from 20% to less than 35%, which is an acceptable level Grade 2: A change ratio of the surface resistance value of from 35% to less than 50%, which is a slightly problematic level Grade 1: A change ratio of the surface resistance value of 50% or greater, which is a problematic level <Moist-Heat Resistance>

For each of the conductive members, a forced moist-heat treatment was carried out by leaving the conductive members for 240 hours in an environment at 85° C. and 85% RH using a small-sized environmental testing machine SH-241 manufactured by Espec Corp. Moist-heat resistance of each of the conductive members was evaluated by measuring the surface resistance value (RWT) of each of the conductive members before and after the forced moist-heat treatment according to the method described above, and determining the change ratio (RWT/R0) with respect to the surface resistance value (R0) before the forced moist-heat treatment. Then, the conductive members were rated according to the following criteria.

Grade 5: A change ratio of the surface resistance value of less than 10%, which is a very preferred level Grade 4: A change ratio of the surface resistance value of from 10% to less than 20%, which is a preferred level Grade 3: A change ratio of the surface resistance value of from 20% to less than 35%, which is an acceptable level Grade 2: A change ratio of the surface resistance value of from 35% to less than 50%, which is a slightly problematic level Grade 1: A change ratio of the surface resistance value of 50% or greater, which is a problematic level <Ozone Resistance>

Ozone resistance of each of the conductive members was evaluated by exposing each of the conductive members to an environment at 25° C. with an ozone amount of 10 ppm for 4 hours, measuring the surface resistance value (ROT) of each of the conductive members before and after the treatment according to the method described above, and determining the change ratio (ROT/R0) with respect to the surface resistance value (R0) before the exposure to ozone. Then, the conductive members were rated according to the following criteria.

Grade 5: A change ratio of the surface resistance value of from 100% to less than 150%, which is a very preferred level Grade 4: A change ratio of the surface resistance value of from 150% to less than 200%, which is a preferred level Grade 3: A change ratio of the surface resistance value of from 200% to less than 350%, which is an acceptable level Grade 2: A change ratio of the surface resistance value of from 350% to less than 500%, which is a slightly problematic level Grade 1: A change ratio of the surface resistance value of 500% or greater, which is a problematic level

TABLE 1

| Conductive member | Compound of Formula (1) or Formula (2) Compound | Amount of addition (%) | Metal-adsorbable/ coordinatable compound Compound | Amount of addition (%) | Relationship with invention | Conductivity rating | Total light transmittance grade | Haze value (%) | Heat resistance rating | Moist-heat resistance rating | Ozone resistance rating |
|---|---|---|---|---|---|---|---|---|---|---|---|
| 1-1  | 2-10  | 9    | — | — | Invention           | 5 | A | 1.06 | 4 | 4 | 5 |
| 1-2  | —     | —    | — | — | Comparative Example | 5 | A | 1.05 | 1 | 1 | 2 |
| 1-3  | 2-14  | 9    | — | — | Invention           | 5 | A | 1.06 | 4 | 4 | 5 |
| 1-4  | 2-26  | 9    | — | — | Invention           | 5 | A | 1.06 | 4 | 3 | 4 |
| 1-5  | 3-1   | 9    | — | — | Invention           | 5 | A | 1.05 | 4 | 4 | 4 |
| 1-6  | 3-19  | 9    | — | — | Invention           | 5 | A | 1.05 | 4 | 4 | 4 |
| 1-7  | 4-1   | 9    | — | — | Invention           | 5 | A | 1.05 | 4 | 4 | 4 |
| 1-8  | 4-18  | 9    | — | — | Invention           | 5 | A | 1.05 | 4 | 4 | 3 |
| 1-9  | 5-7   | 9    | — | — | Invention           | 5 | A | 1.06 | 4 | 3 | 3 |
| 1-10 | 5-13  | 9    | — | — | Invention           | 5 | A | 1.04 | 4 | 3 | 4 |
| 1-11 | 6-2   | 9    | — | — | Invention           | 5 | A | 1.05 | 4 | 3 | 3 |
| 1-12 | 6-18  | 9    | — | — | Invention           | 5 | A | 1.05 | 3 | 3 | 3 |
| 1-13 | 7-21  | 9    | — | — | Invention           | 5 | A | 1.05 | 4 | 4 | 5 |
| 1-14 | 7-22  | 9    | — | — | Invention           | 5 | A | 1.04 | 4 | 4 | 4 |
| 1-15 | 7-23  | 9    | — | — | Invention           | 5 | A | 1.05 | 4 | 4 | 4 |
| 1-16 | 8-12  | 9    | — | — | Invention           | 5 | A | 1.05 | 4 | 4 | 4 |
| 1-17 | 8-16  | 9    | — | — | Invention           | 5 | A | 1.06 | 4 | 4 | 4 |
| 1-18 | 9-17  | 9    | — | — | Invention           | 5 | A | 1.05 | 3 | 3 | 3 |
| 1-19 | 9-18  | 9    | — | — | Invention           | 5 | A | 1.05 | 4 | 3 | 4 |
| 1-20 | 10-4  | 9    | — | — | Invention           | 5 | A | 1.06 | 4 | 3 | 4 |
| 1-21 | 10-8  | 9    | — | — | Invention           | 5 | A | 1.04 | 3 | 4 | 4 |
| 1-22 | 11-4  | 0.07 | — | — | Comparative Example | 5 | A | 1.04 | 2 | 2 | 2 |

TABLE 1-continued

| Conductive member | Compound of Formula (1) or Formula (2) | | Metal-adsorbable/ coordinatable compound | | Relationship with invention | Optical characteristics | | | | | |
|---|---|---|---|---|---|---|---|---|---|---|---|
| | Compound | Amount of addition (%) | Compound | Amount of addition (%) | | Conductivity rating | Total light transmittance grade | Haze value (%) | Heat resistance rating | Moist-heat resistance rating | Ozone resistance rating |
| 1-23 | 11-4 | 0.3 | — | — | Invention | 5 | A | 1.04 | 4 | 4 | 4 |
| 1-24 | 11-4 | 1 | — | — | Invention | 5 | A | 1.04 | 5 | 4 | 5 |
| 1-25 | 11-4 | 9 | — | — | Invention | 5 | A | 1.05 | 5 | 5 | 5 |
| 1-26 | 11-4 | 40 | — | — | Invention | 5 | A | 1.05 | 5 | 4 | 4 |
| 1-27 | 11-4 | 70 | — | — | Invention | 5 | A | 1.06 | 5 | 4 | 4 |
| 1-28 | 11-4 | 150 | — | — | Invention | 5 | A | 1.06 | 4 | 4 | 4 |
| 1-29 | 11-4 | 750 | — | — | Invention | 5 | A | 1.08 | 4 | 4 | 4 |
| 1-30 | 11-4 | 1200 | — | — | Comparative Example | 4 | B | 1.15 | 3 | 2 | 2 |
| 1-31 | 11-5 | 9 | — | — | Invention | 5 | A | 1.04 | 5 | 5 | 5 |
| 1-32 | 12-6 | 9 | — | — | Invention | 5 | A | 1.05 | 5 | 5 | 4 |
| 1-33 | 12-7 | 1 | — | — | Invention | 5 | A | 1.04 | 5 | 4 | 4 |
| 1-34 | 12-7 | 3 | — | — | Invention | 5 | A | 1.04 | 5 | 5 | 5 |
| 1-35 | 12-7 | 9 | — | — | Invention | 5 | A | 1.05 | 5 | 5 | 5 |
| 1-36 | 12-7 | 40 | — | — | Invention | 4 | A | 1.06 | 5 | 4 | 3 |
| 1-37 | 12-2 | 9 | — | — | Invention | 5 | A | 1.05 | 5 | 4 | 4 |

TABLE 2

| Conductive member | Compound of Formula (1) or Formula (2) | | Metal-adsorbable/ coordinatable compound | | Relationship with invention | Optical characteristics | | | | | |
|---|---|---|---|---|---|---|---|---|---|---|---|
| | Compound | Amount of addition (%) | Compound | Amount of addition (%) | | Conductivity rating | Total light transmittance grade | Haze value (%) | Heat resistance rating | Moist-heat resistance rating | Ozone resistance rating |
| 1-38 | 12-8 | 9 | — | — | Invention | 5 | A | 1.05 | 5 | 4 | 5 |
| 1-39 | 13-1 | 3 | — | — | Invention | 5 | A | 1.04 | 5 | 4 | 4 |
| 1-40 | 13-1 | 9 | — | — | Invention | 5 | A | 1.04 | 5 | 4 | 4 |
| 1-41 | 13-1 | 20 | — | — | Invention | 5 | A | 1.06 | 5 | 5 | 4 |
| 1-42 | 13-4 | 9 | — | — | Invention | 5 | A | 1.04 | 5 | 4 | 4 |
| 1-43 | 13-7 | 9 | — | — | Invention | 5 | A | 1.05 | 5 | 4 | 4 |
| 1-44 | 14-1 | 9 | — | — | Invention | 5 | A | 1.05 | 5 | 4 | 4 |
| 1-45 | 14-2 | 9 | — | — | Invention | 5 | A | 1.06 | 5 | 4 | 4 |
| 1-46 | 14-3 | 9 | — | — | Invention | 5 | A | 1.05 | 5 | 4 | 4 |
| 1-47 | 15-1 | 9 | — | — | Invention | 5 | A | 1.05 | 3 | 3 | 4 |
| 1-48 | 15-2 | 9 | — | — | Invention | 5 | A | 1.06 | 3 | 4 | 4 |
| 1-49 | 16-1 | 9 | — | — | Invention | 5 | A | 1.05 | 4 | 3 | 4 |
| 1-50 | 16-2 | 9 | — | — | Invention | 5 | A | 1.05 | 3 | 3 | 4 |
| 1-51 | 17-10 | 9 | — | — | Invention | 5 | A | 1.05 | 3 | 4 | 4 |
| 1-52 | 17-11 | 9 | — | — | Invention | 5 | A | 1.05 | 3 | 4 | 4 |
| 1-53 | 2-10 | 9 | A-1 | 3 | Invention | 5 | A | 1.04 | 5 | 5 | 5 |
| 1-54 | 7-21 | 9 | A-1 | 3 | Invention | 5 | A | 1.04 | 5 | 5 | 5 |
| 1-55 | 12-7 | 9 | A-1 | 3 | Invention | 5 | A | 1.05 | 5 | 5 | 5 |
| 1-56 | 12-7 | 9 | A-1 | 40 | Invention | 4 | A | 1.07 | 5 | 5 | 5 |
| 1-57 | 12-7 | 9 | A-1 | 75 | Invention | 3 | A | 1.08 | 5 | 5 | 4 |
| 1-58 | 7-21 | 9 | A-2 | 3 | Invention | 5 | A | 1.04 | 5 | 5 | 5 |
| 1-59 | 7-23 | 9 | A-3 | 3 | Invention | 5 | A | 1.04 | 5 | 5 | 5 |
| 1-60 | 11-4 | 9 | A-4 | 3 | Invention | 5 | A | 1.04 | 5 | 5 | 5 |
| 1-61 | 12-7 | 9 | A-4 | 3 | Invention | 4 | A | 1.04 | 5 | 5 | 5 |
| 1-62 | 13-1 | 9 | A-4 | 3 | Invention | 5 | A | 1.04 | 5 | 5 | 5 |
| 1-63 | C-1 | 9 | — | — | Comparative Example | 5 | A | 1.10 | 2 | 2 | 2 |
| 1-64 | C-2 | 9 | — | — | Comparative Example | 5 | A | 1.05 | 2 | 1 | 2 |
| 1-65 | C-3 | 3 | — | — | Comparative Example | 5 | A | 1.05 | 2 | 2 | 2 |
| 1-66 | C-3 | 9 | — | — | Comparative Example | 4 | A | 1.06 | 3 | 2 | 2 |
| 1-67 | C-4 | 9 | — | — | Comparative Example | 3 | B | 1.10 | 1 | 2 | 2 |
| 1-68 | — | — | A-1 | 3 | Comparative Example | 5 | A | 1.05 | 4 | 3 | 3 |
| 1-69 | — | — | A-1 | 33 | Comparative Example | 3 | A | 1.06 | 2 | 4 | 2 |
| 1-70 | — | — | A-2 | 3 | Comparative Example | 5 | A | 1.04 | 4 | 2 | 2 |

TABLE 2-continued

| Conductive member | Compound of Formula (1) or Formula (2) | | Metal-adsorbable/ coordinatable compound | | Optical characteristics | | | | | | |
|---|---|---|---|---|---|---|---|---|---|---|---|
| | Compound | Amount of addition (%) | Compound | Amount of addition (%) | Relationship with invention | Conductivity rating | Total light transmittance grade | Haze value (%) | Heat resistance rating | Moist-heat resistance rating | Ozone resistance rating |
| 1-71 | — | — | A-3 | 3 | Comp Example | 5 | A | 1.05 | 4 | 2 | 2 |
| 1-72 | — | — | A-4 | 3 | Comparative Example | 4 | A | 1.04 | 3 | 2 | 2 |
| 1-73 | — | — | — | — | Comparative Example | 5 | A | 1.05 | 1 | 1 | 2 |

From Table 1 and Table 2, the following was understood. The conductive members 1-1, 1-3 to 1-21, 1-23 to 1-28, and 1-30 to 1-52 containing the compounds represented by Formula (1) or Formula (2) according to the invention exhibited less change in the resistivity at the time of high temperature storage and at the time of high temperature high humidity storage, favorable ozone resistance, and excellent weather resistance. Among them, those conductive members containing the compounds represented by Formula (1) according to the invention exhibited superior effects, and the conductive members containing the compounds of formulas (3), (4), (7), (8), (11), (12), (13) and (14) according to the invention exhibited even superior effects. It is understood that, among them, when the compounds of Formula (11) or (12) according to the invention were added in preferable amounts, a particularly excellent effect is exhibited. Furthermore, the conductive members 1-53 to 1-62 containing the compounds capable of adsorbing to a metal or the compounds capable of coordinating with a metal ion according to the invention, in addition to the compound represented by Formula (1) or Formula (2) according to the invention were most excellent in terms of the total performance of conductive members as compared with the case of adding only the compound represented by Formula (1) or Formula (2) according to the invention, in terms of the optical characteristics, heat resistance, moist-heat resistance, and ozone resistance.

It is understood that when the amount of addition of the compound according to the invention is less than 0.1% by mass (conductive member 1-22) or greater than 1000% by mass (conductive member 1-30) with respect to the metal conductive fibers, the effect of improving weather resistance is insufficient.

In regard to the conductive members 1-2 and 1-73 which are not the present invention, in which the compounds according to the invention were not added (glucose in a very small amount of less than 0.1% was incorporated during the process for producing metal conductive fibers), and the conductive members 1-63 to 1-67 containing comparative compounds which are not the present invention, the effect of improving weather resistance was insufficient.

Furthermore, in regard to the conductive members 1-68 to 1-72 that did not contain the compound represented by Formula (1) or Formula (2) according to the invention but contained the compound capable of adsorbing to a metal or compound capable of coordinating with a metal ion according to the invention, it is understood that a certain weather resistance-improving effect was exhibited, but the effect was insufficient as compared with the conductive members according to the invention.

Example 2 and Comparative Example 2

Evaluation of Minor Axis Length Dependency

A silver nanowire-aqueous dispersion liquid was prepared according to a method that was different from the method for preparing the silver nanowire-dispersion liquid described in Preparation Example 1, only in that the initial temperature of the mixture liquid of the first stage was changed from 20° C. to 24° C., and the silver nanowire-aqueous dispersion liquid thus obtained was designated as Ag-2. Furthermore, a silver nanowire-aqueous dispersion liquid was prepared according to a method that was different from the method for preparing the silver nanowire-dispersion liquid of Preparation Example 1, only in that the initial temperature of the mixture liquid of the first stage was changed from 20° C. to 28° C., and the silver nanowire-aqueous dispersion liquid thus obtained was designated as Ag-3.

For the silver nanowires contained in Ag-2 and Ag-3, the average minor axis length, the average major axis length, the proportion of silver nanowires having an aspect ratio of 50 or greater, and the coefficient of variation of the silver nanowire-minor axis length were measured as described above. As a result, the silver nanowires contained in Ag-2 had an average minor axis length of 27.6 nm, an average major axis length of 31.8 μm, and a coefficient of variation of the minor axis length of 25.2%, and the proportion of silver nanowires having an aspect ratio of 50 or greater among the silver nanowires thus obtained was 79.2%. Furthermore, the silver nanowires contained in Ag-3 had an average minor axis length of 33.6 nm, an average major axis length of 28.8 μm, and a coefficient of variation of the minor axis length of 27.5%, and the proportion of silver nanowires having an aspect ratio of 50 or greater among the silver nanowires thus obtained was 78.3%.

Conductive members 2-1 to 2-3 were produced according to a method that was different from the method for producing the conductive members 1-25, 1-2 and 1-35 of Example 1, only in that Ag-2 was used instead of Ag-1 as the silver nanowire-aqueous dispersion liquid. Furthermore, similarly, conductive members 2-4 to 2-6 were produced using Ag-3 as the silver nanowire-aqueous dispersion liquid.

For each of the conductive members 2-1 to 2-6 thus obtained, the same evaluations as those of Example 1 were carried out, and the evaluation results thus obtained are shown in Table 3. Furthermore, the evaluation results for the conductive members 1-25, 1-2 and 1-35 obtained in Example 1 as references are also shown in Table 3.

TABLE 3

| Conductive member | Silver nonwires | | Compound of Formula (1) or Formula (2) | | Relationship with invention | Conductivity rating | Optical characteristics | | | Heat resistance rating | Moist-heat resistance rating | Ozone resistance rating |
|---|---|---|---|---|---|---|---|---|---|---|---|---|
| | Dispersion liquid | Average minor axis length (nm) | Compound | Amount of addition (%) | | | Total light transmittance grade | Haze value (%) | | | | |
| 2-1 | Ag-2 | 27.60 | 11-4 | 9 | Invention | 5 | A | 1.43 | | 5 | 5 | 5 |
| 2-2 | Ag-2 | 27.60 | — | — | Comparative Example | 5 | A | 1.43 | | 2 | 2 | 2 |
| 2-3 | Ag-2 | 27.60 | 12-7 | 9 | Invention | 5 | A | 1.40 | | 5 | 5 | 5 |
| 2-4 | Ag-3 | 33.60 | 11-4 | 9 | Invention | 5 | A | 1.68 | | 5 | 5 | 5 |
| 2-5 | Ag-3 | 33.60 | — | — | Comparative Example | 5 | A | 1.70 | | 3 | 3 | 4 |
| 2-6 | Ag-3 | 33.60 | 12-7 | 9 | Invention | 5 | A | 1.70 | | 5 | 5 | 5 |
| 1-25 | Ag-1 | 17.20 | 11-4 | 9 | Invention | 5 | A | 1.05 | | 5 | 5 | 5 |
| 1-2 | Ag-1 | 17.20 | — | — | Comparative Example | 5 | A | 1.05 | | 1 | 1 | 2 |
| 1-35 | Ag-1 | 17.20 | 12-7 | 9 | Invention | 5 | A | 1.05 | | 5 | 5 | 5 |

From Table 3, it is understood that the effect of the invention is also effective for thicker silver nanowires having increased average minor axis lengths of silver nanowires. It is understood that, along with the increase in the average minor axis length of silver nanowires, heat resistance, moist-heat resistance and ozone resistance are improved in a conductive member that does not contain the compound according to the invention, however, such improvement is insufficient. It is also understood that when the average minor axis length of silver nanowires increases, the haze value increases, thus silver nanowires having a smaller average minor axis length exhibit more preferable optical characteristics as a transparent conductive film.

That is, it is understood that in order to realize more preferable optical characteristics as a transparent conductive film, it is effective to use silver nanowires having a shorter average minor axis length (that is, thinner), and as a means for improving heat resistance, moist-heat resistance and ozone resistance that are present at that time, the invention is particularly effective.

Example 3 and Comparative Example 3

Evaluation of Conductive Member after Patterning

For the conductive member 1-1 obtained in Example 1, patterning was carried out by the following method. First, a positive resist (photo-soluble composition) having the composition described below was provided on the conductive member 1-1 using a wire bar coater such that the dried film thickness was 2 Pre-baking was performed on a hot plate at 90° C. for 120 seconds, and then contact exposure was performed using a high pressure mercury lamp through an optical mask having a stripe pattern (line/space=50 µm/50 µm). The sample after exposure was subjected to the developing treatment described below to form a mask resist of line/space=50 µm/50 µm on the conductive layer, and then was subjected to the etching treatment process described below to dissolve the silver nanowires other than the mask resist-remaining part, whereby a stripe pattern of silver nanowires was formed. Furthermore, the mask resist was completely dissolved by applying the post-exposure and peeling development treatments that are described below.

Conditions for each of the process of the patterning process were as follows.

(Exposure)

Exposure was carried out with high pressure mercury lamp i-line (365 nm) under the condition of 150 mJ/cm$^2$ (illuminance: 20 mW/cm$^2$).

(Developing Treatment)

Puddle development was carried out for 90 seconds with a 0.4% by mass of aqueous solution of tetramethylammonium hydroxide (TMAH) (23° C.), and thus an exposed section was removed. Subsequently, washing by water was carried out for 90 seconds using pure water (23° C.), and after washing by water, the sample was dried at room temperature.

(Etching Treatment)

Etching was carried out for 90 seconds at 23° C. using an etching liquid A described below, and washing by water was carried out for 90 seconds with pure water (23° C.). Subsequently, washing by water was carried out for 90 seconds with pure water (23° C.), and after the washing by water, the sample was dried at room temperature.

—Etching Liquid A—

| | |
|---|---|
| Iron (III) ammonium ethylenediamine tetraacetate | 2.71 g |
| Disodium dihydrogen ethylenediamine tetraacetate dihydrate | 0.17 g |
| Ammonium thiosulfate (70% by mass) | 3.61 g |
| Sodium sulfite | 0.84 g |
| Glacial acetic acid | 0.43 g |
| Water was added to make up 1,000 mL | |

(Post-Exposure)

Exposure was carried out with high pressure mercury lamp i-line (365 nm) under the condition of 300 mJ/cm$^2$ (illuminance: 20 mW/cm$^2$).

(Peeling Development Treatment)

Exposed sections were removed by performing puddle development for 90 seconds with a 0.4% by mass of aqueous TMAH solution (23° C.). Subsequently, washing by water was carried out for 90 seconds with pure water (23° C.), and after washing by water, the sample was dried at room temperature.

In this manner, a silver nanowire-conductive pattern having a stripe pattern of line/space=50 µm/50 µm was formed. The patterned conductive member thus obtained was designated as conductive member 1-1P.

(Positive Resist Composition)

| | |
|---|---|
| Acrylic binder (A-1) | 11.0 parts by mass as solid content |
| Photosensitizer (TAS-200 manufactured by Toyo Gosei Co., Ltd.) | 6.2 parts by mass |
| EHPA-3150 (manufactured by Daicel Corp.) | 5.2 parts by mass |
| Adhesion promoting agent (KBM-403 manufactured by Shin-Etsu Chemical Co., Ltd.) | 0.1 parts by mass |
| Solvent PGMEA | 45.0 parts by mass |
| Solvent MFG | 32.5 parts by mass |

PGMEA: Propylene glycol monomethyl ether acetate
MEG: 1-Methoxy-2-propanol
TAS-200:

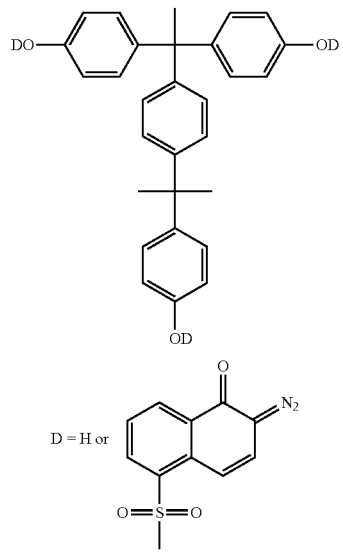

D = H or

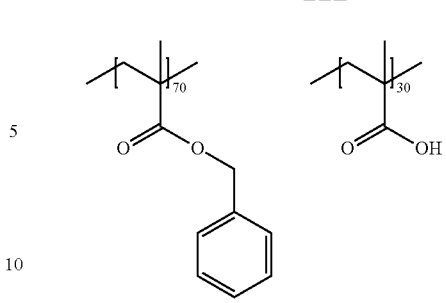

<Synthesis of Binder (A-1)>

7.79 g of methacrylic acid (MAA) and 37.21 g of benzyl methacrylate (BzMA) were used as monomer components that form a copolymer, and 0.5 g of azobisisobutyronitrile (AIBN) was used as a radical polymerization initiator. These were subjected to a polymerization reaction in 55.00 g of solvent, propylene glycol monomethyl ether acetate (PGMEA), and thus a PGMEA solution of a binder (A-1) represented by the following Formula (solid content concentration: 45% by mass) was obtained. The polymerization temperature was adjusted to a temperature of from 60° C. to 100° C.

Measurement was made using a gel permeation chromatographic method (GPC), and as a result, the weight average molecular weight (Mw) calculated with respect to polystyrene standards was 30,000, and the molecular weight distribution (Mw/Mn) was 2.21.

Conductive members 1-2P to 1-71P were produced by applying patterning to the conductive members 1-2 to 1-71 by the same method as the production method for the conductive member 1-1P.

These patterned conductive members were all observed with an optical microscope, and as a result, it was confirmed that favorable conductive patterns of approximately line/space=50 μm/50 μm had been formed.

An evaluation of weather resistance (heat resistance, moist-heat resistance and ozone resistance) was carried out for each of the conductive members according to the method described below. Here, regarding the measurement of the resistance value, five resistance values of the conductive line were measured for each of the conductive members using a prober connected to a tester, and then the average value was determined. The evaluation results are shown in Table 4 and Table 5.

(Evaluation of Heat Resistance)

Each of the samples was subjected to a forced heating treatment (170° C. for 90 minutes) in the same manner as in the evaluation of heat resistance in Example 1, and the ratio of resistance values before and after the forced heating was determined as a resistance increment. Then, the samples were rated in the same manner as in Example 1.

(Evaluation of Moist-Heat Resistance)

Each of the samples was subjected to a forced moist-heat treatment (85° C., 85% RH, 240 hours) in the same manner as in the evaluation of moist-heat resistance in Example 1, and the change ratio of the surface resistance values before and after the forced moist-heat treatment was determined. Then, the samples were rated in the same manner as in Example 1.

(Evaluation of Ozone Resistance)

Each of the samples was subjected to the same treatment as in the evaluation of ozone resistance in Example 1, and the change ratio of the surface resistance values before and after the treatment was determined. Then, the samples were rated in the same manner as in Example 1.

TABLE 4

| Conductive member | Compound of Formula (1) or Formula (2) | | Metal-adsorbable/ coordinatable compound | | Relationship with invention | Conductivity rating | Heat resistance rating | Moist-heat resistance rating | Ozone resistance rating |
|---|---|---|---|---|---|---|---|---|---|
| | Compound | Amount of addition (%) | Compound | Amount of addition (%) | | | | | |
| 1-1P | 2-10 | 9 | — | — | Invention | 5 | 4 | 3 | 4 |
| 1-2P | — | — | — | — | Comparative Example | 5 | 1 | 1 | 1 |
| 1-3P | 2-14 | 9 | — | — | Invention | 5 | 4 | 3 | 4 |
| 1-4P | 2-26 | 9 | — | — | Invention | 5 | 4 | 3 | 4 |
| 1-5P | 3-1 | 9 | — | — | Invention | 5 | 4 | 3 | 4 |
| 1-6P | 3-19 | 9 | — | — | Invention | 5 | 4 | 4 | 4 |
| 1-7P | 4-1 | 9 | — | — | Invention | 5 | 3 | 3 | 3 |

TABLE 4-continued

| Conductive member | Compound of Formula (1) or Formula (2) Compound | Amount of addition (%) | Metal-adsorbable/ coordinatable compound Compound | Amount of addition (%) | Relationship with invention | Conductivity rating | Heat resistance rating | Moist-heat resistance rating | Ozone resistance rating |
|---|---|---|---|---|---|---|---|---|---|
| 1-8P | 4-18 | 9 | — | — | Invention | 5 | 3 | 3 | 3 |
| 1-9P | 5-7 | 9 | — | — | Invention | 5 | 4 | 3 | 4 |
| 1-10P | 5-13 | 9 | — | — | Invention | 5 | 3 | 3 | 3 |
| 1-11p | 6-2 | 9 | — | — | Invention | 5 | 4 | 3 | 4 |
| 1-12P | 6-18 | 9 | — | — | Invention | 5 | 3 | 3 | 3 |
| 1-13P | 7-21 | 9 | — | — | Invention | 5 | 4 | 4 | 4 |
| 1-14P | 7-22 | 9 | — | — | Invention | 5 | 4 | 4 | 5 |
| 1-15P | 7-23 | 9 | — | — | Invention | 5 | 4 | 4 | 4 |
| 1-16P | 8-12 | 9 | — | — | Invention | 5 | 4 | 4 | 4 |
| 1-17P | 8-16 | 9 | — | — | Invention | 5 | 3 | 3 | 3 |
| 1-18P | 9-17 | 9 | — | — | Invention | 5 | 3 | 3 | 3 |
| 1-19P | 9-18 | 9 | — | — | Invention | 5 | 4 | 3 | 3 |
| 1-20P | 10-4 | 9 | — | — | Invention | 5 | 4 | 3 | 3 |
| 1-21P | 10-8 | 9 | — | — | Invention | 5 | 3 | 4 | 4 |
| 1-22P | 11-4 | 0.07 | — | — | Comparative Example | 5 | 2 | 2 | 2 |
| 1-23P | 11-4 | 0.3 | — | — | Invention | 5 | 4 | 4 | 4 |
| 1-24P | 11-4 | 1 | — | — | Invention | 5 | 5 | 4 | 4 |
| 1-25P | 11-4 | 9 | — | — | Invention | 5 | 5 | 5 | 5 |
| 1-26P | 11-4 | 40 | — | — | Invention | 5 | 5 | 4 | 4 |
| 1-27P | 11-4 | 70 | — | — | Invention | 5 | 5 | 4 | 4 |
| 1-28P | 11-4 | 150 | — | — | Invention | 5 | 4 | 4 | 4 |
| 1-29P | 11-4 | 750 | — | — | Invention | 4 | 4 | 4 | 4 |
| 1-30P | 11-4 | 1200 | — | — | Comparative Example | 4 | 3 | 2 | 1 |
| 1-31P | 11-5 | 9 | — | — | Invention | 5 | 5 | 5 | 5 |
| 1-32P | 12-6 | 9 | — | — | Invention | 5 | 5 | 4 | 4 |
| 1-33P | 12-7 | 1 | — | — | Invention | 5 | 5 | 4 | 4 |
| 1-34P | 12-7 | 3 | — | — | Invention | 5 | 5 | 4 | 5 |
| 1-35P | 12-7 | 9 | — | — | Invention | 5 | 5 | 5 | 5 |
| 1-36P | 12-7 | 40 | — | — | Invention | 4 | 5 | 4 | 4 |
| 1-37P | 12-2 | 9 | — | — | Invention | 5 | 5 | 4 | 5 |

TABLE 5

| Conductive member | Compound of Formula (1) or Formula (2) Compound | Amount of addition (%) | Metal-adsorbable/ coordinatable compound Compound | Amount of addition (%) | Relationship with invention | Conductivity rating | Heat resistance rating | Moist-heat resistance rating | Ozone resistance rating |
|---|---|---|---|---|---|---|---|---|---|
| 1-38P | 12-8 | 9 | — | — | Invention | 5 | 5 | 4 | 4 |
| 1-39P | 13-1 | 3 | — | — | Invention | 5 | 5 | 4 | 4 |
| 1-40P | 13-1 | 9 | — | — | Invention | 5 | 5 | 5 | 5 |
| 1-41P | 13-1 | 20 | — | — | Invention | 5 | 5 | 5 | 5 |
| 1-42P | 13-4 | 9 | — | — | Invention | 5 | 5 | 4 | 4 |
| 1-43P | 13-7 | 9 | — | — | Invention | 5 | 5 | 4 | 4 |
| 1-44P | 14-1 | 9 | — | — | Invention | 5 | 5 | 4 | 4 |
| 1-45P | 14-2 | 9 | — | — | Invention | 5 | 5 | 4 | 4 |
| 1-46P | 14-3 | 9 | — | — | Invention | 5 | 5 | 4 | 4 |
| 1-47P | 15-1 | 9 | — | — | Invention | 5 | 3 | 3 | 3 |
| 1-48P | 15-2 | 9 | — | — | Invention | 5 | 3 | 4 | 4 |
| 1-49P | 16-1 | 9 | — | — | Invention | 5 | 4 | 3 | 3 |
| 1-50P | 16-2 | 9 | — | — | Invention | 5 | 3 | 3 | 3 |
| 1-51P | 17-10 | 9 | — | — | Invention | 5 | 3 | 4 | 4 |
| 1-52P | 17-11 | 9 | — | — | Invention | 5 | 3 | 4 | 4 |
| 1-53P | 2-10 | 9 | A-1 | 3 | Invention | 5 | 5 | 5 | 5 |
| 1-54P | 7-21 | 9 | A-1 | 3 | Invention | 5 | 5 | 5 | 5 |
| 1-55P | 12-7 | 9 | A-1 | 3 | Invention | 5 | 5 | 5 | 5 |
| 1-56P | 12-7 | 9 | A-1 | 40 | Invention | 4 | 5 | 4 | 4 |
| 1-57P | 12-7 | 9 | A-1 | 75 | Invention | 3 | 4 | 4 | 4 |
| 1-58P | 7-21 | 9 | A-2 | 3 | Invention | 5 | 5 | 5 | 5 |
| 1-59P | 7-23 | 9 | A-3 | 3 | Invention | 5 | 5 | 5 | 5 |
| 1-60P | 11-4 | 9 | A-4 | 3 | Invention | 5 | 5 | 5 | 5 |
| 1-61P | 12-7 | 9 | A-4 | 3 | Invention | 4 | 5 | 5 | 5 |
| 1-62P | 13-1 | 9 | A-4 | 3 | Invention | 5 | 5 | 5 | 5 |
| 1-63P | C-1 | 9 | — | — | Comparative Example | 5 | 1 | 1 | 1 |

TABLE 5-continued

| Conductive member | Compound of Formula (1) or Formula (2) Compound | Amount of addition (%) | Metal-adsorbable/ coordinatable compound Compound | Amount of addition (%) | Relationship with invention | Conductivity rating | Heat resistance rating | Moist-heat resistance rating | Ozone resistance rating |
|---|---|---|---|---|---|---|---|---|---|
| 1-64P | C-2 | 9 | — | — | Comparative Example | 5 | 2 | 1 | 1 |
| 1-65P | C-3 | 3 | — | — | Comparative Example | 5 | 2 | 1 | 1 |
| 1-66P | C-3 | 9 | — | — | Comparative Example | 4 | 2 | 1 | 1 |
| 1-67P | C-4 | 9 | — | — | Comparative Example | 3 | 1 | 1 | 1 |
| 1-68P | — | — | A-1 | 3 | Comparative Example | 5 | 3 | 3 | 3 |
| 1-69P | — | — | A-1 | 33 | Comparative Example | 3 | 2 | 3 | 3 |
| 1-70P | — | — | A-2 | 3 | Comparative Example | 5 | 3 | 2 | 2 |
| 1-71P | — | — | A-3 | 3 | Comparative Example | 5 | 4 | 2 | 2 |
| 1-72P | — | — | A-4 | 3 | Comparative Example | 4 | 3 | 2 | 1 |
| 1-73P | — | — | — | — | Comparative Example | 5 | 1 | 1 | 1 |

From the results of Table 4 and Table 5, it is clear that the effect of improving weather resistance (heat resistance, moist-heat resistance and ozone resistance) in the invention is also obtained in the patterned conductive members.

Example 4 and Comparative Example 4

Conductive members 4-1 to 4-62 were produced in the same manner as in production method for the conductive members 1-1 to 1-62 in Example 1, except that the PET substrate 101 was changed to the glass substrate produced in Preparation Example 2. These conductive members were subjected to the same evaluation as in Example 1, and as a result, the conductive members 4-1, 4-3 to 4-21, 4-23 to 4-29, and 4-31 to 4-62 according to the invention each of which contains the compound represented by Formula (1) or Formula (2) according to the invention all exhibited favorable weather resistance (heat resistance, moist-heat resistance, and ozone resistance), as compared with the conductive member 4-2 which does not contain a compound represented by Formula (1) or Formula (2).

Example 5 and Comparative Example 5

The conductive member 1-2 in Example 1 was immersed in an aqueous solution of compound 2-10 or compound 11-4 for 5 minutes, and then was washed with flowing water and dried by blowing air, whereby conductive member 5-1 and conductive member 5-2 in which a compound represented by Formula (1) or Formula (2) was incorporated in the conductive layer, were produced. Furthermore, conductive member 5-3 was produced by immersing the conductive member 1-2 in an ethanol solution of compound 12-7 for 5 minutes, subsequently washing with flowing water, and drying by blowing air. The content of the compound represented by Formula (1) or Formula (2) in the conductive layers of each of the conductive members 5-1 to 5-3 was measured by pulverizing each of the conductive members with a freezer mill, subsequently extracting with a solvent, and analyzing with high performance liquid chromatography. These conductive members were subjected to the same evaluation as in Example 1. The results are shown in Table 6.

In Table 6, the evaluation results for the conductive materials 1-1, 1-25 and 1-35 obtained by adding the compound 2-10, 11-4 or 12-7 in advance into the conductive composition-coating liquid and then applying the coating liquid thereon, are also shown together.

From Table 6, it is understood that the effect of the invention is exhibited even in conductive members obtained by adding the compound represented by Formula (1) or Formula (2) according to the invention to the conductive layer by immersion, and that the effect is more preferably obtained when the compound is added in advance to the conductive layer-coating liquid, and then the coating liquid is applied.

TABLE 6

| Conductive member | Compound of Formula (1) or Formula (2) Compound | Amount of addition (%) Addition method | Relationship with invention | Conductivity rating | Optical characteristics Total light transmittance grade | Haze value (%) | Heat resistance rating | Moist-heat resistance rating | Ozone resistance rating |
|---|---|---|---|---|---|---|---|---|---|
| 1-2 | — | — | Comparative Example | 5 | A | 1.05 | 1 | 1 | 1 |
| 5-1 | 2-10 | 8 Immersion | Invention | 5 | A | 1.06 | 3 | 3 | 4 |
| 5-2 | 11-4 | 10 Immersion | Invention | 5 | A | 1.07 | 4 | 4 | 4 |

TABLE 6-continued

| Conductive member | Compound of Formula (1) or Formula (2) | | Relationship with invention | Optical characteristics | | | | | |
|---|---|---|---|---|---|---|---|---|---|
| | Compound | Amount of addition (%) Addition method | | Conductivity rating | Total light transmittance grade | Haze value (%) | Heat resistance rating | Moist-heat resistance rating | Ozone resistance rating |
| 5-3 | 12-7' | 9 Immersion | Invention | 5 | A | 1.08 | 4 | 4 | 4 |
| 1-1 | 2-10 | 9 Addition to coating liquid | Invention | 5 | A | 1.06 | 4 | 3 | 4 |
| 1-25 | 11-4 | 9 Addition to coating liquid | Invention | 5 | A | 1.05 | 5 | 5 | 5 |
| 1-35 | 12-7 | 9 Addition to coating liquid | Invention | 4 | A | 1.05 | 5 | 5 | 5 |

Example 6

Production of Touch Panel

A touch panel was produced using the conductive member 1-53 in Example 1, by the method described in "*Saishin Tacchi Paneru Gijutsu* (Latest Touch Panel Technology)" (published Jul. 6, 2009, Techno Times Corp.); reviewed by Yuji MITANI, "*Tacchi Paneru no Gijutsu to Kaihatsu* (Technology and Development of Touch Panel)", CMC Publishing, Inc. (published December 2004); "FPD International 2009 Forum T-11 Lecture Textbook"; "Cypress Semiconductor Corporation; Application Note AN2292", and the like.

It was found that when the touch panel thus produced was used, a touch panel having excellent visibility due to an increase in light transmittance, and having excellent responsiveness to the input of characters or the like, or to screen operation, using at least one of a bare hand, a gloved hand or a pointing tool, due to an increase in conductivity, can be produced.

Example 7

Production of Transfer Type Conductive Member

<Production of Base Material A Having Transferability>

Onto a polyethylene terephthalate film provisional support (PET provisional support) having a thickness of 75 μm, a coating liquid for thermoplastic resin layer of Formulation A1 described below was applied, and drying was performed for 2 minutes at 100° C. and then further drying was performed for one minute at 120° C., whereby a cushion layer formed from a thermoplastic resin layer having a dried layer thickness of 16.5 μm was formed. The temperature in the drying condition in each of the present examples was the temperature of the substrate surface.

<Formulation A1 of Coating Liquid for Thermoplastic Resin Layer>

| | |
|---|---|
| Methyl methacrylate/2-ethylhexyl acrylate/benzyl methacrylate/methacrylic acid copolymer (= 55/11.7/4.5/28.8 [molar ratio], weight average molecular weight 90,000) | 58.4 parts |
| Styrene/acrylic acid copolymer (= 63/37 [molar ratio], weight average molecular weight 8,000) | 136 parts |
| 2,2-Bis[4-(methacryloxypolyethoxy)phenyl]propane | 90.7 parts |
| Surfactant, MEGAFACE F-780-F (manufactured by DIC Corp.) | 5.4 parts |
| Methanol | 111 parts |
| 1-Methoxy-2-propanol | 63.4 parts |
| Methyl ethyl ketone | 534 parts |

Next, a coating liquid for intermediate layer of Formulation B described below was applied onto the cushion layer thus formed, and drying was performed for one minute at 80° C. and then further drying was performed for one minute at 120° C., whereby an intermediate layer having a dried layer thickness of 1.6 μm was superposed.

<Formulation B of Coating Liquid for Intermediate Layer>

| | |
|---|---|
| Polyvinyl alcohol (PVA-205, degree of saponification: 88%, manufactured by Kuraray Co., Ltd.) | 3.22 parts |
| Polyvinylpyrrolidone (PVP K-30, manufactured by ISP Japan, Ltd.) | 1.49 parts |
| Methanol | 42.9 parts |
| Distilled water | 52.4 parts |

<<Production of Conductive Layer>>

(Preparation of PGMEA dispersion liquid of silver nanowire (Ag-4))

To 100 parts of the (a) silver nanowire-aqueous dispersion liquid (Ag-1) prepared in Preparation Example 1, 1 part of polyvinylpyrrolidone (K-30, manufactured by Tokyo Chemical Industry Co., Ltd.) and 100 parts of 1-propanol were added, and the mixture was concentrated in a cross flow filtering machine (manufactured by NGK Insulators, Ltd.) using a ceramic filter until the mass became 10 parts. Subsequently, an operation of adding 100 parts of 1-propanol and 100 parts of ion-exchanged water thereto and concentrating the mixture in a cross flow filtering machine again until the mass became 10 parts was repeated three times. Furthermore, 1 part of the binder (A-1) and 10 parts of 1-propanol were added thereto, and the mixture was centrifuged. Subsequently, the solvent of the supernatant was removed by decantation, PGMEA was added to the residue, and the residue was redispersed. The operations from centrifugation to redispersion were repeated three times, and PGMEA was added at last, whereby a PGMEA dispersion liquid of silver nanowire (Ag-4) was obtained. The amount of last addition of PGMEA was adjusted such that the content of silver was 2%. The content of the binder (A-1) used as a dispersant was 0.05%.

<Preparation of Composition for Photosensitive Layer Formation>

A photocurable composition having the following composition was prepared, and the composition thus obtained was designated as photocurable composition A.

[Photocurable Composition A]

| | |
|---|---|
| (b) Polymer: (binder (A-1) obtained in the Synthesis Example described above, 45% PGMEA solution) | 37.55 parts |
| (c) Polymerizable compound: Dipentaerythritol hexaacrylate | 15.02 parts |
| (d) Photopolymerization initiator: 2,4-Bis(trichloromethyl)-6[4-(N,N-diethoxycarbonylmethylamino)-3-bromophenyl]-s-triazine | 1.481 parts |
| (e) Polymerization inhibitor: Phenothiazine | 0.116 parts |
| (f) Surfactant: MEGAFACE F784F (manufactured by DIC Corp.) | 0.152 parts |
| (g) Surfactant: SOLSPERSE 20000 (manufactured by Lubrizol Japan, Inc.) | 1.88 parts |
| (h) Solvent (PGMEA) | 283.2 parts |

In the photocurable composition A, the value of ratio M/P of the mass M of the (c) photopolymerizable compound to the mass P of the (b) binder was 0.2. The proportion by mass of the components excluding the solvent PGMEA with respect to the total mass was 20%.

By mixing the photocurable composition A, the silver nanowire-dispersion liquid (Ag-4), solvent PGMEA, and solvent MEK, a composition for photosensitive layer formation (1) was obtained.

Here, mixing of each of the components was carried out such that the value of the ratio B/C of the mass B of the dispersing medium which was a component other than silver, to the mass C of silver as conductive fibers was 5.0, and the silver concentration in the composition for photosensitive layer formation was 0.635%. Furthermore, the solvents were added such that the ratio of the sum of the masses of PGMEA and MFG to the mass of MEK was 1:1.

The composition for photosensitive layer formation (1) described above was applied onto the base material A having transferability and then dried, whereby a laminate body for conductive film formation (1) (photosensitive transfer material) was produced. Here, the average amount of applied silver was 0.015 g/m$^2$, and the average film thickness was 0.05 μm. The laminate body for conductive film formation (photosensitive transfer material) thus obtained was designated as laminate body (1-A).

<Production of Sample for Evaluation>

A conductive material having a conductive film on a glass base material was produced using the laminate body (1-A) by carrying out the transfer process, exposure process, developing process, and post-baking process described below. The conductive member thus obtained was designated as conductive member 6-1.

(Transfer Process)

The glass substrate produced in Preparation Example 2 described above and the laminate body (1-A) were superposed and layered such that the surface of the glass substrate contacted the surface of the photosensitive layer of the laminate body (1-A), whereby a laminate body having a layered structure of PET provisional support/cushion layer/intermediate layer/photosensitive layer/glass substrate was formed.

Next, the provisional support was detached from the laminate body.

(Exposure Process)

The sample after detachment of the provisional support was exposed with i-line (365 nm) of an ultrahigh pressure mercury lamp at an amount of exposure of 40 mJ/cm$^2$. Here, the exposure of the photosensitive layer was carried out from the cushion layer side through a mask. The mask had a uniform exposure section for the evaluation of conductivity and optical characteristics, and a stripe pattern (line/space=50 μm/50 μm) for the evaluation of heat resistance and moist-heat resistance.

(Developing Process)

A 1% aqueous solution of triethanolamine was applied to the sample after exposure, whereby the thermoplastic resin layer (cushion layer) and the intermediate layer were dissolved and removed. The shortest removal time for completely removing these layers was 30 seconds.

Next, the photosensitive resin layer was developed by performing showering development using a sodium carbonate-based developer liquid (containing sodium hydrogen carbonate at a concentration of 0.06 mol/liter, sodium carbonate at the same concentration, 1% sodium dibutylnaphthalenesulfonate, an anionic surfactant, a defoamant, and a stabilizer, trade name: T-CD1, manufactured by Fujifilm Corp.) at a cone type nozzle pressure of 0.15 MPa at 20° C. for 30 seconds, and then dried at room temperature. Next, a heat treatment was carried out at 100° C. for 15 minutes. In this manner, conductive member 6-1P which was a conductive member was obtained.

Conductive members 6-2P to 6-10P were obtained by producing conductive members according to a method that was different from the production method for the conductive member 6-1P, only in that compound represented by Formula (1) or Formula (2) and the compound capable of adsorbing to a metal or compound capable of coordinating with a metal ion according to the invention were added as indicated in Table 7 to the composition for photosensitive layer formation (1). For each of the samples thus obtained, conductivity and optical characteristics were evaluated according to the same method as in Example 1, using the conductive layer of the uniform exposure section of each sample. Furthermore, weather resistance (heat resistance, moist-heat resistance, and ozone resistance) was evaluated according to the same method as in Example 3, using the stripe pattern exposure section of each sample. The results are shown in Table 7.

From Table 7, it is clearly understood that the invention is effective also for transfer type photosensitive conductive members.

TABLE 7

| Conductive member | Compound of Formula (1) or Formula (2) | | Metal-adsorbable/coordinatable compound | | Relationship with invention | Conductivity rating | Optical characteristics | | Heat resistance rating | Moist-heat resistance rating | Ozone resistance rating |
|---|---|---|---|---|---|---|---|---|---|---|---|
| | Compound | Amount of addition (%) | Compound | Amount of addition (%) | | | Total light transmittance grade | Haze value (%) | | | |
| 6-1P | — | — | — | — | Comparative Example | 5 | A | 0.46 | 1 | 1 | 1 |
| 6-2P | 2-10 | 9 | — | — | Invention | 5 | A | 0.46 | 4 | 3 | 5 |
| 6-3P | 7-21 | 9 | — | — | Invention | 5 | A | 0.45 | 3 | 4 | 4 |
| 6-4P | 11-4 | 9 | — | — | Invention | 5 | A | 0.45 | 4 | 4 | 4 |

TABLE 7-continued

| Conductive member | Compound of Formula (1) or Formula (2) Compound | Compound of Formula (1) or Formula (2) Amount of addition (%) | Metal-adsorbable/ coordinatable compound Compound | Metal-adsorbable/ coordinatable compound Amount of addition (%) | Relationship with invention | Conductivity rating | Optical characteristics Total light transmittance grade | Optical characteristics Haze value (%) | Heat resistance rating | Moist-heat resistance rating | Ozone resistance rating |
|---|---|---|---|---|---|---|---|---|---|---|---|
| 6-5P | 11-5 | 9 | — | — | Invention | 5 | A | 0.45 | 4 | 4 | 5 |
| 6-6P | 12-7 | 9 | — | — | Invention | 5 | A | 0.45 | 4 | 5 | 4 |
| 6-7P | — | — | A-1 | 3 | Comparative Example | 4 | A | 0.46 | 3 | 2 | 3 |
| 6-8P | 2-10 | 9 | A-1 | 3 | Invention | 5 | A | 0.45 | 5 | 4 | 5 |
| 6-9P | 7-21 | 9 | A-1 | 3 | Invention | 5 | A | 0.43 | 5 | 5 | 5 |
| 6-10P | 12-7 | 9 | A-1 | 3 | Invention | 5 | A | 0.43 | 5 | 5 | 5 |

INDUSTRIAL APPLICABILITY

The conductive material and the composition for conductive layer according to the invention can be widely used in, for example, touch panels, electrodes for displays, electromagnetic wave shields, electrodes for organic EL displays, electrodes for inorganic EL displays, electronic papers, electrodes for flexible displays, integrated type solar cells, liquid crystal display devices, display devices with touch panel functions, and other various devices.

The entire disclosures of Japanese Patent Application No. 2011-212874 and Japanese Patent Application No. 2011-289796 were incorporated herein by reference.

All publications, patent applications, and technical standards mentioned in this specification are herein incorporated by reference to the same extent as if each individual publication, patent application, or technical standard was specifically and individually indicated to be incorporated by reference.

The invention claimed is:

1. A conductive composition comprising at least: a) metal conductive fibers having an average minor axis length of from 1 nm to 150 nm; and b) a compound represented by the following Formula (1) in an amount of from 0.1% by mass to 1000% by mass with respect to the metal conductive fibers:

P—(CR$_1$=Y)$_n$-Q     Formula (1)

wherein, in Formula (1), P and Q each independently represent a group represented by OH, NR$_2$R$_3$ or CHR$_4$R$_5$, in which R$_2$ and R$_3$ each independently represent a hydrogen atom or a group that can be substituted on a nitrogen atom, and R$_4$ and R$_5$ each independently represent a hydrogen atom or a substituent; Y represents CR$_6$ or a nitrogen atom; R$_1$ and R$_6$ each independently represent a hydrogen atom or a substituent; at least two of the groups represented by R$_1$, R$_2$, R$_3$, R$_4$, R$_5$ or R$_6$ may be bonded to each other to form a ring; n represents an integer from 0 to 5; when n is 0, neither P nor Q is a group represented by OH or CHR$_4$R$_5$; and when n represents a number of 2 or greater, the plurality of atomic groups each represented by (CR$_1$=Y) may be the same as or different from each other;

wherein the compound represented by Formula (1) is a compound represented by a formula selected from the group consisting of the following Formula (3) to Formula (6) and Formula (8) to Formula (17):

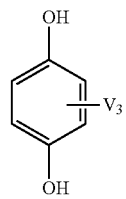

Formula (3)

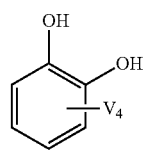

Formula (4)

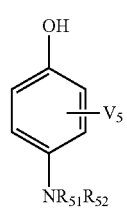

Formula (5)

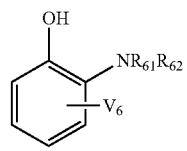

Formula (6)

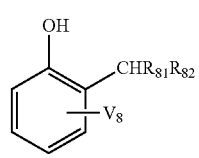

Formula (8)

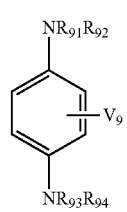

Formula (9)

-continued

Formula (10)

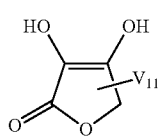

Formula (11)

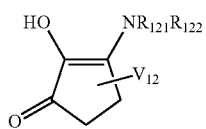

Formula (12)

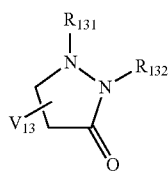

Formula (13)

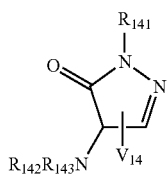

Formula (14)

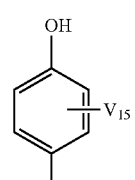

Formula (15)

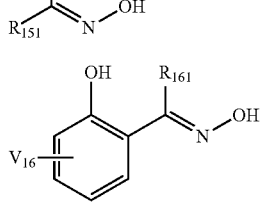

Formula (16)

$R_{171}R_{172}N—NR_{173}R_{174}$    Formula (17)

wherein, in Formula (3), $V_3$ represents a hydrogen atom or a substituent, and the hydrogen atom or the substituent represented by $V_3$ is bonded, in a number of one group or an arbitrary number of groups that can be substituted, at one or more arbitrary positions, where substitution is possible, of a cyclic structure contained in Formula (3);

in Formula (4), $V_4$ represents a hydrogen atom or a substituent, and the hydrogen atom or the substituent represented by $V_4$ is bonded, in a number of one group or an arbitrary number of groups that can be substituted, at one or more arbitrary positions, where substitution is possible, of a cyclic structure contained in Formula (4);

in Formula (5), $V_5$ represents a hydrogen atom or a substituent, $R_{51}$ and $R_{52}$ each independently represent a hydrogen atom or a group that can be substituted on a nitrogen atom, and the hydrogen atom or the substituent represented by $V_5$ is bonded, in a number of one group or an arbitrary number of groups that can be substituted, at one or more arbitrary positions, where substitution is possible, of a cyclic structure contained in Formula (5);

in Formula (6), $V_6$ represents a hydrogen atom or a substituent, $R_{61}$ and $R_{62}$ each independently represent a hydrogen atom or a group that can be substituted on a nitrogen atom, and the hydrogen atom or the substituent represented by $V_6$ is bonded, in a number of one group or an arbitrary number of groups that can be substituted, at one or more arbitrary positions, where substitution is possible, of a cyclic structure contained in Formula (6);

in Formula (8), $V_8$ represents a hydrogen atom or a substituent, $R_{81}$ and $R_{82}$ each independently represent a hydrogen atom or a substituent, and the hydrogen atom or the substituent represented by $V_8$ is bonded, in a number of one group or an arbitrary number of groups that can be substituted, at one or more arbitrary positions, where substitution is possible, of a cyclic structure contained in Formula (8);

in Formula (9), $V_9$ represents a hydrogen atom or a substituent, $R_{91}$, $R_{92}$, $R_{93}$ and $R_{94}$ each independently represent a hydrogen atom or a group that can be substituted on a nitrogen atom, and the hydrogen atom or the substituent represented by $V_9$ is bonded, in a number of one group or an arbitrary number of groups that can be substituted, at one or more arbitrary positions, where substitution is possible, of a cyclic structure contained in Formula (9);

in Formula (10), $V_{10}$ represents a hydrogen atom or a substituent, $R_{101}$, $R_{102}$, $R_{103}$ and $R_{104}$ each independently represent a hydrogen atom or a group that can be substituted on a nitrogen atom, and the hydrogen atom or the substituent represented by $V_{10}$ is bonded, in a number of one group or an arbitrary number of groups that can be substituted, at one or more arbitrary positions, where substitution is possible, of a cyclic structure contained in Formula (10);

in Formula (11), $V_{11}$ represents a hydrogen atom or a substituent, and the hydrogen atom or the substituent represented by $V_{11}$ is bonded, in a number of one group or an arbitrary number of groups that can be substituted, at one or more arbitrary positions, where substitution is possible, of a cyclic structure contained in Formula (11);

in Formula (12), $V_{12}$ represents a hydrogen atom or a substituent, $R_{121}$ and $R_{122}$ each independently represent a hydrogen atom or a group that can be substituted on a nitrogen atom, and the hydrogen atom or the substituent represented by $V_{12}$ is bonded, in a number of one group or an arbitrary number of groups that can be substituted, at one or more arbitrary positions, where substitution is possible, of a cyclic structure contained in Formula (12);

in Formula (13), $V_{13}$ represents a hydrogen atom or a substituent, $R_{131}$ and $R_{132}$ each independently represent a hydrogen atom or a group that can be substituted on a nitrogen atom, and the hydrogen atom or the substituent represented by $V_{13}$ is bonded, in a number of one group or an arbitrary number of groups that can be substituted, at one or more arbitrary positions, where substitution is possible, of a cyclic structure contained in Formula (13);

in Formula (14), $V_{14}$ represents a hydrogen atom or a substituent, $R_{141}$, $R_{142}$ and $R_{143}$ each independently represent a hydrogen atom or a group that can be substituted on a nitrogen atom, and the hydrogen atom or the substituent represented by $V_{14}$ is bonded, in a number of one group or an arbitrary number of groups that can be substituted, at one or more arbitrary positions, where substitution is possible, of a cyclic structure contained in Formula (14);

in Formula (15), $V_{15}$ represents a hydrogen atom or a substituent, $R_{151}$ represents a hydrogen atom or a substituent, and the hydrogen atom or the substituent represented by $V_{15}$ is bonded, in a number of one group or an arbitrary number of groups that can be substituted, at one or more arbitrary positions, where substitution is possible, of a cyclic structure contained in Formula (15);

in Formula (16), $V_{16}$ represents a hydrogen atom or a substituent, $R_{161}$ represents a hydrogen atom or a substituent, and the hydrogen atom or the substituent represented by $V_{16}$ is bonded, in a number of one group or an arbitrary number of groups that can be substituted, at one or more arbitrary positions, where substitution is possible, of a cyclic structure contained in Formula (16); and in Formula (17), $R_{171}$, $R_{172}$, $R_{173}$ and $R_{174}$ each independently represent a hydrogen atom or a group that can be substituted on a nitrogen atom.

2. The conductive composition according to claim 1, wherein the compound represented by Formula (1) is a compound represented by a formula selected from the group consisting of Formula (3), Formula (4), Formula (8), Formula (11), Formula (12), Formula (13) and Formula (14).

3. The conductive composition according to claim 1, wherein the compound represented by Formula (1) is contained in an amount of from 0.1% by mass to 100% by mass with respect to the metal conductive fibers.

4. The conductive composition according to claim 1, wherein the metal conductive fibers comprise silver in an amount of from 50 mol % to 100 mol %.

5. The conductive composition according to claim 1, wherein the average minor axis length of the metal conductive fibers is from 1 nm to 30 nm.

6. The conductive composition according to claim 1, further comprising c) at least one compound selected from the group consisting of a compound capable of adsorbing to a metal and a compound capable of coordinating with a metal ion.

7. The conductive composition according to claim 1, further comprising an aqueous solvent.

8. A conductive member comprising, on a base material, a conductive layer containing the conductive composition according to claim 1.

9. The conductive member according to claim 8, wherein a surface resistance of the conductive layer is from 1 Ω/Square to 1000 Ω/Square.

10. The conductive member according to claim 8, wherein the conductive layer comprises a conductive region and a non-conductive region.

11. The conductive member according to claim 8, further comprising at least one intermediate layer between the base material and the conductive layer.

12. A method for producing a conductive member, the method comprising a process of applying, onto a base material, a conductive composition-coating liquid containing the conductive composition according to claim 1 and a solvent.

13. A touch panel comprising the conductive member according to claim 8.

14. A solar cell comprising the conductive member according to claim 8.

* * * * *